(12) United States Patent
Lee et al.

(10) Patent No.: US 11,569,273 B2
(45) Date of Patent: Jan. 31, 2023

(54) PIXEL, DISPLAY DEVICE INCLUDING PIXEL, AND METHOD OF MANUFACTURING DISPLAY DEVICE

(71) Applicant: Samsung Display Co., Ltd., Yongin-si (KR)

(72) Inventors: Hyun Wook Lee, Yongin-si (KR); Tae Hee Lee, Yongin-si (KR); Kwang Taek Hong, Yongin-si (KR); Jung Eun Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/447,491

(22) Filed: Sep. 13, 2021

(65) Prior Publication Data
US 2022/0085077 A1 Mar. 17, 2022

(30) Foreign Application Priority Data
Sep. 15, 2020 (KR) .......................... 10-2020-0118660

(51) Int. Cl.
*H01L 27/12* (2006.01)
*H01L 25/16* (2006.01)

(52) U.S. Cl.
CPC ........ *H01L 27/1248* (2013.01); *H01L 25/167* (2013.01); *H01L 27/1244* (2013.01); *H01L 27/1259* (2013.01)

(58) Field of Classification Search
None
See application file for complete search history.

(56) References Cited

U.S. PATENT DOCUMENTS 9,287,242 B2 3/2016 Shibata et al.
10,672,946 B2 6/2020 Cho et al.
(Continued)

FOREIGN PATENT DOCUMENTS

JP 2011-205060 A 10/2011
KR 10-2018-0007376 A 1/2018
(Continued)

OTHER PUBLICATIONS

International Search Report dated Dec. 16, 2021 for corresponding Korean Application No. PCT/KR2021/012151 (3 pages).

*Primary Examiner* — Bo B Jang
(74) *Attorney, Agent, or Firm* — Lewis Roca Rothgerber Christie LLP

(57) ABSTRACT

A pixel according to an embodiment of the present disclosure includes a circuit element on a base layer, a protective layer on the circuit element, a first electrode and a second electrode opposite each other on the protective layer, a first insulating layer on the first electrode and the second electrode, a light-emitting element on the first insulating layer at an area between the first electrode and the second electrode, a first contact electrode on a first end of the light-emitting element to connect the first end of the light-emitting element to the first electrode, a second contact electrode on a second end of the light-emitting element to connect the second end of the light-emitting element to the second electrode, and a cavity in the protective layer and the first insulating layer below the light-emitting element corresponding to the area between the first electrode and the second electrode.

20 Claims, 31 Drawing Sheets

(56) References Cited

U.S. PATENT DOCUMENTS

| | | | |
|---|---|---|---|
| 10,943,947 B2 | 3/2021 | Im et al. | |
| 2017/0358563 A1* | 12/2017 | Cho | H01L 33/20 |
| 2021/0111323 A1* | 4/2021 | Kim | H01L 25/167 |
| 2021/0134768 A1* | 5/2021 | Lee | H01L 33/38 |
| 2021/0242381 A1 | 8/2021 | Lee et al. | |
| 2021/0376210 A1 | 12/2021 | Lee et al. | |

FOREIGN PATENT DOCUMENTS

| | | |
|---|---|---|
| KR | 10-2019-0121894 A | 10/2019 |
| KR | 10-2020-0070493 A | 6/2020 |
| KR | 10-2020-0088954 A | 7/2020 |
| KR | 10-2021-0098313 A | 8/2021 |
| KR | 10-2021-0149292 A | 12/2021 |

* cited by examiner

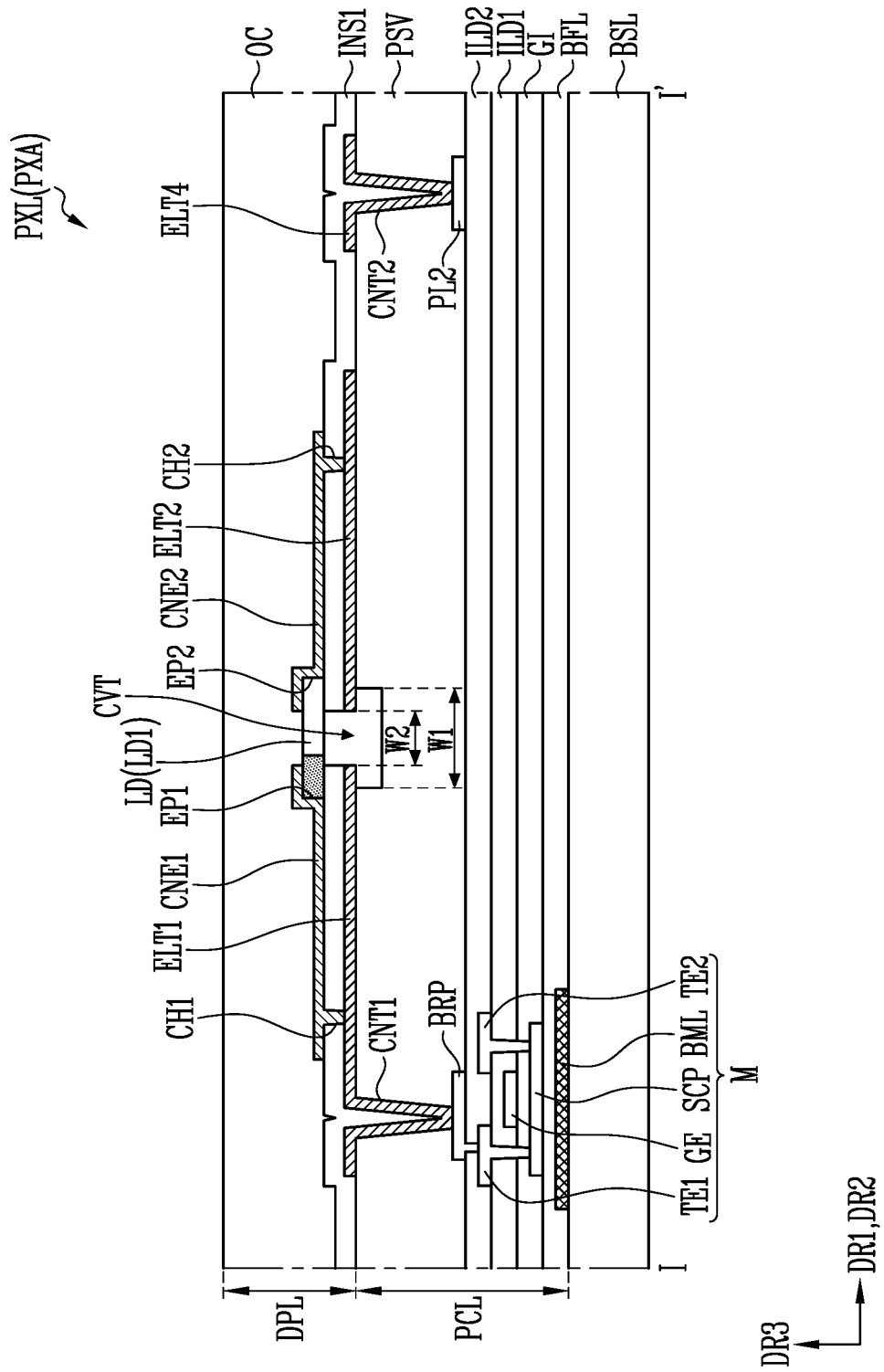

PIXEL, DISPLAY DEVICE INCLUDING PIXEL, AND METHOD OF MANUFACTURING DISPLAY DEVICE

CROSS-REFERENCE TO RELATED APPLICATION

This application claims priority to and the benefit of Korean Patent Application No. 10-2020-0118660 filed in the Korean Intellectual Property Office on Sep. 15, 2020, the entire content of which is incorporated herein by reference.

BACKGROUND

1. Field

Embodiments of the present disclosure relate to a pixel, a display device including the pixel, and a method of manufacturing the display device.

2. Description of the Related Art

Recently, interest in information displays is increasing. Accordingly, research and development for display devices are continuously being conducted.

SUMMARY

An embodiment of the present disclosure provides a pixel including a light-emitting element, a display device including the pixel, and a method of manufacturing the display device.

According to an embodiment of the present disclosure, a pixel includes a circuit element on a base layer, a protective layer on the circuit element, a first electrode and a second electrode opposite each other on the protective layer, a first insulating layer on the first electrode and the second electrode, a light-emitting element on the first insulating layer at an area between the first electrode and the second electrode, a first contact electrode on a first end of the light-emitting element to connect the first end of the light-emitting element to the first electrode, a second contact electrode on a second end of the light-emitting element to connect the second end of the light-emitting element to the second electrode, and a cavity in the protective layer and the first insulating layer below the light-emitting element corresponding to the area between the first electrode and the second electrode.

In an embodiment, the cavity may have a first width in a lower area thereof corresponding to the protective layer and a second width less than the first width in an upper area thereof corresponding to the first insulating layer.

In an embodiment, the second width may be less than a length of the light-emitting element.

In an embodiment, the first contact electrode and the second contact electrode may be spaced from each other by the second width.

In an embodiment, the first contact electrode and the second contact electrode may be at a same layer and may be separated to be spaced from each other by the cavity.

In an embodiment, the first contact electrode may be electrically connected to the first electrode through a first contact hole passing through the first insulating layer, and the second contact electrode may be electrically connected to the second electrode through a second contact hole passing through the first insulating layer.

In an embodiment, the pixel may further include conductive films remaining on sidewalls of the cavity below the first electrode and the second electrode. The conductive film may include a same material as the first contact electrode and the second contact electrode.

In an embodiment, the conductive films located below the first electrode and second electrode may be spaced from each other.

In an embodiment, the pixel may further include a first insulating pattern on the first contact electrode, and a second insulating pattern located on the second contact electrode and spaced from the first insulating pattern.

In an embodiment, the first insulating pattern and second insulating pattern may include a same photoresist material.

In an embodiment, the first contact electrode may be located below the first insulating pattern, and the second contact electrode may be located below the second insulating pattern.

In an embodiment, the protective layer may include at least one layer of an organic insulating film, and the first insulating layer may include at least one layer of an inorganic insulating film.

In an embodiment, the pixel may further include at least one of a first bank located below the first electrode and the second electrode and overlapping one area of the first electrode and one area of the second electrode; and a second bank located in a non-emission area surrounding an emission area including the first electrode, the second electrode, and the light-emitting element.

According to an embodiment of the present disclosure, a display device includes a base layer, and a pixel on the base layer, wherein the pixel includes a circuit element on the base layer, a protective layer on the circuit element, a first electrode and a second electrode opposite each other on the protective layer, a first insulating layer on the first electrode and the second electrode, a light-emitting element on the first insulating layer at an area between the first electrode and the second electrode, a first contact electrode on a first end of the light-emitting element to connect the first end of the light-emitting element to the first electrode, a second contact electrode on a second end of the light-emitting element to connect the second end of the light-emitting element to the second electrode, and a cavity in the protective layer and the first insulating layer below the light-emitting element corresponding to the area between the first electrode and the second electrode.

According to an embodiment of the present disclosure, a method of manufacturing a display device includes sequentially forming a circuit element and a protective layer on a base layer, forming a first electrode and a second electrode opposite each other on the protective layer, forming a first insulating layer to cover the first and second electrodes, forming a cavity in the first insulating layer and the protective layer below an area between the first electrode and the second electrode, supplying a light-emitting element on the first insulating layer and aligning the light-emitting element between the first electrode and the second electrode such that the light-emitting element is on the first insulating layer and overlaps the cavity, forming a conductive film on a pixel area including the light-emitting element, and etching the conductive film so as to be disconnected at an upper portion and a lower portion of an area of the cavity and forming a first contact electrode and a second contact electrode on a first end of the light-emitting element and a second end of the light-emitting element, respectively.

In an embodiment, the forming of the cavity may include forming a first photo mask on remaining areas excluding an upper portion of one area of the first insulating layer corresponding to an area between the first electrode and the second electrode, and etching the first insulating layer by a full thickness thereof in an area exposed by the first photo mask and forming a trench, which has a width greater than an etched width of the first insulating layer, in the protective layer.

In an embodiment, the forming of the first and second contact electrodes may include forming a second photo mask on one areas of the conductive film overlapping the first end of the light-emitting element and one area of the first electrode, and the second end of the light-emitting element and one area of the second electrode, and etching the conductive film using the second photo mask to concurrently form the first and second contact electrodes.

Other details of embodiments for solving the above problems are included in the detailed description and the drawings.

BRIEF DESCRIPTION OF THE DRAWINGS

FIGS. 9A-9C are cross-sectional views illustrating pixels according to an embodiment of the present disclosure.

DETAILED DESCRIPTION

Figure 1:
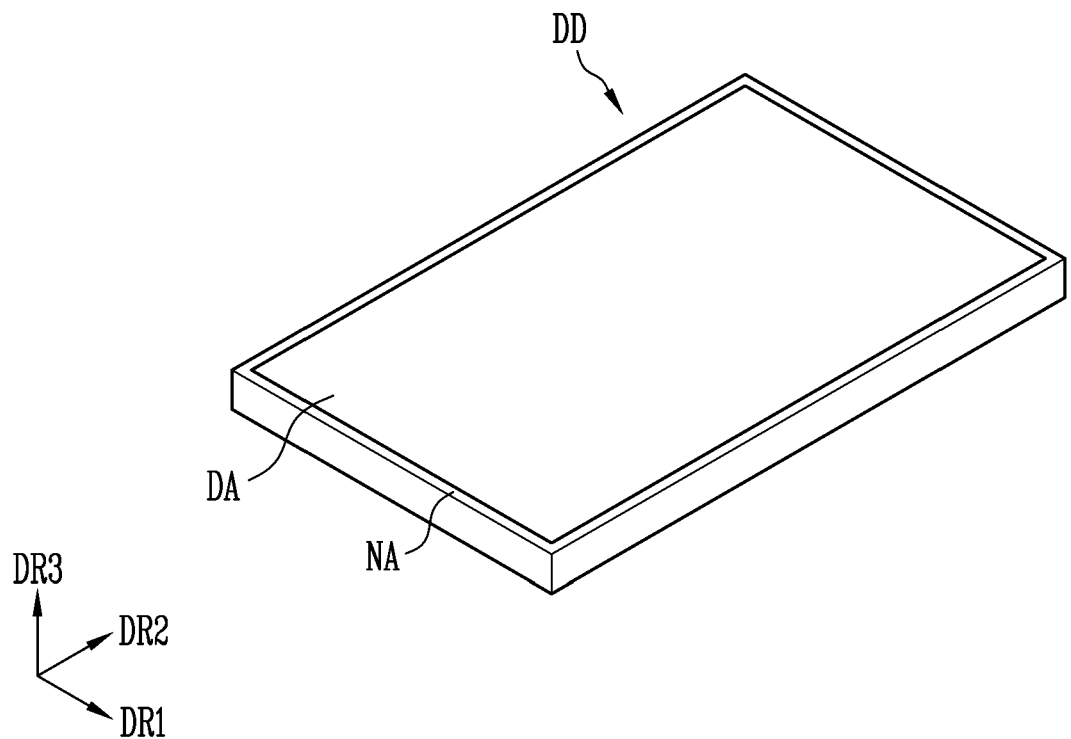
FIG. 1 is a perspective view illustrating a display device according to an embodiment of the present disclosure.

The present disclosure can be variously modified in various embodiments, and specific embodiments will be described and illustrated in the drawings. In the following description, the singular forms "a," "an," and "the" are intended to include the plural forms as well, unless the context clearly indicates otherwise.

On the other hand, the present disclosure is not limited to the following embodiments disclosed and may be modified and implemented in various forms. Further, each of the following embodiments may be implemented alone or may be implemented in combination with at least another embodiment.

In the drawings, some components that are not directly related to features of the present disclosure may be omitted in order to clearly illustrate embodiments of the present disclosure. Further, some components in the drawings may be illustrated in exaggerated sizes, ratios, and the like. In the drawings, the same or similar components are denoted by the same reference numerals and signs as possible although they are illustrated in different drawings, and redundant descriptions thereof will be omitted.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the scope of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Figure 2A:
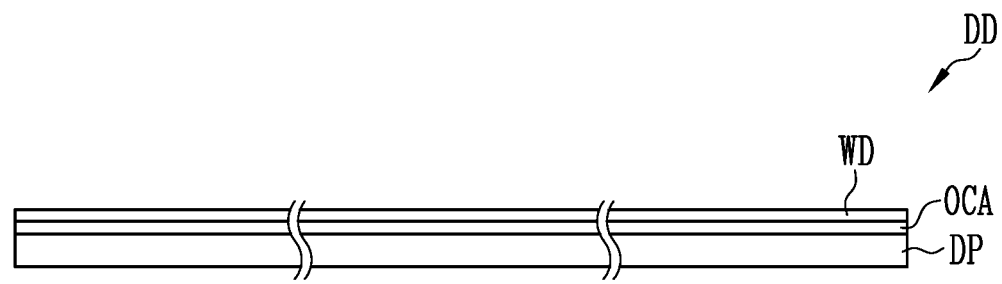
FIGS. 2A and 2B are cross-sectional views illustrating the display device according to an embodiment of the present disclosure.
Figure 2B:
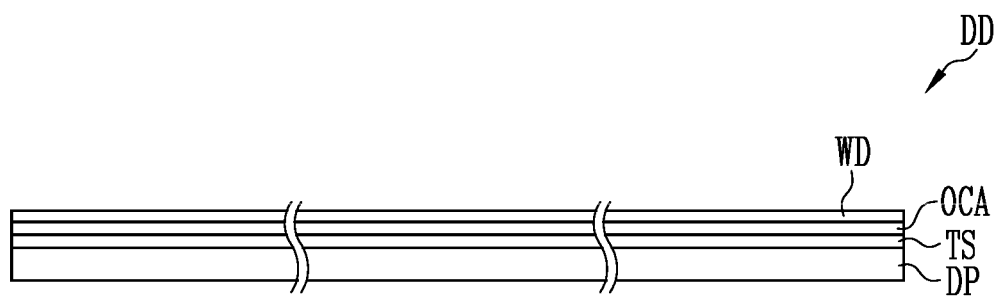
Figure 3A:
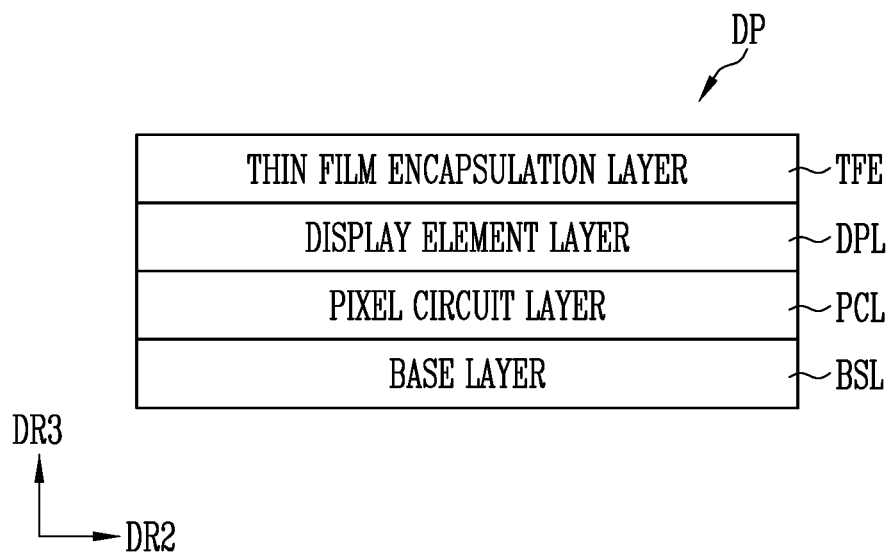
FIGS. 3A and 3B are schematic cross-sectional views illustrating configurations of a display panel DP according to an embodiment of the present disclosure.
Figure 3B:
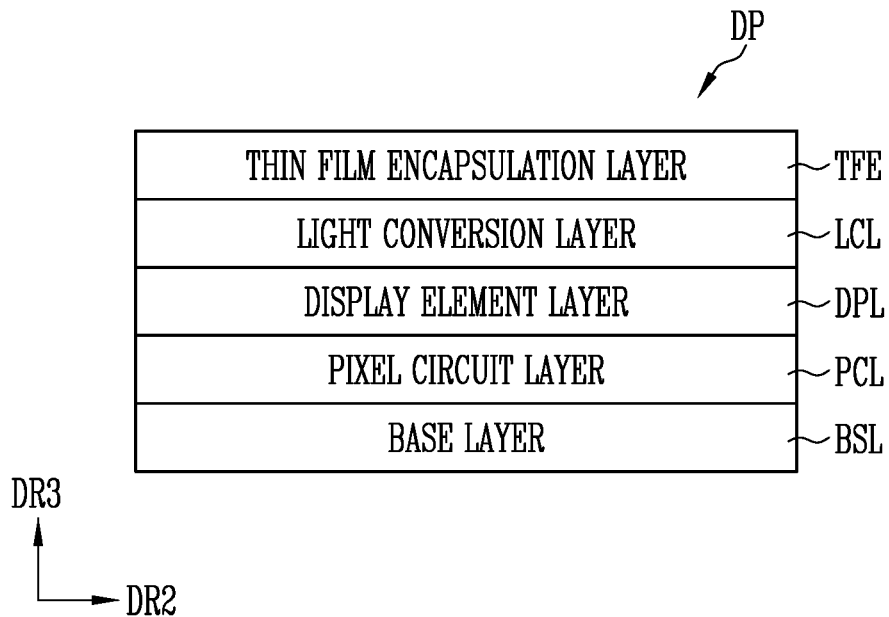

FIG. 1 is a perspective view illustrating a display device DD according to an embodiment of the present disclosure. FIGS. 2A and 2B are cross-sectional views illustrating the display device DD according to an embodiment of the present disclosure. FIGS. 3A and 3B are schematic cross-sectional views illustrating configurations of a display panel DP according to an embodiment of the present disclosure.

First, referring to FIG. 1, the display device DD may include a display area DA and a non-display area NA (also referred to as a "bezel area"). The display area DA may be an area that includes pixels to display an image. The non-display area NA may be an area excluding the display area DA, and an image may not be displayed in the non-display area NA. For example, the non-display area NA may surround the display area DA along the edge or periphery of the display area DA.

The display area DA may have various shapes and may include the pixels. For example, the display area DA may have various shapes such as a rectangular shape, a circular shape, and an oval shape, and the pixels may be arranged in the display area DA.

The display area DA may be formed on at least one surface of the display device DD. As an example, the display area DA may be formed on a front surface of the display device DD and may be additionally formed on a side surface and/or a rear surface of the display device DD.

The non-display area NA may be disposed around the display area DA to surround at least one area of the display area DA. The non-display area NA may include lines, pads, and/or a driving circuit which are connected to the pixels of the display area DA.

The display device DD may be provided in various shapes. As an example, the display device DD may be provided in a rectangular plate shape, but the present disclosure is not limited thereto. For example, the display device DD may have a shape such as a circular shape or an oval shape. In addition, in FIG. 1, the display device DD is illustrated as including an angled corner (for example, an angle between two sides of the display device DD at each corner of the display device DD is at 90° or approximately at 90°), but the present disclosure is not limited thereto. For example, the display device DD may include a curved corner.

For convenience, in FIG. 1, the display device DD is illustrated as having a rectangular plate shape which includes a pair of short sides and a pair of long sides. An extending direction of the short side is expressed as a first direction DR1, an extending direction of the long side is expressed as a second direction DR2, and a direction perpendicular to the extending directions of the long side and the short side (for example, a thickness or height direction of the display device DD) is expressed as a third direction DR3. However, the directions may be changed according to the shape of the display device DD.

The display device DD may have flexibility such that at least one area thereof is deformable or may not have flexibility such that an entire area thereof is not substantially deformable. That is, the display device DD may be a flexible display device or a rigid display device. When at least one area of the display device DD has flexibility, the display device DD may be deformed into a shape that is folded, bent, or rolled at a portion thereof having the flexibility.

Referring to FIG. 2A, the display device DD may include the display panel DP and a window WD disposed on the display panel DP. In an embodiment, the window WD may be integrally manufactured with the display panel DP. For example, the window WD may be formed directly on one surface of the display panel DP. In an embodiment, after the window WD is manufactured separately from the display panel DP, the window WD may be coupled to the display panel DP through an adhesive (e.g., an optically transparent adhesive) member OCA.

The display panel DP may include pixels for displaying an image and may be a display panel having various types and/or structures. As an example, the display panel DP may be a self-luminous display panel such as an organic light-emitting diode (OLED) display panel using an OLED as a light-emitting element, a nano/micro-scale light-emitting diode (LED) display panel using a nano/micro-LED, which has, but is not limited there to, a size of a nanoscale to a microscale, as a light-emitting element, a quantum dot (QD) OLED display panel using an OLED and QDs, or a QD nano/micro LED display panel using a nano/micro LED and QDs, but the present disclosure is not limited thereto.

The window WD for protecting an exposed surface of the display panel DP may be provided on the display panel DP. The window WD may protect the display panel DP from an external impact and may provide an input surface and/or a display surface to a user.

The window WD may be made of various materials such as glass and plastic and may be formed as a single-layer or a multi-layer. Also, the window WD may have flexibility in at least one area thereof or may not have the flexibility.

Referring to FIG. 2B, the display device DD may further include a touch sensor TS. In some embodiments, the display device DD may include other sensors (for example, a fingerprint sensor, a pressure sensor, and a temperature sensor) having various types and/or methods and/or an input sensing device.

The touch sensor TS may be disposed on at least one surface of the display panel DP to detect a touch input by a user. As an example, the touch sensor TS may be provided on a front surface of the display panel DP (upper surface on which an image is displayed) so as to be disposed between the display panel DP and the window WD, but the present disclosure is not limited thereto.

In an embodiment, the touch sensor TS may be integrally manufactured with the display panel DP. For example, sensor electrodes and/or sensor elements for constituting the touch sensor TS may be formed directly on at least one surface of the display panel DP.

In another embodiment, the touch sensor TS may be manufactured separately from the display panel DP and then provided around the display panel DP. As an example, the touch sensor TS may be disposed and/or attached onto at least one surface of the display panel DP.

Referring to FIG. 3A, the display panel DP may include a base layer BSL. The display panel DP may also include a pixel circuit layer PCL, a display element layer DPL, and a thin film encapsulation layer TFE sequentially disposed on one surface of the base layer BSL. However, the structure of the display panel DP is not limited thereto. For example, some components of the display panel DP may be omitted or replaced with other components. Further, some of the components may be combined together. In some embodiments, the display panel DP may further include additional components.

As an example, when the display panel DP is a display panel of a passive display device, the pixel circuit layer PCL may be omitted. In this case, only lines for driving the pixels may be disposed below the display element layer DPL, or the lines may be directly connected to and/or formed on the display element layer DPL.

In some embodiments, instead of forming the thin film encapsulation layer TFE, an upper substrate may be disposed on one surface of the base layer BSL. The upper substrate may be coupled to the base layer BSL using a sealing material.

The base layer BSL may be a rigid or flexible substrate (or film). In an embodiment, when the base layer BSL is the rigid substrate, the base layer BSL may be one of a glass substrate, a quartz substrate, a glass ceramic substrate, and a crystalline glass substrate. In another embodiment, when the base layer BSL is the flexible substrate, the base layer BSL may be one of a film substrate and a plastic substrate which include a polymer organic material. In some embodiments, the base layer BSL may include fiber glass reinforced plastic (FRP).

The pixel circuit layer PCL may be provided on one surface of the base layer BSL. The pixel circuit layer PCL may include circuit elements for constituting a pixel circuit of each pixel and various lines connected to the circuit elements. As an example, the pixel circuit layer PCL may include transistors and a storage capacitor which constitute the pixel circuit of each pixel, and gate lines, data lines, and power lines which are connected to the pixel circuit. According to some embodiments, the gate lines may include at least scan lines and may optionally further include other types of control lines. In some embodiments, the pixel circuit layer PCL may further include at least one insulating layer including a protective layer covering the circuit elements and/or lines.

The display element layer DPL may be disposed on the pixel circuit layer PCL. The display element layer DPL may include light-emitting elements constituting light sources of each pixel. In an embodiment, the light-emitting element may be an inorganic LED (for example, a nano/micro-scale inorganic LED having a size of a nanoscale or microscale) but is not limited thereto.

The thin film encapsulation layer TFE may be disposed on the display element layer DPL. The thin film encapsulation layer TFE may be an encapsulation substrate or a multi-layered encapsulation film. When the thin film encapsulation layer TFE is in the form of the encapsulation film, the thin film encapsulation layer TFE may include an inorganic film and/or an organic film. For example, the thin film encapsulation layer TFE may have a multi-layered structure in which an inorganic film, an organic film, and an inorganic film are sequentially stacked. The thin film encapsulation layer TFE may protect the pixels by preventing or substantially preventing external air and moisture from permeating into the display element layer DPL and the pixel circuit layer PCL.

Referring to FIG. 3B, the display panel DP may further include a light conversion layer LCL for converting light emitted from the display element layer DPL. For example, when it is considered that the display panel DP emits light in an upper direction of the display element layer DPL (for example, the third direction DR3) to display an image on the front surface of the display panel DP, the light conversion layer LCL may be disposed on the display device layer PL. As an example, the light conversion layer LCL may be provided between the display element layer DPL and the thin film encapsulation layer TFE.

The light conversion layer LCL may include a color filter including a color filter material with a color (e.g., a set or predetermined color) corresponding to a color of each pixel PXL and/or color conversion particles (for example, quantum dots) corresponding to a color (e.g., a set or predetermined color), thereby converting light generated in each pixel area of the display element layer DPL. For example, the light conversion layer LCL may optionally transmit light having a specific wavelength from among light generated by the display element layer DPL and/or may convert a wavelength of the light generated by the display element layer DPL.

In FIGS. 3A and 3B, an example configuration of the display panel DP has been described assuming that the display panel DP is a light-emitting display panel, but the present disclosure is not limited thereto. For example, the configuration of the display panel DP may be variously changed according to the type of the display device DD.

Figure 4A:
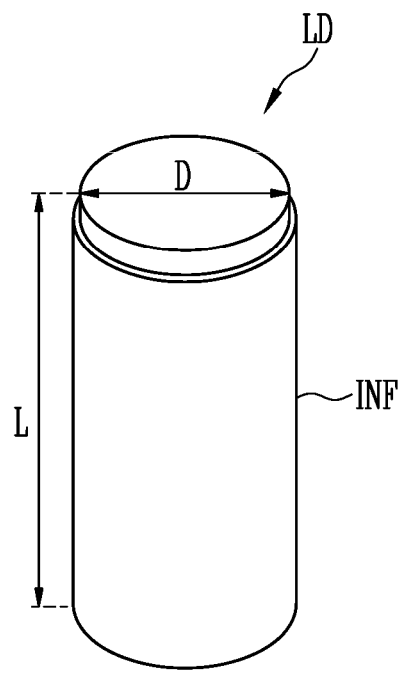
FIG. 4A is a perspective view illustrating a light-emitting element according to an embodiment of the present disclosure.
Figure 4B:
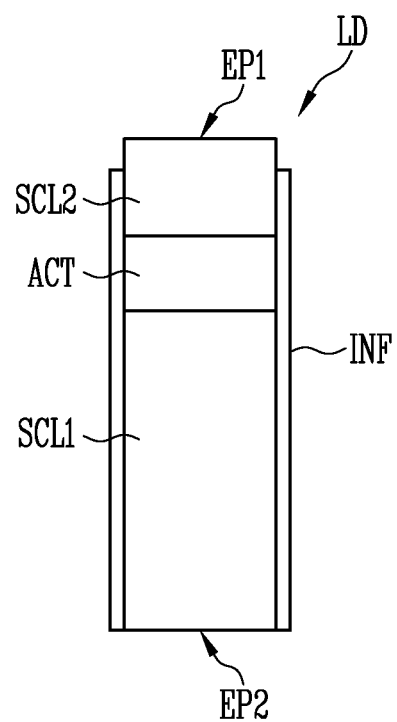
FIGS. 4B-4D are cross-sectional views illustrating light-emitting elements according to an embodiment of the present disclosure.
Figure 4C:
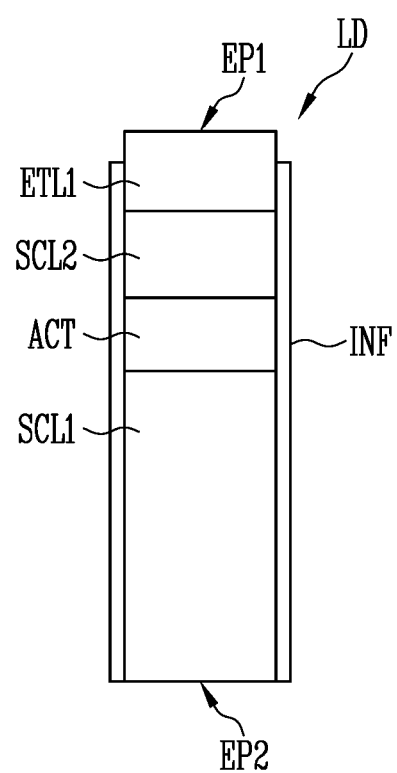
Figure 4D:
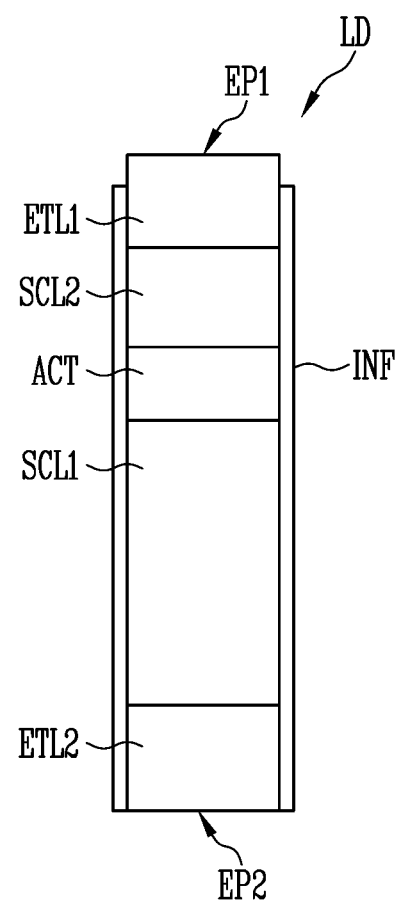

FIG. 4A is a perspective view illustrating a light-emitting element LD according to an embodiment of the present disclosure. FIGS. 4B-4D are cross-sectional views illustrating light-emitting elements LD according to an embodiment of the present disclosure. For example, FIGS. 4B-4D illustrate different embodiments of a configuration of the light-emitting element LD of FIG. 4A. Rod-shaped light-emitting elements LD having a circular columnar shape are illustrated in FIGS. 4A-4B, but the type and/or shape of the light-emitting elements LD according to the present disclosure are not limited thereto.

Referring to FIGS. 4A-4D, the light-emitting element LD includes a first semiconductor layer SCL1, a second semiconductor layer SCL2, and an active layer ACT interposed between the first semiconductor layer SCL1 and the second semiconductor layer SCL2. As an example, the light-emitting element LD may include the first semiconductor layer SCL1, the active layer ACT, and the second semiconductor layer SCL2 sequentially stacked in a direction of a length L thereof.

The light-emitting element LD may be provided in a rod-like shape extending in one direction. When it is assumed that an extending direction of the light-emitting element LD is the direction of the length L, the light-emitting element LD may include a first end EP1 and a second end EP2 in the extending direction.

One of the first and second semiconductor layers SCL1 and SCL2 may be disposed at the first end EP1 of the light-emitting element LD. The other one of the first and second semiconductor layers SCL1 and SCL2 may be disposed at the second end EP2 of the light-emitting element LD. As an example, the second semiconductor layer SCL2 and the first semiconductor layer SCL1 may be disposed at the first end EP1 and the second end EP2 of the light-emitting element LD, respectively.

According to some embodiments, the light-emitting element LD may be a rod-shaped light-emitting element (also referred to as a "rod-shaped light-emitting diode") manufactured in a rod-like shape through an etching method or the like. In the present disclosure, the term "rod-like shape" includes all of a rod-like shape and a bar-like shape, such as a circular column and a polygonal column, which are long in the direction of the length L (i.e., have an aspect ratio greater than one). A shape of a cross section of the rod-like shape is not particularly limited. For example, the length L1 of the light-emitting element LD may be greater than a diameter D (or width of a cross section) thereof.

The light-emitting element LD may have a small size ranging from a nanoscale to a microscale. As an example, the light-emitting element LD may have the diameter D (or width) and/or the length L which range from a nanoscale to a microscale. However, the size of the light-emitting element LD is not limited thereto. For example, the size of the light-emitting element LD may be changed according to design conditions of various devices, for example, a display device which uses a light-emitting device including the light-emitting element LD as a light source.

The first semiconductor layer SCL1 may be a first con-ductivity-type semiconductor layer. For example, the first semiconductor layer SCL1 may include an N-type semiconductor layer. As an example, the first semiconductor layer SCL1 may include an N-type semiconductor layer which includes any one semiconductor material selected from InAlGaN, GaN, AlGaN, InGaN, AlN, and InN and is doped with a first-conductivity type dopant such as silicon (Si), germanium (Ge), or tin (Sn). In some embodiments, the first semiconductor layer SCL1 may be made of various materials.

The active layer ACT may be disposed on the first semiconductor layer SCL1 and may be formed to have a single-quantum well or multi-quantum well structure. The position of the active layer ACT may be changed according to the type and/or structure of the light-emitting element LD. The active layer ACT may emit light having a wavelength of 400 nm to 900 nm and may have a double hetero structure. According to some embodiments, a material such as AlGaN or AlInGaN may be used to form the active layer ACT. In some embodiments, the active layer ACT may be made of various materials.

The second semiconductor layer SCL2 may be disposed on the active layer ACT and may include a semiconductor layer which is a different type from the first semiconductor layer SCL1. For example, the second semiconductor layer SCL2 may include a P-type semiconductor layer. As an example, the second semiconductor layer SCL2 may include a P-type semiconductor layer which includes any one semiconductor material selected from among InAlGaN, GaN, AlGaN, InGaN, AlN, and InN and is doped with a second-conductivity type dopant such as magnesium (Mg). In some embodiments, the second semiconductor layer SCL2 may be made of various materials.

In an embodiment, the first semiconductor layer SCL1 and the second semiconductor layer SCL2 may have different lengths (or thicknesses) in the direction of the length L of the light-emitting element LD. As an example, the first semiconductor layer SCL1 may have a length (or thickness) that is greater than that of the second semiconductor layer SCL2 in the direction of the length L of the light-emitting element LD. Accordingly, the active layer ACT of the light-emitting element LD may be positioned closer to the first end EP1 than the second end EP2.

When a voltage greater than or equal to a threshold voltage is applied between both ends (e.g., EP1 and EP2) of the light-emitting element LD, electrons and holes are combined with each other in the active layer ACT, and thus, the light-emitting elements LD emits light. By controlling light emission of the light-emitting element LD using such a principle, the light-emitting element LD may be used as a light source of various light-emitting devices including pixels of a display device.

In an embodiment, in addition to the first semiconductor layer SCL1, the active layer ACT, and the second semiconductor layer SCL2, the light-emitting element LD may further include an insulating film INF surrounding (e.g., surrounding outer peripheral surfaces of) the first semiconductor layer SCL1, the active layer ACT, and the second semiconductor layer SCL2. The light-emitting element LD may additionally include at least one fluorescent layer, active layer, semiconductor layer, and/or electrode layer disposed at one end sides of the first semiconductor layer SCL1, the active layer ACT, and/or the second semiconductor layer SCL2.

For example, as illustrated in FIG. 4C, the light-emitting element LD may further include an electrode layer ETL1 disposed at one end side (e.g., EP1) of the second semiconductor layer SCL2. In this case, the electrode layer ETL1 may be positioned at the first end EP1 of the light-emitting element LD.

In some embodiments, as illustrated in FIG. 4D, the light-emitting element LD may further include another electrode layer ETL2 disposed at one end side (e.g., EP2) of the first semiconductor layer SCL1. As an example, the electrode layers ETL1 and ETL2 may be disposed at the first end EP1 and the second end EP2 of the light-emitting element LD, respectively.

The electrode layers ETL1 and ETL2 may be ohmic contact electrodes but are not limited thereto. For example, the electrode layers ETL1 and ETL2 may be Schottky contact electrodes.

The electrode layers ETL1 and ETL2 may include a metal or conductive oxide. As an example, the electrode layers ETL1 and ETL2 may be made of one or a mixture of a metal of chromium (Cr), titanium (Ti), aluminum (Al), gold (Au), nickel (Ni), copper (CU), or an oxide or alloy thereof, and a transparent conductive material such as indium tin oxide (ITO), indium zinc oxide (IZO), indium tin zinc oxide (ITZO), zinc oxide (ZnO), or indium oxide ($In_2O_3$). Materials included in the electrode layers ETL1 and ETL2 may be the same or different.

The electrode layers ETL1 and ETL2 may be substantially transparent or semi-transparent. Accordingly, light generated by the light-emitting element LD may pass through the electrode layers ETL1 and ETL2 to be emitted to the outside of the light-emitting element LD. In some embodiments, when the light generated by the light-emitting element LD does not pass through the electrode layers ETL1 and ETL2 and is emitted to the outside of the light-emitting element LD through an area excluding both ends of the light-emitting element LD, the electrode layers ETL1 and ETL2 may be opaque.

In an embodiment, the light-emitting element LD may further include the insulating film INF provided on a surface thereof (e.g., an outer peripheral surface of the light-emitting element LD). The insulating film INF may be formed on the surface of the light-emitting element LD to surround (e.g., surround at least an outer peripheral surface of) the active layer ACT. In some embodiments, the insulating film INF may further surround one area of the first and second semiconductor layers SCL1 and SCL2. For example, the insulating film INF may surround outer peripheral surfaces of the first and second semiconductor layers SCL1 and SCL2.

When the light-emitting element LD includes the electrode layers ETL1 and ETL2, the insulating film INF may or may not at least partially cover outer peripheral surfaces of the electrode layers ETL1 and ETL2. That is, the insulating film INF may be optionally formed on surfaces of the electrode layers ETL1 and ETL2.

The insulating film INF may expose both ends of the light-emitting element LD in the direction of the length L of the light-emitting element LD. For example, the insulating film INF may expose at least one of the first and second semiconductor layers SCL1 and SCL2 and the electrode layers ETL1 and ETL2 at the first and second ends EP1 and EP2 of the light-emitting element LD. In some embodiments, the insulating film may surround the outer peripheral surfaces of the first and second semiconductor layers SCL1 and SCL2 and the electrode layers ETL1 and ETL2, and may expose an end portion of each the electrode layers ETL1 and ETL2. In some embodiments, the insulating film INF may not be provided in the light-emitting element LD.

When the insulating film INF is provided to cover the surface of the light-emitting element LD, for example, the outer peripheral surface of the active layer ACT, it is possible to prevent or protect the active layer ACT from being short-circuited with at least one electrode (for example, a pixel electrode and/or a contact electrode to be described below). Accordingly, electrical stability of the light-emitting element LD may be secured. In the present disclosure, the term "connection (or coupling)" may comprehensively refer to a physical and/or electrical connection (or coupling). In some cases, the term "connection (or coupling)" may comprehensively refer to a direct or indirect connection (or coupling) and an integral or non-integral connection (or coupling).

The insulating film INF may include a transparent insulating material. For example, the insulating film INF may include at least one insulating material selected from $SiO_2$ or silicon oxide ($SiO_x$) not determined as $SiO_2$, $Si_3N_4$ or silicon nitride ($SiN_x$) not determined as $Si_3N_4$, $Al_2O_3$ or aluminum oxide ($Al_xO_y$) not determined as $Al_2O_3$, and $TiO_2$ or titanium oxide ($TiO_x$) not determined as $TiO_2$, but the present disclosure is not limited thereto.

In some embodiments, when the insulating film INF is formed on the surface of the light-emitting element LD, surface defects of the light-emitting element LD may be reduced or minimized, thereby improving a lifetime and efficiency of the light-emitting element LD. In some embodiments, when the insulating film INF is formed on each light-emitting element LD, it is possible to prevent an undesired short circuit between the light-emitting elements LD even when the plurality of light-emitting elements LD are closely disposed.

In an embodiment of the present disclosure, the light-emitting element LD may be manufactured through a surface treatment process. For example, when the plurality of light-emitting elements LD are mixed in a flowable solution (or a solvent) and supplied to each emission area (for example, an emission area of each pixel), the light-emitting elements LD may each be surface-treated so as to be uniformly or substantially uniformly dispersed without being non-uniformly aggregated in the solution. As a non-limiting embodiment related thereto, the insulating film INF itself may be formed as a hydrophobic film using a hydrophobic material, or a hydrophobic film made of a hydrophobic material may be additionally formed on the insulating film INF.

A light-emitting device including the light-emitting element LD may be used in various types of devices, such as a display device DD, which require a light source. For example, the plurality of light-emitting elements LD may be disposed in each pixel of a display panel DP, and the light-emitting elements LD may be used as light sources of each pixel. However, an application field of the light-emitting element LD is not limited to the above-described example. For example, the light-emitting element LD may be used in other types of devices, such as a lighting device, which require a light source.

Figure 5:
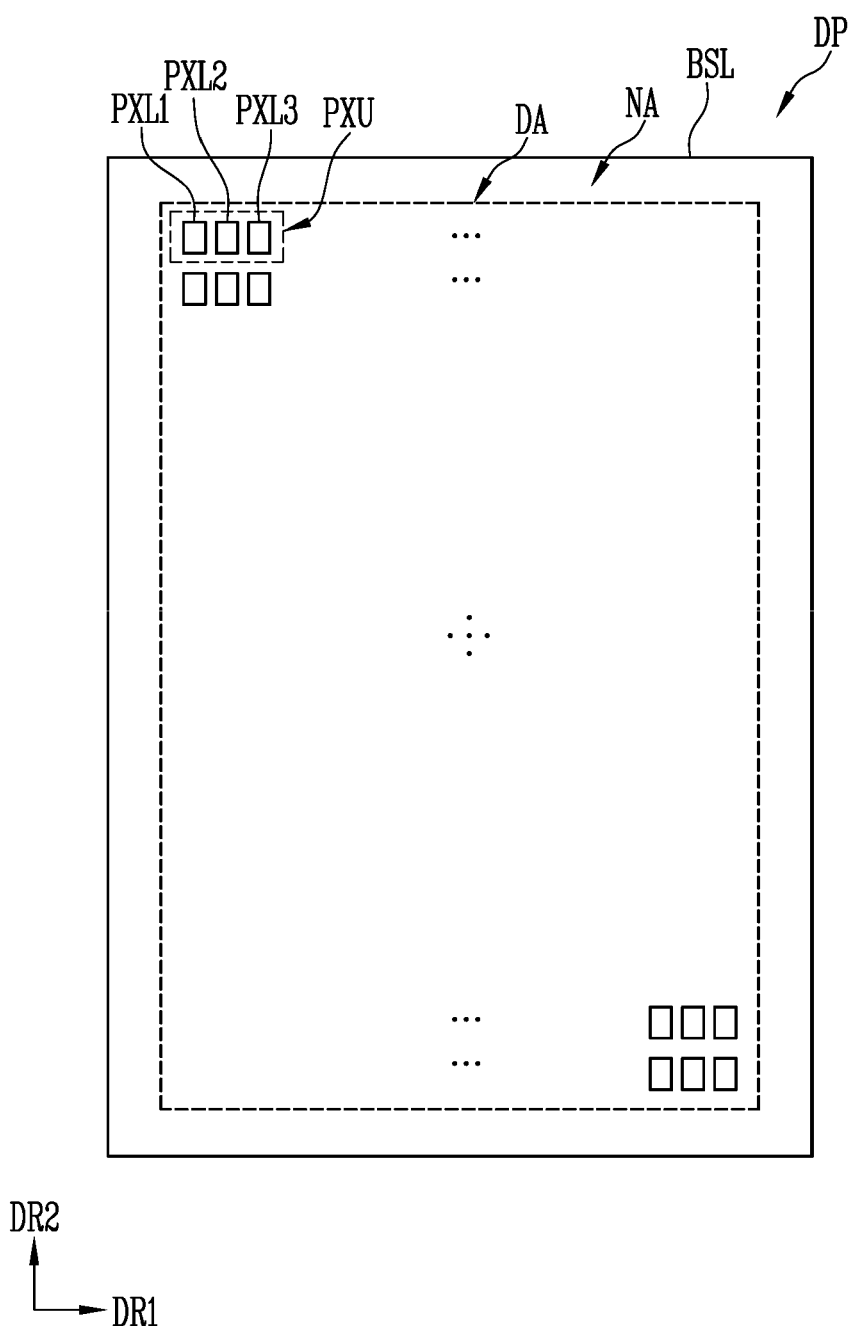
FIG. 5 is a plan view illustrating a display panel according to an embodiment of the present disclosure.

FIG. 5 is a plan view illustrating a display panel DP according to an embodiment of the present disclosure.

According to some embodiments, the display panel DP of FIG. 5 may use the light-emitting element LD described in the embodiments of FIGS. 4A-4D as a light source of each pixel. For example, each pixel unit PXU of the display panel PNL and each pixel constituting the same may include one or more light-emitting elements LD.

For convenience, in FIG. 5, the structure of the display panel DP is briefly illustrated based on a display area DA. However, according to some embodiments, at least one driving circuit unit, lines, and/or pads which are not illustrated may be further disposed in the display panel DP.

Referring to FIG. 5, the display panel DP may include a base layer BSL and pixels provided on the base layer BSL. According to some embodiments, the pixels may include first color pixels PXL1, second color pixels PXL2, and/or third color pixels PXL3. Hereinafter, when at least one pixel of the first pixels PXL1, the second pixels PXL2, and the third pixels PXL3 is arbitrarily described, the pixel will be referred to as "pixel PXL," or when at least two pixels thereof are collectively described, the pixels will be referred to as "pixels PXL."

The display panel DP and the base layer BSL for forming the same may include the display area DA for displaying an image and a non-display area NA excluding the display area DA.

The display area DA may be disposed in a central area of the display panel DP, and the non-display area NA may be disposed in an edge area of the display panel DP so as to surround the display area DA along the edge or periphery of the display area DA. However, the positions of the display area DA and the non-display area NA may be changed. The display area DA may constitute a screen on which an image is displayed, and the non-display area NA may be an area excluding the display area DA.

The pixels PXL may be disposed in the display area DA on the base layer BSL. As an example, the display area DA may include a plurality of pixel areas in which the pixels PXL are disposed. The non-display area NA may be disposed around the display area DA, and various lines, pads, and/or an embedded circuit unit, which are connected to the pixels PXL of the display area DA, may be disposed in the non-display area NA.

The pixels PXL may be regularly arranged in the display area DA according to a stripe arrangement structure or a PENTILE© arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. In some embodiments, the pixels PXL may be arranged in the display area DA in various structures and/or manners.

According to some embodiments, two or more types of pixels PXL emitting light having different colors may be disposed in the display area DA. As an example, the first pixels PXL1 emitting first color light, the second pixels PXL2 emitting second color light, and the third pixels PXL3 emitting third color light may be arranged in the display area DA. At least one first pixel PXL1, at least one second pixel PXL2, and at least one third pixel PXL3 disposed adjacent to each other may constitute one pixel unit PXU capable of emitting light having various colors.

According to some embodiments, the first pixel PXL1 may be a red pixel which emits red light, the second pixel PXL2 may be a green pixel which emits green light, and the third pixel PXL3 may be a blue pixel which emits blue light. In an embodiment, the first pixel PXL1, the second pixel PXL2, and the third pixel PXL3 may respectively include first color, second color, and third color light-emitting elements LD as light sources, thereby respectively emitting first color light, second color light, and third color light. In an embodiment, the first pixel PXL1, the second pixel PXL2, and the third pixel PXL3 may include the light-emitting elements LD having the same color. However, the first pixel PXL1, the second pixel PXL2, and the third pixel PXL3 may respectively include light conversion layers LCL having different colors disposed on the light-emitting elements LD, thereby respectively emitting the first color light, the second color light, and the third color light.

However, the color, type, and/or number of the pixels PXL constituting each pixel unit PXU are not particularly limited. For example, the color of the light emitted by each pixel PXL may be variously changed.

The pixel PXL may include at least one light source driven by control signals (e.g., set or predetermined control signals (for example, a scan signal and a data signal)) and/or power sources (e.g., set or predetermined power sources (for example, a first power source and a second power source)). In an embodiment, the light source may include one or more light-emitting elements LD according to the embodiments of FIGS. 4A-4B, for example, one or more rod-shaped light-emitting elements LD having a small size ranging from a nanoscale to a microscale. In some embodiments, various types of light-emitting elements may be used as the light source of the pixel PXL. For example, in an embodiment, the light source of the pixel PXL may be formed using a light-emitting element having a core-shell structure.

In some embodiments, the pixel PXL may have a structure according to at least an embodiment to be described below. For example, each pixel PXL may have a structure to which any one of the embodiments to be described below is applied or may have a structure to which at least two embodiments are applied in combination.

In an embodiment, each pixel PXL may be formed as an active pixel, but the present disclosure is not limited thereto. For example, the pixel PXL may be formed as a pixel of a passive or active light-emitting display device having various structures and/or driving methods.

Figure 6A:
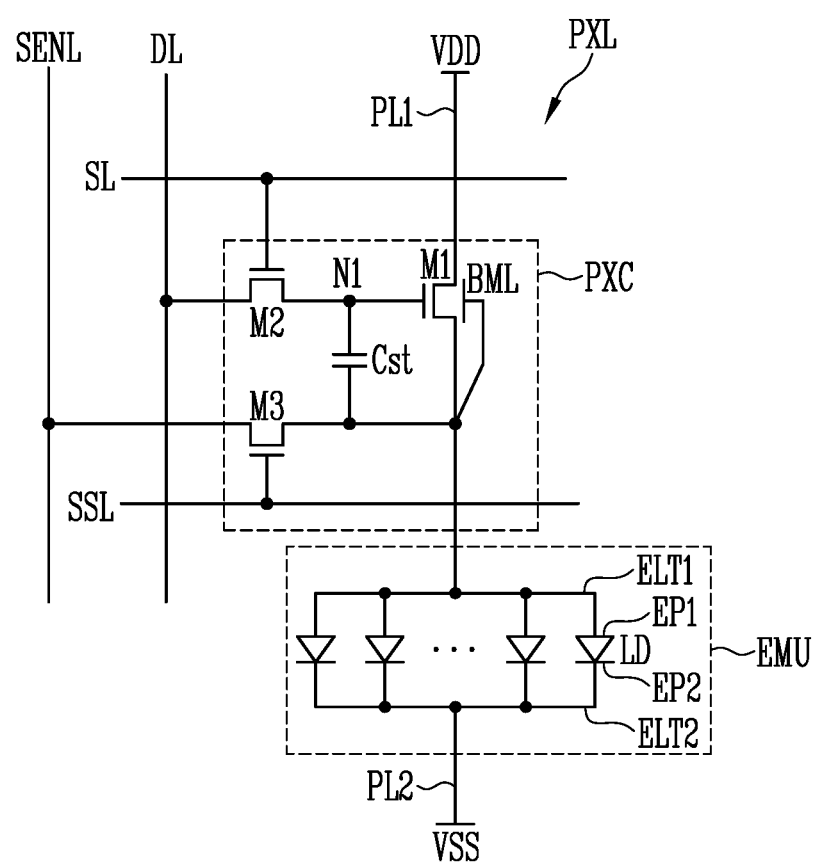
FIGS. 6A-6C are circuit diagrams illustrating pixels according to an embodiment of the present disclosure.
Figure 6B:
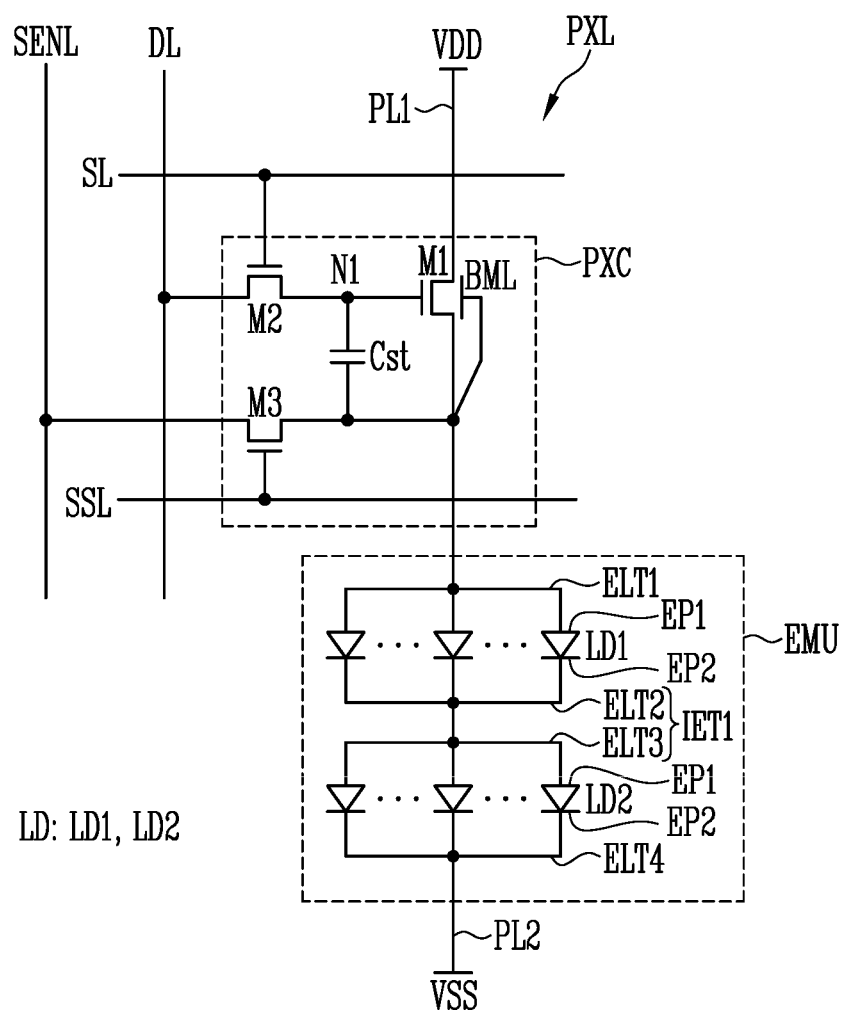
Figure 6C:
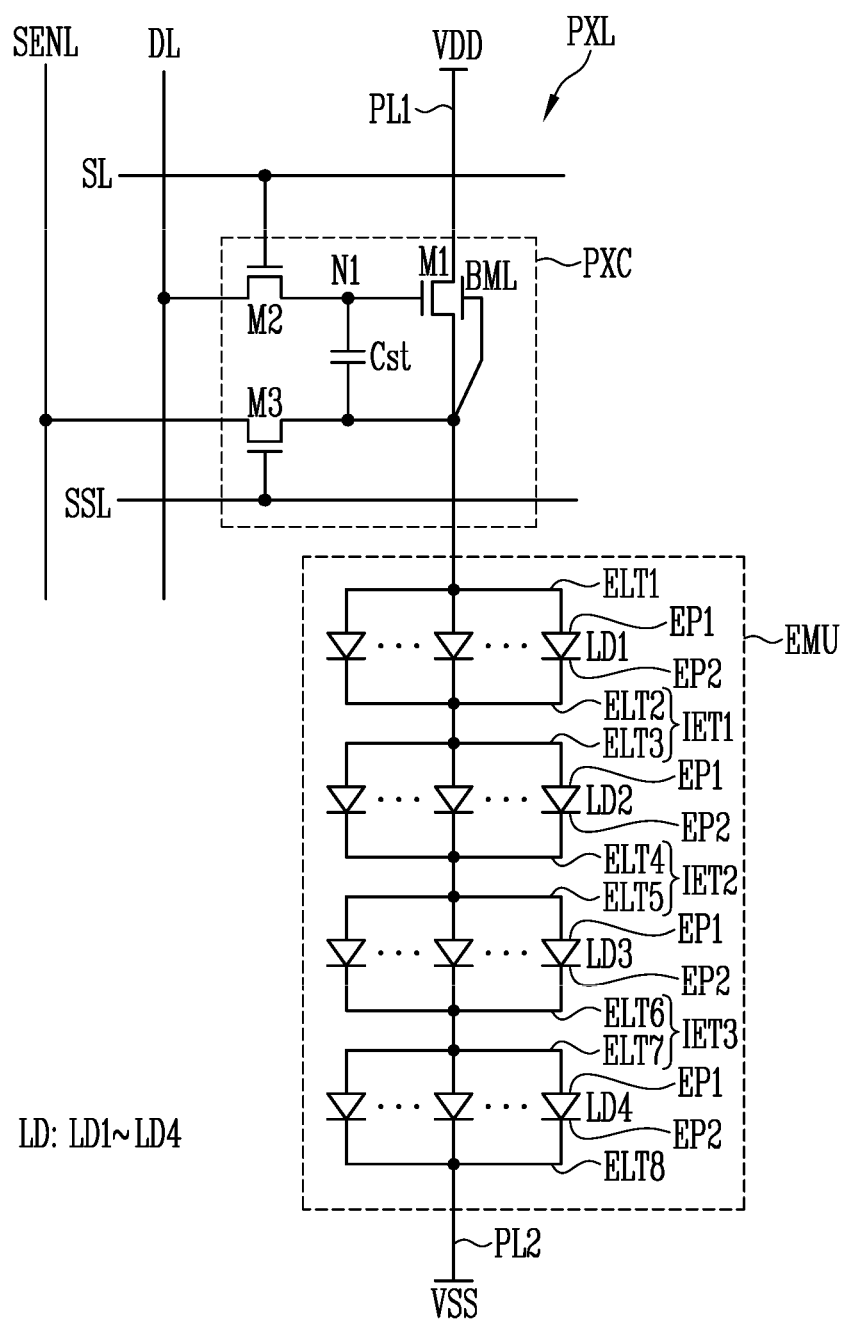

FIGS. 6A-6C are circuit diagrams illustrating pixels PXL according to an embodiment of the present disclosure. For example, FIGS. 6A-6C illustrate embodiments of the pixels PXL applicable to an active type display device and illustrate different embodiments in relation to a structure of a light-emitting unit EMU.

According to some embodiments, each of the pixels PXL illustrated in FIGS. 6A-6C may be any one of the first pixel PXL1, the second pixel PXL2, and the third pixel PXL3 provided in the display panel DP of FIG. 5. In some embodiments, the first pixel PXL1, the second pixel PXL2, and the third pixel PXL3 may have substantially the same or similar structure.

Referring to FIGS. 6A-6C, the pixel PXL may include the light-emitting unit EMU which generates light having luminance corresponding to a data signal. In some embodiments, the pixel PXL may optionally further include a pixel circuit PXC for driving the light-emitting unit EMU.

The pixel circuit PXC may be connected between a first power source VDD and the light-emitting unit EMU. Furthermore, the pixel circuit PXC may be connected to a scan line SL and a data line DL of the corresponding pixel PXL to control operations of the light-emitting unit EMU in response to a scan signal and a data signal supplied from the scan line SL and the data line DL. In some embodiments, the pixel circuit PXC may be optionally further connected to a sensing signal line SSL and a sensing line SENL.

The pixel circuit PXC may include one or more transistors and a capacitor. For example, the pixel circuit PXC may include a first transistor M1, a second transistor M2, a third transistor M3, and a storage capacitor Cst.

The first transistor M1 is connected between the first power source VDD and a first electrode ELT1 of the light-emitting unit EMU. A gate electrode of the first transistor M1 is connected to a first node N1. The first transistor M1 controls a driving current supplied to the light-emitting unit EMU in response to a voltage of the first node N1. That is, the first transistor M1 may be a driving transistor which controls a driving current of the pixel PXL.

In an embodiment, the first transistor M1 may optionally include a bottom metal layer BML (also referred to as "bottom metal electrode," "bottom electrode," or "bottom light-blocking layer"). The gate electrode of the first transistor M1 and the bottom metal layer BML may overlap each other with an insulating layer interposed therebetween.

In the described embodiment in which the first transistor M1 includes the bottom metal layer BML, when the pixel PXL is driven, it is possible to use back-biasing technology (or sync technology) for applying a back-biasing voltage to the bottom metal layer BML of the first transistor M1 to move a threshold voltage of the transistor M1 in a negative direction or a positive direction, as desired. As an example, the bottom metal layer BML may be connected to one electrode of the first transistor M1, for example, a source electrode, and source-sync technology may be applied to move the threshold voltage of the first transistor M1 in a negative direction or a positive direction. In some embodiments, when the bottom metal layer BML is disposed below a semiconductor layer constituting a channel of the first transistor M1, the bottom metal layer BML serves as a light-blocking pattern to stabilize the operating characteristics of the first transistor M1. However, the function and/or utilization method of the bottom metal layer BML are not limited thereto.

The second transistor M2 is connected between the data line DL and the first node N1. A gate electrode of the second transistor M2 is connected to the scan line SL. When a scan signal having a gate-on voltage (for example, a high level voltage) is supplied from the scan line SL, the second transistor M2 is turned on to electrically connect the data line DL and the first node N1.

During each frame period, a data signal of a corresponding frame is supplied to the data line DL, and the data signal is transmitted to the first node N1 through the second transistor M2 turned on during a period in which the scan signal having a gate-on voltage is supplied. That is, the second transistor M2 may be a switching transistor for transmitting each data signal into the pixel PXL.

One electrode of the storage capacitor Cst is connected to the first node N1, and the other electrode thereof is connected to a second electrode of the first transistor M1. The storage capacitor Cst is charged with a voltage corresponding to a data signal supplied to the first node N1 during each frame period.

The third transistor M3 is connected between the first electrode ELT1 of the light-emitting unit EMU (or the second electrode of the first transistor M1) and the sensing line SENL. A gate electrode of the third transistor M3 is connected to the sensing signal line SSL. The third transistor M3 may transmit a voltage value applied to the first electrode ELT1 of the light-emitting unit EMU to the sensing line SENL according to a sensing signal supplied to the sensing signal line SSL during a sensing period (e.g., a set or predetermined sensing period). The voltage value transmitted through the sensing line SENL may be provided to an external circuit (for example, a timing controller), and the external circuit may extract characteristic information of each pixel PXL (for example, a threshold voltage and the like of the first transistor M1) based on the supplied voltage value. The extracted characteristic information may be used to convert image data so that a characteristic deviation between the pixels PXL is compensated for.

In FIGS. 6A-6C, transistors included in the pixel circuit PXC, for example, all of the first, second, and third transistors M1, M2, and M3 are illustrated as being N-type transistors, but the present disclosure is not necessarily limited thereto. That is, at least one of the first to third transistors T1 to T3 may be changed to a P-type transistor In some embodiments, the structure and driving method of the pixel PXL may be variously changed. For example, in addition to the embodiments illustrated in FIGS. 6A-6C, the pixel circuit PXC may be formed as a pixel circuit having various structures and/or driving methods.

As an example, the pixel circuit PXC may not include the third transistor M3. In some embodiments, the pixel circuit PXC may further include other circuit elements such as a compensation transistor for compensating for the threshold voltage of the first transistor M1, an initialization transistor for initializing a voltage of the first node N1 and/or the first electrode ELT1 of the light-emitting unit EMU, an emission control transistor for controlling a period in which a driving current is supplied to the light-emitting unit EMU, and/or a boosting capacitor for boosting the voltage of the first node N1.

In an embodiment, when the pixel PXL is a pixel of a passive light-emitting display device, the pixel circuit PXC may be omitted. In this case, the light-emitting unit EMU may be connected directly to the scan line SL, the data line DL, a first power line PL1, a second power line PL2, and/or other signal lines or power lines.

The light-emitting unit EMU may include one or more light-emitting elements LD connected between the first power source VDD and a second power source VSS.

For example, the light-emitting unit LMU may include the first electrode ELT1 (or also referred to as "first pixel electrode" or "first alignment electrode") connected to the first power source VDD through the pixel circuit PXC and the first power line PL1, a second electrode ELT2 (or also referred to as "second pixel electrode" or "second alignment electrode") connected to the second power source VSS through the second power line PL2, and the plurality of light-emitting elements LD connected between the first electrode ELT1 and the second electrode ELT2.

The first power source VDD and the second power source VSS may have different potentials such that the light-emitting elements LD emit light. As an example, the first power source VDD may be set as a high potential power source, and the second power source VSS may be set as a low potential power source.

In an embodiment, as in the embodiment of FIG. 6A, the light-emitting unit EMU may include the plurality of light-emitting elements LD connected in parallel in the same direction between the first electrode ELT1 and the second electrode ELT2. Each of the light-emitting elements LD may include a first end EP1 (for example, a P-type end) connected to the first power source VDD through the first electrode ELT1, the pixel circuit PXC, and the first power line PL1, and a second end (for example, an N-type end) connected to the second power source VSS through the second electrode ELT2 and the second power line PL2. That is, the light-emitting elements LD may be connected in parallel in a forward direction between the first electrode ELT1 and the second electrode ELT2.

Each of the light-emitting elements LD connected in the forward direction between the first power source VDD and the second power source VSS may constitute each effective light source. The effective light sources may be clustered to constitute the light-emitting unit EMU of the pixel PXL.

The first ends EP1 of the light-emitting elements LD may be commonly connected to the pixel circuit PXC through one electrode (for example, the first electrode ELT1) of the light-emitting unit EMU and may be connected to the first power source VDD through the pixel circuit PXC and the first power line PL1. The second ends EP2 of the light-emitting elements LD may be commonly connected to the second power source VSS through the other one electrode (for example, the second electrode ELT2) of the light-emitting unit EMU and the second power line PL2.

In the embodiment of FIG. 6A, the pixel PXL includes the light-emitting unit EMU having a parallel structure, but the present disclosure is not limited thereto. For example, the pixel PXL may include the light-emitting unit EMU having a series structure or a series-parallel structure. As an example, as in the embodiment of FIG. 6B, the light-emitting unit EMU may include the plurality of light-emitting elements LD divided and connected in two series stages.

Referring to FIG. 6B, the light-emitting unit EMU may include a first series stage which includes a first electrode ELT1, a second electrode ELT2, and one or more first light-emitting electrodes LD1 connected in a forward direction between the first electrode ELT1 and the second electrode ELT2 and a second series stage which includes a third electrode ELT3, a fourth electrode ELT4, and one or more second light-emitting elements LD2 connected in a forward direction between the third electrode ELT3 and the fourth electrode ELT4.

A first electrode of the light-emitting unit EMU, for example, the first electrode ELT1 may be an anode of the light-emitting unit EMU. A last electrode of the light-emitting unit EMU, for example, the fourth electrode ELT4 may be a cathode of the light-emitting unit EMU. The remaining electrodes of the light-emitting unit EMU, for example, the second and third electrodes ELT2 and ELT3 may be integrally or non-integrally connected to each other to form a first intermediate electrode IET1. In this case, the second and third electrodes ELT2 and ELT3 may be integrated to be regarded as one first intermediate electrode IET1.

In some embodiments, the number of series stages constituting each light-emitting unit EMU may be variously changed according to embodiments. For example, as in the embodiment of FIG. 6C, the light-emitting unit EMU may include the plurality of light-emitting elements LD divided and connected in four serial stages.

Referring to FIG. 6C, the light-emitting unit EMU may include a first series stage which includes a first electrode ELT1, a second electrode ELT2, and one or more first light-emitting electrodes LD1 connected in a forward direction between the first electrode ELT1 and the second electrode ELT2, a second series stage which includes a third electrode ELT3, a fourth electrode ELT4, and one or more second light-emitting elements LD2 connected in a forward direction between the third electrode ELT2 and the fourth electrode ELT4, a third series stage which includes a fifth electrode ELT5, a sixth electrode ELT6, and one or more third light-emitting elements LD3 connected in a forward direction between the fifth electrode ELT5 and the sixth electrode ELT6, and a fourth series stage which includes a seventh electrode ELT7, an eighth electrode ELT8, and one or more fourth light-emitting elements LD4 connected in a forward direction between the seventh electrode ELT7 and the eighth electrode ELT8.

That is, each series stage may include a pair of pixel electrodes (for example, two pixel electrodes) and one or more light-emitting elements LD connected between the pair of pixel electrodes. Here, the numbers of the light-emitting elements LD constituting series stages may be the same or different, and the number of the light-emitting elements LD is not particularly limited.

A first pixel electrode of the light-emitting unit EMU, for example, the first electrode ELT1 may be an anode of the light-emitting unit EMU. A last pixel electrode of the light-emitting unit EMU, for example, the eighth electrode ELT8 may be a cathode of the light-emitting unit EMU.

The remaining electrodes of the light-emitting unit EMU, for example, the second to seventh electrodes ELT2 to ELT7, may constitute each intermediate electrode. For example, the second and third electrodes ELT2 and ELT3 may be integrally or non-integrally connected to each other to form a first intermediate electrode IET1. Similarly, the fourth electrode ELT4 and the fifth electrode ELT5 may be integrally or non-integrally connected to each other to form a second intermediate electrode IET2, and the sixth electrode ELT6 and the seventh electrode ELT7 may be integrally or non-integrally connected to each other to form a third intermediate electrode IET3. In this case, the second and third electrodes ELT2 and ELT3 may be integrated to be regarded as one first intermediate electrode IET1, the fourth and fifth electrodes ELT4 and ELT5 may be integrated to be regarded as one second intermediate electrode IET2, and the sixth and seventh electrodes ELT6 and ELT7 may be integrated to be regarded as one third intermediate electrode IET3.

Assuming that the light-emitting unit EMU is formed using the light-emitting elements LD under the same conditions (for example, the same size and/or number), when the light-emitting elements LD are connected in a series structure or a series-parallel structure, power efficiency may be improved. In some embodiments, in the pixel PXL in which the light-emitting elements LD are connected in a series structure or a series-parallel structure, even when short circuit defects occur in some series stages, a certain degree of luminance may be expressed through the light-emitting elements LD of the remaining series stage, thereby reducing the possibility of dark spot defects of the pixel PXL.

FIGS. 6A-6C illustrate the embodiments in which the light-emitting elements LD are connected in a parallel structure or in a series-parallel structure, but the present disclosure is not limited thereto. For example, in an embodiment, the light-emitting elements LD constituting the light-emitting unit EMU of each pixel PXL may be connected only in series.

Each of the light-emitting elements LD may include the first end EP1 (for example, a P-type end) connected to the first power source VDD through a pixel electrode (for example, the first electrode ELT1), the pixel circuit PXC, the first power line PL1, and the like, and the second end EP2 (for example, an N-type end) connected to the second power source VSS through at least another pixel electrode (for example, the eighth electrode ELT8), the second power line PL2, and the like. That is, the light-emitting elements LD may be connected in a forward direction between the first power source VDD and the second power source VSS. As described above, each of the light-emitting elements LD connected in the forward direction between the first power source VDD and the second power source VSS may constitute each effective light source. The effective light sources may be clustered to constitute the light-emitting unit EMU of the pixel PXL.

When a driving current is supplied through the corresponding pixel circuit PXC, the light-emitting elements LD may emit light with luminance corresponding to the driving current. For example, during each frame period, the pixel circuit PXC may supply a driving current corresponding to a gradation value expressed in a corresponding frame to the light-emitting unit EMU. Accordingly, while the light-emitting element LD emit light with luminance corresponding to a driving current, the light-emitting unit EMU may also emit light with luminance corresponding to the driving current.

In an embodiment, the light-emitting unit EMU may further include at least one ineffective light source in addition to the light-emitting elements LD constituting effective light sources. As an example, in at least one series stage, at least one ineffective light-emitting element, which is arranged in a reverse direction or of which at least one end is floated, may be further connected. Even when a forward driving voltage is applied between the pixel electrodes, the ineffective light-emitting element may maintain an inactive state and thus may maintain substantially a non-emission state.

Figure 7:
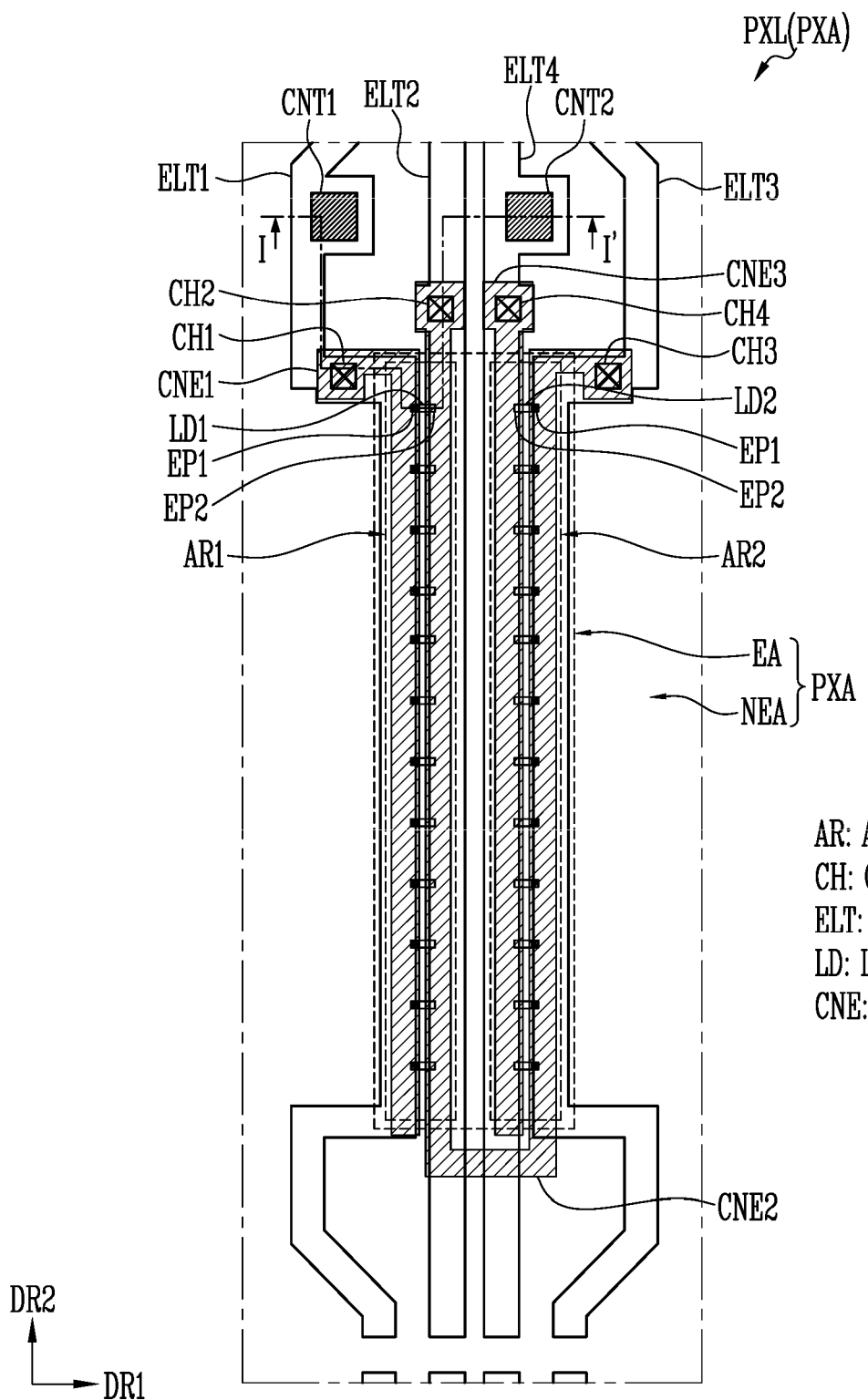
FIGS. 7 and 8 are plan views illustrating pixels according to an embodiment of the present disclosure.
Figure 8:
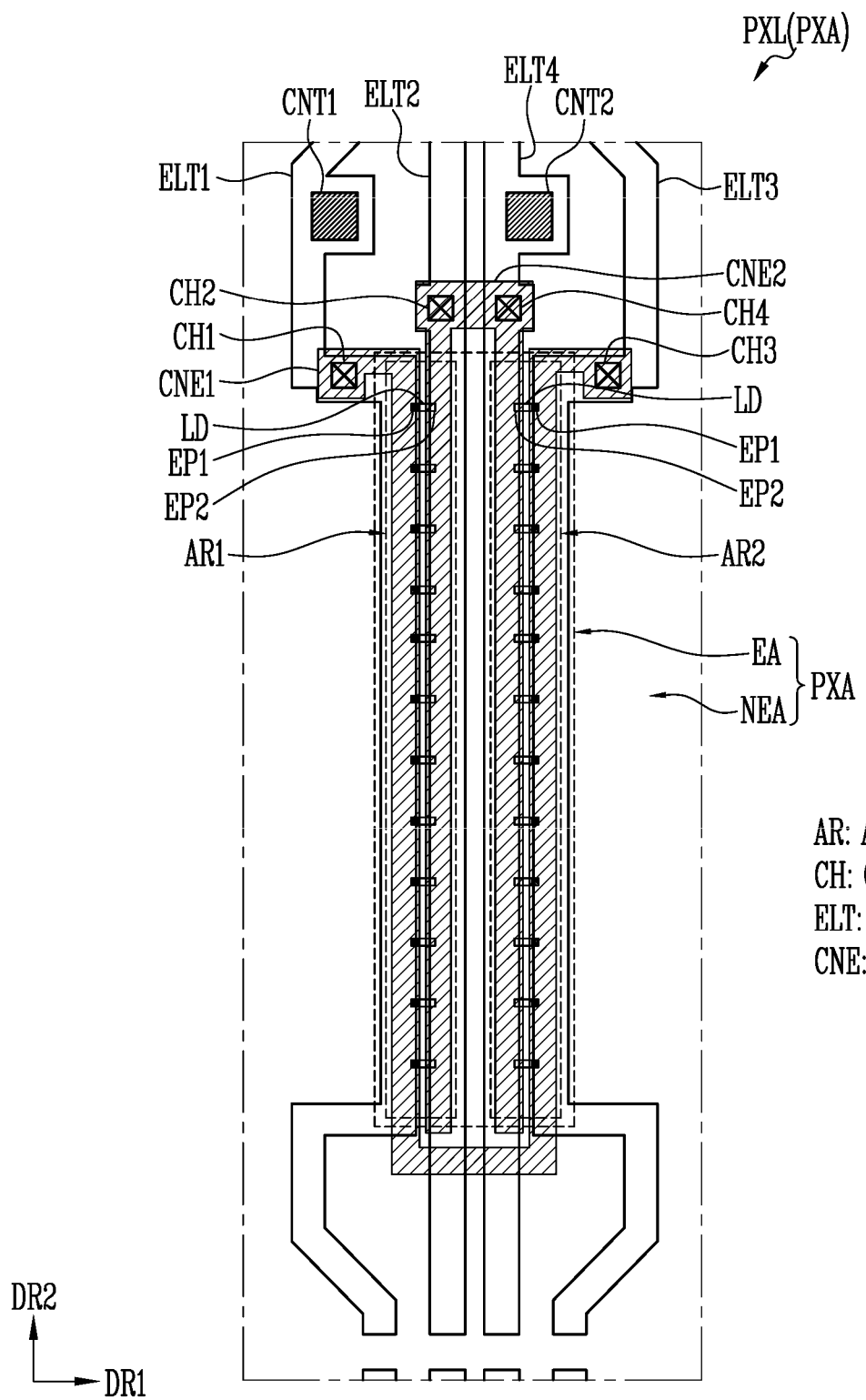

FIGS. 7 and 8 are plan views illustrating pixels PXL according to an embodiment of the present disclosure. For example, FIG. 7 illustrates an example structure of a pixel area PXA based on a light-emitting unit EMU in a pixel PXL including the light-emitting unit EMU having a serial-parallel structure, and FIG. 8 illustrates an example structure of a pixel area PXA based on a light-emitting unit EMU in a pixel PXL including the light-emitting unit EMU having a parallel structure.

For convenience, although FIG. 7 illustrates the light-emitting unit EMU having a two-stage series-parallel structure as in the embodiment of FIG. 6B, but the present disclosure is not limited thereto. For example, the light-emitting unit EMU may be formed in a series-parallel structure of three or more stages (for example, a four-stage series-parallel structure of FIG. 6C), and the structure of the light-emitting unit EMU may be variously changed according to the number or the like of series stages constituting the light-emitting unit EMU.

The described embodiment of FIG. 7 and FIG. 8 illustrates that the light-emitting unit EMU having a parallel structure in which a first pixel electrode and a second pixel electrode are formed by dividing electrodes separated into four electrodes into two groups and connecting the four electrodes, but the present disclosure is not limited thereto. For example, the light-emitting unit EMU having the parallel structure may include a smaller number of electrodes (for example, two or three electrodes).

Also, FIGS. 7 and 8 illustrate the embodiments in which the pixel area PXA has a rectangular plate shape including a pair of short sides and a pair of long sides. An extending direction of the short side is expressed as a first direction DR1, and an extending direction of the long side is expressed as a second direction DR2. However, the extending directions may be changed according to the size and/or shape of the pixel area PXA.

First, referring to FIGS. 5-7, a pixel PXL may include a plurality of light-emitting element array regions AR corresponding to series stages of the light-emitting unit EMU. For example, the pixel PXL may include a first light-emitting element array region AR1 corresponding to a first series stage and a second light-emitting element array region AR2 corresponding to a second series stage. The first and second light-emitting element array regions AR1 and AR2 may be disposed to be spaced from each other in the pixel area PXA.

When the light-emitting unit EMU of the pixel PXL includes only one series stage, only a single light-emitting element arrangement region AR (or emission area EA) may be disposed in the pixel area PXA. However, as in the embodiment of FIG. 8 to be described below, even when the light-emitting unit EMU of the pixel PXL includes only one series stage, a plurality of light-emitting elements LD connected in parallel in the series stage may be divided and disposed in two or more light-emitting element array regions AR.

According to described embodiments, in each pixel area PXA, one area including at least one light-emitting element array region AR may constitute the emission area EA of the corresponding pixel PXL. The remaining area of the pixel area PXA excluding the emission area EA may be a non-emission area NEA. According to embodiments, the non-emission area NEA may be disposed around the emission area EA to surround the emission area EA.

That is, the pixel area PXA may include the light-emitting elements LD capable of emitting light in the emission area EA and a non-emission area NEA excluding the emission area EA. In some embodiments, the emission area EA may include at least one light-emitting element array region AR corresponding to at least one series stage.

Each light-emitting element array region AR may be a region in which the light-emitting elements LD of each series stage may be arranged and/or aligned to emit light and may also be referred to as "light-emitting element alignment area" or "sub-emission area." Each light-emitting element array region AR may include at least one pair of pixel electrodes ELT and one or more light-emitting elements LD connected between the pixel electrodes ELT.

For example, the first light-emitting element array region AR1 may include a first electrode ELT1, a second electrode ELT2, and one or more first light-emitting elements LD1 connected between the first electrode ELT1 and the second electrode ELT2. Similarly, the second light-emitting element array region AR2 may include a third electrode ELT3, a fourth electrode ELT4, and one or more second light-emitting elements LD2 connected between the third electrode ELT3 and the fourth electrode ELT4.

In some embodiments, each light-emitting element array region AR may further include contact electrodes CNE for stably connecting pixel electrodes ELT to adjacent light-emitting elements LD and/or for connecting two consecutive series stages. In describing the present embodiment, the first to fourth electrodes ELT1 to ELT4 are defined as pixel electrodes, and the contact electrodes CNE will be described as elements separate from the pixel electrodes. However, the present disclosure is not limited thereto. For example, the first to fourth electrodes ELT1 to ELT4 and the contact electrodes CNE may be comprehensively regarded as pixel electrodes.

According to some embodiments, the first and second light-emitting element array regions AR1 and AR2 may have substantially the same or similar structure, but the present disclosure is not limited thereto. In some embodiments, the numbers of the light-emitting elements LD disposed in the first and second light-emitting element array regions AR1 and AR2 may be the same or different, or the shapes of the pixel electrodes ELT and/or the contact electrodes CNE may be the same or different.

When the structure of the pixel PXL is described from a more global point of view, the pixel PXL may include the plurality of pixel electrodes ELT formed in the corresponding pixel area PXA, the light-emitting elements LD arranged between the pixel electrodes ELT in each light-emitting element array region AR, and the contact electrodes CNE for stably connecting the light-emitting elements LD to the pixel electrodes ELT.

According to some embodiments, the pixel electrodes ELT, the light-emitting elements LD, and the contact electrodes CNE may be sequentially disposed based on one surface of a base layer BSL on which the pixel PXL is formed. The cross-sectional structure of the pixel PXL will be described in detail below.

The pixel electrodes ELT may include at least one pair of electrodes disposed in each light-emitting element array region AR. For example, the pixel electrodes ELT may include the first electrode ELT1 and the second electrode ELT2 disposed to be opposite to each other in the first light-emitting element array region AR1 and the third electrode ELT3 and the fourth electrode ELT4 disposed to be opposite to each other in the second light-emitting element array region AR2.

In each light-emitting element array region AR, the first to fourth electrodes ELT1 and ELT4 are disposed to be spaced from each other in the first direction DR1 and may extend in the second direction DR2, but the present disclosure is not limited thereto. In an embodiment, the first direction DR1 may be a lateral direction (or row direction), and the second direction DR2 may be a vertical direction (or column direction), but the present disclosure is not limited thereto.

In some embodiments, in each pixel area PXA, the first to fourth electrodes ELT1 and ELT4 may have a uniform width or a non-uniform width and may or may not include a bent portion. That is, the shape and/or the mutual arrangement structure of each of the first to fourth electrodes ELT1 and ELT4 may be variously changed according to embodiments.

Some of the first to fourth electrodes ELT1 to ELT4 may be formed in such a manner that one alignment line is first formed and then is disconnected to be separated into the pixel electrodes ELT in areas between one pixel PXL and pixels PXL adjacent thereto (for example, an upper end area and/or a lower end area of each pixel area PXA). Accordingly, it is possible to reduce the number of alignment signals for aligning the light-emitting elements LD in each pixel area PXA and to also form each pixel electrode ELT as a separate electrode corresponding to each series stage in a pixel PXL.

A pair of pixel electrodes ELT constituting each series stage may be disposed relatively close to each other in each light-emitting element array region AR and may be disposed at a relatively long distance from each other in the remaining areas. For example, the pair of pixel electrodes ELT may be disposed to be opposite to each other at a first interval in each light-emitting element array region AR, and may be disposed to be opposite to each other at a second interval greater than the first interval in the non-emission area NEA.

Accordingly, in an operation of supplying and aligning the light-emitting elements LD in each pixel area PXA, the light-emitting elements LD may be arranged in a desired area. For example, when the light-emitting elements LD are aligned in the pixel area PXA by applying an alignment signal (e.g., a set or predetermined alignment signal) to the pixel electrodes ELT (or alignment lines before being separated into the pixel electrodes ELT), a stronger electric field is generated in the light-emitting element array region AR in which a distance between the adjacent pixel electrodes ELT is relatively short. Accordingly, the light-emitting elements LD may be arranged in the light-emitting element array region AR on the adjacent pixel electrodes ELT.

One of the pixel electrodes ELT, for example, the first electrode ELT1, may be connected to a pixel circuit PXC and/or a first power line PL1 through a first contact portion CNT1. Another one of the pixel electrodes ELT, for example, the fourth electrode ELT4, may be connected to a second power line PL2 through a second contact portion CNT2.

According to some embodiments, the pixel electrodes ELT may be connected to the light-emitting elements LD through the contact electrodes CNE. For example, each pixel electrode ELT may be connected to a first end EP1 or a second end EP2 of at least one adjacent light-emitting element LD through each contact electrode CNE.

The light-emitting elements LD may be divided and arranged in the light-emitting element array regions AR. The light-emitting elements LD may be arranged between a pair of adjacent pixel electrodes ELT disposed in each light-emitting element array region AR. Here, the light-emitting elements LD being arranged between the pair of adjacent pixel electrodes ELT may mean that at least a partial area of the light-emitting elements LD is disposed in an area between the pair of adjacent pixel electrodes ELT and an upper and/or a lower area thereof.

For example, the light-emitting elements LD may include the first and second light-emitting elements LD1 and LD2 which are divided and arranged in the first and second light-emitting element array regions AR1 and AR2. The first light-emitting elements LD1 may be connected between the first electrode ELT1 and the second electrode ELT2, and the second light-emitting elements LD2 may be connected between the third electrode ELT3 and the fourth electrode ELT4.

In an embodiment, the light-emitting elements LD may be connected to each pixel electrode ELT through each contact electrode CNE. In some embodiments, the light-emitting elements LD disposed in the two consecutive series stages may be connected in series by at least one contact electrode CNE.

For example, the pixel PXL may include the contact electrode CNE which is disposed on each pixel electrode ELT and connects the first or second ends EP1 or EP2 of one or more light-emitting elements LD adjacent to the pixel electrode ELT to the pixel electrode ELT. As an example, the pixel PXL may include first to third contact electrodes CNE1 to CNE3.

The first contact electrode CNE1 may be disposed on first ends EP1 and of the first light-emitting elements LD1 and the first electrode ELT1. The first contact electrode CNE1 may connect the first ends EP1 of the first light-emitting elements LD1 to the first electrode ELT1.

The second contact electrode CNE2 may be disposed on second ends EP2 of the first light-emitting elements LD1 and the second electrode ELT2 to connect the second ends of the first light-emitting elements LD1 to the second electrode ELT2. Further, the second contact electrode CNE2 may also be disposed on first ends EP1 of the second light-emitting elements LD2 and the third electrode ELT3 to connect the first ends EP1 of the second light-emitting element LD2 to the third electrode ELT3.

To this end, the second contact electrode CNE2 may extend from the first light-emitting element array region AR1 to the second light-emitting element array region AR2 to connect the second electrode ELT2 to the third electrode ELT3. In an embodiment, the second contact electrode CNE2 may include a plurality of separate electrodes disposed in the first and second light-emitting element array regions AR1 and AR2, and the separate electrodes may be connected through bridge patterns or the like. The first series stage and the second series stage may be connected by the second contact electrode CNE2.

The third contact electrode CNE3 may be disposed on second ends EP2 of the second light-emitting elements LD2 and the fourth electrode ELT4 to connect the second ends EP2 of the second light-emitting elements LD2 to the fourth electrode ELT4.

In the above-described manner, the pixel electrodes ELT and the light-emitting elements LD may be connected in a desired shape using the contact electrodes CNE. For example, the first light-emitting elements LD1 and the second light-emitting elements LD2 may be connected in series using the contact electrodes CNE.

In some embodiments, in order to increase a utilization rate of the light-emitting elements LD supplied to each light-emitting element array region AR, an alignment signal for aligning the light-emitting elements LD may be adjusted or a magnetic field may be formed to bias and align the light-emitting elements LD such that a larger number (or ratio) of the light-emitting elements LD are aligned in a specific direction in the light-emitting element array region AR. In this case, it is possible to connect the pixel electrodes ELT according to an arrangement direction of more light-emitting elements LD using the contact electrodes CNE. Accordingly, it is possible to improve the utilization rate of the light-emitting elements LD and improve the light efficiency of the pixel PXL.

In an embodiment, each contact electrode CNE is formed directly on the first or second ends EP1 and EP2 of adjacent light-emitting elements LD and connected to the first or second ends EP1 and EP2 of the light-emitting elements LD.

In some embodiments, an insulating layer not illustrated (for example, a first insulating layer INS1 of FIGS. 9A-9C to be described below) may be interposed between each contact electrode CNE and the pixel electrode(s) ELT corresponding thereto, and each contact electrode CNE and the pixel electrode ELT corresponding thereto may be connected through each contact hole CH (e.g., CH1, CH2) passing through the insulating layer. In this case, the pixel electrodes ELT are stably covered by the insulating layer, thereby preventing the pixel electrodes ELT from being damaged in a subsequent process.

For example, the first contact electrode CNE1 may be electrically connected to the first electrode ELT1 through a first contact hole CH1, and the third contact electrode CNE3 may be electrically connected to the fourth electrode ELT4 through a fourth contact hole CH4. The second contact electrode CNE2 commonly connected to the second and third electrodes ELT2 and ELT3 may be electrically connected to the second electrode ELT2 through a second contact hole CH2 and may be electrically connected to the third electrode ELT3 through a third contact hole CH3.

In an embodiment, the pixel electrodes ELT and the contact electrodes CNE corresponding thereto may be connected through the contact holes CH outside each light-emitting element array region AR (for example, in the non-emission area NEA). In this case, because a process of forming the contact hole CH in the insulating layer may be performed at least by avoiding an area in which the light-emitting elements LD are arranged, it is possible to prevent or reduce damage to the light-emitting elements LD.

Referring to FIG. 8, the light-emitting unit EMU may have one-stage series structure (i.e., a parallel structure) corresponding to the embodiment of FIG. 6A. In this case, each pixel area PXA may include a single light-emitting element array region AR or may include a plurality of light-emitting element array regions AR.

For example, as in the embodiment of FIG. 7, even in the embodiment of FIG. 8, first and second electrodes ELT1 and ELT2 may be disposed in a first light-emitting element array region AR1, and third and fourth electrodes ELT3 and ELT4 may be disposed in a second light-emitting element array region AR2. The first and third electrodes ELT1 and ELT3 may be connected using a first contact electrode CNE1, and the second and fourth electrodes ELT2 and ELT4 may be connected using a second contact electrode CNE2. In this case, the first and third electrodes ELT1 and ELT3 may electrically form one electrode (for example, a first pixel electrode), and the second and fourth electrodes ELT2 and ELT4 may electrically form one electrode (for example, a second pixel electrode). Light-emitting elements LD connected between the first electrode ELT1 and the second electrode ELT2 may be connected parallel to light-emitting elements LD connected between the third electrode ELT3 and the fourth electrode ELT4.

In another embodiment, only one of the first and third electrodes ELT1 and ELT3 may be formed, and/or only one of the second and fourth electrodes ELT2 and ELT4 may be formed.

Figure 9B:
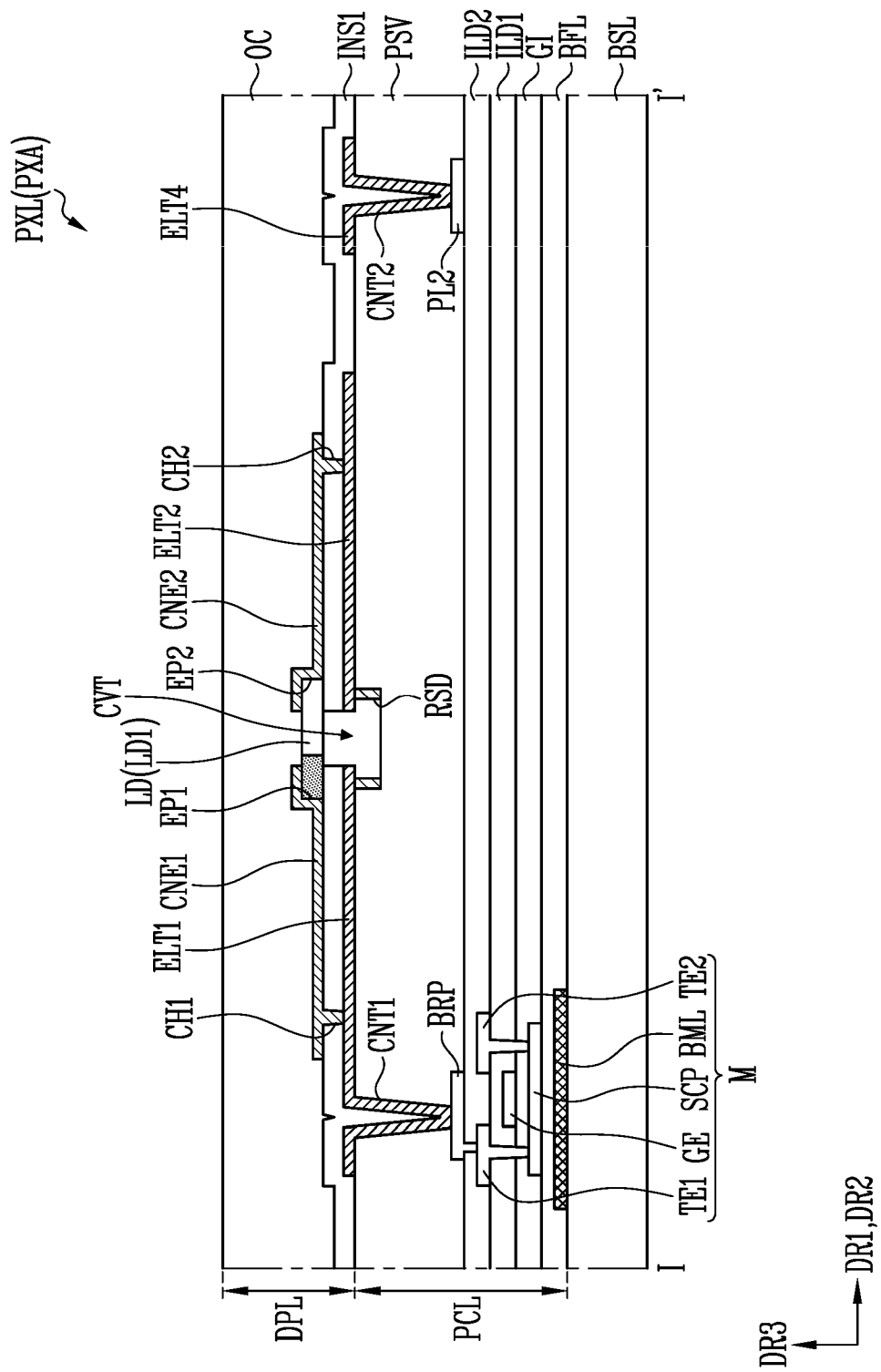
Figure 9C:
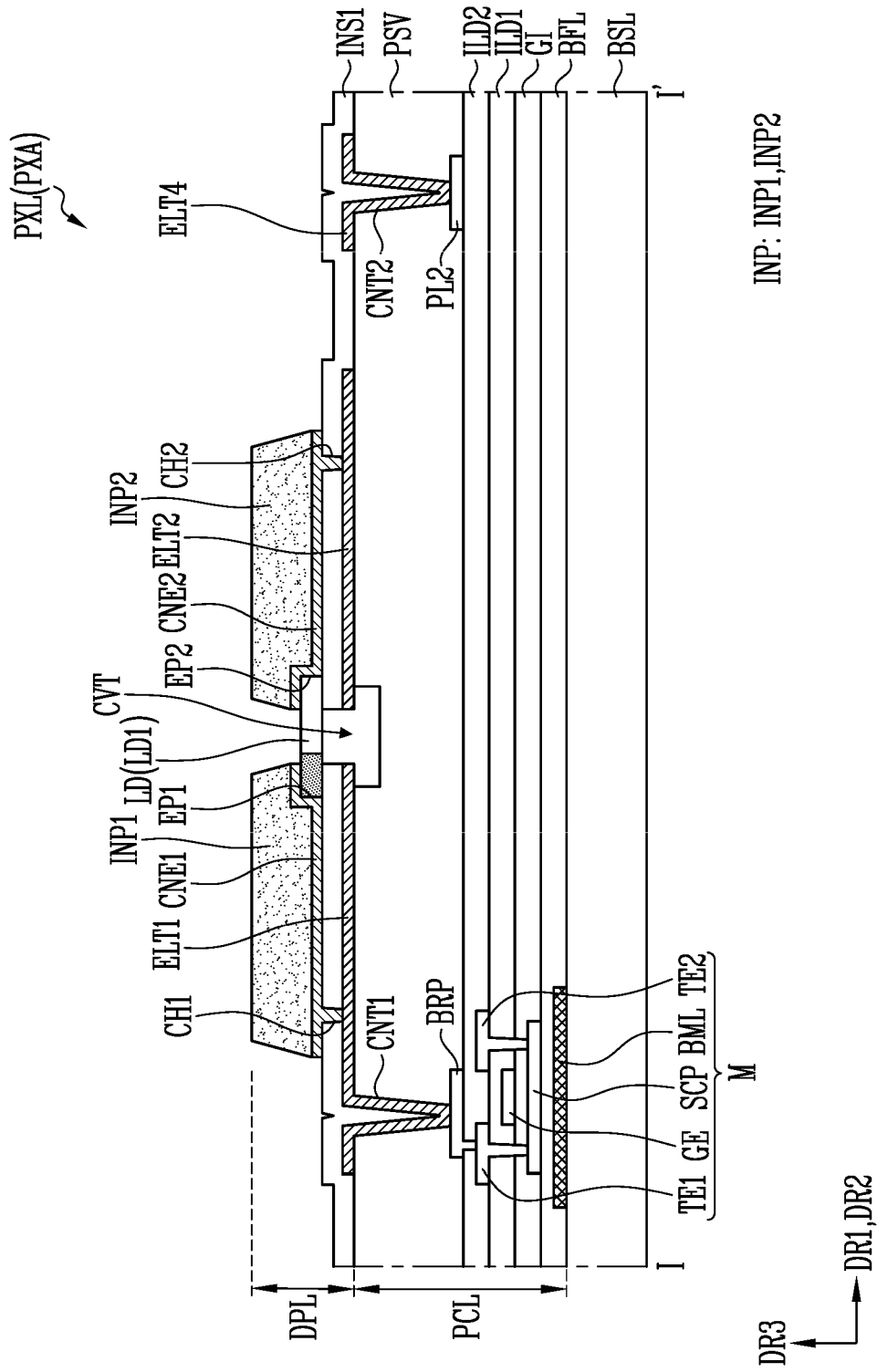

FIGS. 9A-9C are cross-sectional views illustrating pixels PXL according to an embodiment of the present disclosure. For example, FIGS. 9A-9C illustrate different embodiments of a cross section of the pixel PXL taken along the line I-I' of FIG. 7. Compared to the embodiment of FIG. 9A, the embodiment of FIG. 9B further includes a residue RSD of a conductive film inside a cavity CVT, and the embodiment of FIG. 9C further includes insulating patterns INP disposed on contact electrodes CNE.

As an example of circuit elements that may be disposed on a pixel circuit layer PCL, FIGS. 9A to 9C illustrate an arbitrary transistor M (for example, a transistor connected to a first electrode ELT1 through a first contact portion CNT1 and a bridge pattern BRP). In some embodiments, as an example of lines that may be disposed on the pixel circuit layer PCL, FIGS. 9A-9C illustrate a second power line PL2 connected to a fourth electrode ELT4 through a second contact portion CNT2.

First, referring to FIGS. 5-9A, the pixel PXL and a display panel DP including the same according to the described embodiment of the present disclosure may include the pixel circuit layer PCL and a display element layer DPL disposed to overlap each other on one surface of a base layer BSL. For example, a display area DA may include the pixel circuit layer PCL disposed on one surface of the base layer BSL and the display element layer DPL disposed on the pixel circuit layer PCL. However, the mutual position of the pixel circuit layer PCL and the display element layer DPL on the base layer BSL may vary according to embodiments.

Circuit elements constituting a pixel circuit PXC of a corresponding pixel PXL and lines connected thereto may be disposed in each pixel area PXA of the pixel circuit layer PCL. For example, the pixel circuit layer PCL may include a plurality of transistors T and a storage capacitor Cst which are disposed in each pixel area PXA and constitute the pixel circuit PXC of the corresponding pixel PXL. In some embodiments, the pixel circuit layer PCL may further include one or more power lines and/or signal lines connected to each pixel circuit PXC and/or light-emitting unit EMU. For example, the pixel circuit layer PCL may include a first power line PL1, a second power line PL2, and the signal lines such as scan lines SL and data lines DL.

In some embodiments, the pixel circuit layer PCL may include a plurality of insulating layers in addition to the circuit elements and the lines. For example, the pixel circuit layer PCL may include a buffer layer BFL, a gate insulating layer GI, a first interlayer insulating layer ILD1, a second interlayer insulating layer ILD2, and/or a protective layer PSV which are sequentially stacked on one surface of the base layer BSL. According to some embodiments, the protective layer PSV may be formed entirely on the display area DA to cover the circuit elements of each pixel PXL and the lines connected thereto, but the present disclosure is not limited thereto.

In some embodiments, the pixel circuit layer PCL may further include a first conductive layer including at least one light-blocking layer disposed below at least some of the transistors M (or a bottom metal layer BML of the transistor M). The first conductive layer may include at least one conductive material having conductivity, and a conductive material capable of constituting the first conductive layer is not particularly limited.

The buffer layer BFL may be disposed on one surface of the base layer BSL on which the first conductive layer is optionally formed. The buffer layer BFL may prevent or substantially prevent impurities from diffusing into each circuit element. The buffer layer BFL may be formed as a single-layer or a multi-layer and may include at least one inorganic insulating material and/or organic insulating material. For example, the buffer layer BFL may include various types of organic/inorganic insulating materials such as silicon nitride ($SiN_x$), silicon oxide ($SiO_x$), and silicon oxynitride ($SiO_xN_y$).

A semiconductor layer may be disposed on the buffer layer BFL. The semiconductor layer may include a semiconductor pattern SCP of each transistor M. The semiconductor pattern SCP may include a channel region overlapping a gate electrode GE, and first and second conductive regions (for example, source and drain regions) disposed at both sides of the channel region.

According to some embodiments, the semiconductor pattern SCP may be a semiconductor pattern made of polysilicon, amorphous silicon, or oxide semiconductor. In some embodiments, the channel region of the semiconductor pattern SCP may be a semiconductor pattern which is not doped with impurities and may be an intrinsic semiconductor, and the first and second regions of the semiconductor pattern SCP may each be a semiconductor pattern doped with impurities (e.g., set or predetermined impurities).

In some embodiments, the semiconductor patterns SCP of the transistors M constituting each pixel circuit PXC may be made of substantially the same or similar material. For example, the semiconductor patterns SCP of the transistors M may be made of the same material selected from polysilicon, amorphous silicon, and oxide semiconductor.

In an embodiment, some of the transistors M and the others thereof may include semiconductor patterns SCP made of different materials. For example, among the transistors M, the semiconductor pattern SCP of some transistors may be made of polysilicon or amorphous silicon, and the semiconductor pattern SCP of the reaming transistors M may be made of oxide semiconductor.

A gate insulating layer GI may be disposed on the semiconductor layer. The gate insulating layer GI may be formed as a single-layer or multi-layer and may include at least one inorganic insulating material and/or at least one organic insulating material. For example, the gate insulating layer GI may include various types of organic/inorganic insulating materials such as silicon nitride ($SiN_x$), silicon oxide ($SiO_x$), and silicon oxynitride ($SiO_xN_y$).

A second conductive layer may be disposed on the gate insulating layer GI. The second conductive layer may include a gate electrode GE of each transistor M. For example, the gate electrode GE may be disposed to overlap each semiconductor pattern SCP with the gate insulating layer GI interposed therebetween. In some embodiments, the second conductive layer may further include one electrode of the storage capacitor Cst and/or a line (e.g., a set or predetermined line) (for example, the scan line SL). The second conductive layer may include at least one conductive material having conductivity, and a conductive material capable of constituting the second conductive layer is not particularly limited.

A first interlayer insulating layer ILD1 may be disposed on the second conductive layer. The first interlayer insulating layer ILD1 may be formed as a single-layer or a multi-layer and may include at least one inorganic insulating material and/or at least one organic insulating material. For example, the first interlayer insulating layer ILD1 may include various types of organic/inorganic insulating materials including silicon nitride ($SiN_x$), silicon oxide ($SiO_x$), and silicon oxynitride ($SiO_xN_y$), and a material constituting the first interlayer insulating layer ILD1 is not particularly limited.

A third conductive layer may be disposed on the first interlayer insulating layer ILD1. The third conductive layer may include first and second transistor electrodes TE1 and TE2 of each transistor M. Here, the first and second transistor electrodes TE1 and TE2 may be source and drain electrodes. The first and second transistor electrodes TE1 and TE2 of the transistor M may be connected to the first and second regions of the semiconductor pattern SCP of the corresponding transistor M though corresponding through holes sequentially penetrating the first interlayer insulating layer ILD1 and the gate insulating layer GI. In some embodiments, the third conductive layer may further include one electrode of the storage capacitor Cst and/or a line (e.g., a set or predetermined line) (for example, the data line DL). The third conductive layer may include at least one conductive material to have conductivity, and a conductive material capable of constituting the third conductive layer is not particularly limited.

A second interlayer insulating layer ILD2 may be disposed on the third conductive layer. The second interlayer insulating layer ILD2 may be formed as a single-layer or a multi-layer and may include at least one inorganic insulating material and/or at least one organic insulating material. For example, the second interlayer insulating layer ILD2 may include various types of organic/inorganic insulating materials including silicon nitride ($SiN_x$), silicon oxide ($SiO_x$), and silicon oxynitride ($SiO_xN_y$), and a material constituting the second interlayer insulating layer ILD2 is not particularly limited.

A fourth conductive layer may be disposed on the second interlayer insulating layer ILD2. The fourth conductive layer is the bridge pattern BRP connecting the pixel circuit layer PCL and the display element layer DPL and/or lines (e.g., set or predetermined lines (for example, the first power line PL1 and/or the second power line PL2)). The bridge pattern BRP may be connected to a first pixel electrode (for example, the first electrode ELT1) of the light-emitting unit EMU through the first contact portion CNT1. The second power line PL2 may be connected to a last pixel electrode (for example, the fourth electrode ELT4) of the light-emitting unit EMU through the second contact portion CNT2. The fourth conductive layer may include at least one conductive material to have conductivity, and a conductive material capable of constituting the fourth conductive layer is not particularly limited.

The protective layer PSV may be disposed on the fourth conductive layer. The protective layer PSV may be formed as a single-layer or a multi-layer and may include at least one inorganic insulating material and/or at least one organic insulating material. For example, the protective layer PSV may include at least one organic insulating layer and may substantially planarize a surface of the pixel circuit layer PCL. In an embodiment, the organic insulating film may include at least one selected from an acrylic-based resin (polyacrylate-based resin), an epoxy-based resin, a phenolic-based resin, a polyamide-based resin, a polyimide-based resin, an unsaturated polyester-based resin, a poly-phenylene ether-based resin, a poly-phenylene sulfide-based resin, and a benzocyclobutene resin, but the present disclosure is not limited thereto.

In an embodiment of the present disclosure, the protective layer PSV may be etched by at least a thickness thereof in at least one light-emitting element array region AR in which light-emitting elements LD are arranged, thereby forming the cavity CVT below the light-emitting elements LD. For example, the protective layer PSV may be etched by a first width W1 below the light-emitting elements LD to form the cavity CVT below the light-emitting elements LD.

The display element layer DPL may be disposed on the protective layer PSV. The display element layer DPL may include the light-emitting unit EMU of each pixel PXL. The light-emitting unit EMU may be connected to the pixel circuit PXC of the corresponding pixel PXL and/or a power line (e.g, a set or predetermined power line (for example, the second power line PL2)) through one or more contact portions (for example, the first contact portion CNT1 and the second contact portion CNT2) passing through the protective layer PSV. Each contact portion may be formed in the form of at least one contact hole or at least one via hole, but the present disclosure is not limited thereto.

For example, pixel electrodes ELT constituting the light-emitting unit EMU of the corresponding pixel PXL, the light-emitting elements LD, and the contact electrodes CNE may be disposed in each pixel area PXA of the display element layer DPL. For example, the display element layer DPL may include the plurality of pixel electrodes ELT (for example, the first to fourth electrodes ELT1 to ELT1), the plurality of light-emitting elements LD connected in series, parallel, or series-parallel between the pixel electrodes ELT, and the plurality of contact electrodes CNE connecting the pixel electrodes ELT and the light-emitting elements LD, which are disposed in the light-emitting element array regions AR of each pixel PXL.

In each of FIGS. 9A-9C, one light-emitting device LD is illustrated but as in the embodiments of FIGS. 7 and 8, each pixel PXL may include the plurality of light-emitting elements LD connected in a forward direction between the first pixel electrode and the last pixel electrode (for example, the first electrode ELT1 and the fourth electrode ELT4). Accordingly, in describing embodiments of FIGS. 9A-9C and other embodiments to be described below, it is assumed that each pixel PXL includes a plurality of light-emitting elements LD.

In some embodiments, the display element layer DPL may further include at least one conductive layer and/or at least one insulating layer. For example, the display element layer DPL may further include a first insulating layer INS1 disposed on the pixel electrodes ELT and may optionally further include an overcoat layer OC entirely covering an upper portion of the light-emitting unit EMU, on which the pixel electrodes ELT, the light-emitting elements LD, the contact electrodes CNE, and the like are formed.

The pixel electrodes ELT may be disposed to be spaced from each other in an emission area EA. As an example, in each light-emitting element arrangement region AR, the pair of adjacent pixel electrodes ELT (for example, the first electrode ELT1 and the second electrode ELT2, or the third electrode ELT3 and the fourth electrode ELT4) may be opposite to each other on the protective layer PSV.

According to some embodiments, each pixel electrode ELT may have a pattern separated for each pixel PXL or a pattern commonly connected to the plurality of pixels PXL. For example, each of the first to fourth electrodes ELT1 to ELT4 may have an independent pattern in which both ends thereof are disconnected in a peripheral area of the corresponding pixel area PXA and/or in an area between adjacent pixel areas PXA. In an embodiment, at least one pixel electrode (for example, the first electrode ELT1) may have an independent pattern disconnected in the peripheral area of the corresponding pixel area PXA and/or in the area between adjacent pixel areas PXA. At least another pixel electrode (for example, the fourth electrode ELT4) has one end which may extend in a first direction DR1 or a second direction DR2 and may be integrally connected to a pixel electrode (e.g., a set or predetermined pixel electrode) of another adjacent pixel PXL (for example, the fourth electrode ELT4 of the adjacent pixel PXL) in the first direction DR1 or the second direction DR2.

The pixel electrodes ELT may include at least one conductive material to have conductivity. As an example, the pixel electrodes ELT may include at least one metal selected from various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu), or an ally including the at least one metal, or may include at least one conductive material selected from a conductive oxide such as indium tin oxide (ITO), indium zinc oxide (IZO), indium tin zinc oxide (ITZO), zinc oxide (ZnO), aluminum-doped zinc oxide (AZO), gallium-doped zinc oxide (GZO), zinc tin oxide (ZTO), gallium tin oxide (ZTO), or fluorine-doped tin oxide (FTO), and a conductive polymer such as poly(3,4-ethylenedioxythiophene) (PEDOT), but the present disclosure is not limited thereto. For example, the pixel electrodes ELT may include other conductive materials such as carbon nanotubes or graphene. That is, the pixel electrodes ELT may include at least one conductive material selected from various conductive materials to have conductivity, and a material constituting the pixel electrodes ELT is not particularly limited. In some embodiments, the pixel electrodes ELT may include the same conductive material or different conductive materials.

Furthermore, each of the pixel electrodes ELT may be formed as a single-layer or a multi-layer. As an example, each of the pixel electrodes ELT may include a reflective electrode layer including a reflective conductive material. In some embodiments, each of the pixel electrodes ELT may optionally further include at least one transparent electrode layer disposed above and/or below the reflective electrode layer and at least one conductive capping layer covering upper portions of the reflective electrode layer and/or the transparent electrode layer.

The first insulating layer INS1 is disposed on one surface of the base layer BSL including the pixel electrodes ELT. According to some embodiments, the first insulating layer INS1 may be first formed to entirely cover the first and second electrodes ELT1 and ELT2. After the light-emitting elements LD are supplied and aligned on the first insulating layer INS1, the first insulating layer INS1 is partially opened to expose one area of the pixel electrodes ELT, or one or more contact holes (for example, first and second contact holes CH1 and CH2) may be formed in the first insulating layer INS1, thereby connecting the pixel electrodes ELT to the contact electrodes CNE. Because the pixel electrodes ELT are formed and then covered by the first insulating layer INS1 or the like, it is possible to prevent or reduce damage to the pixel electrodes ELT in a subsequent process.

The first insulating layer INS1 may be formed as a single-layer or a multi-layer and may include at least one inorganic insulating material and/or at least one organic insulating material. In an embodiment, the first insulating layer INS1 may include at least one inorganic insulating film including at least one inorganic insulating material such as silicon nitride ($SiN_x$), silicon oxide ($SiO_x$), or aluminum oxide ($AlO_x$).

In an embodiment of the present disclosure, the first insulating layer INS1 may be opened by a second width W2 in at least one light-emitting element array region AR in which the light-emitting elements LD are arranged, thereby forming the cavity CVT below the light-emitting elements LD. According to some embodiments, the second width W2 may be less than a length of the light-emitting elements LD (see L of FIG. 4A). As an example, the second width W2 may be less than the length L of the light-emitting elements LD by 0.5 μm or more. Accordingly, the light-emitting elements LD may be stably arranged on the cavity CVT.

In an embodiment of the present disclosure, the cavity CVT may have a reversed tapered shape. For example, the cavity CVT may have the first width W1 in a lower area thereof corresponding to the protective layer PSV and the second width W2 less than the first width W1 in an upper area thereof corresponding to the first insulating layer INS1. In this case, in a process of forming the contact electrodes CNE, which is performed after the formation of the cavity CVT, a conductive layer may be automatically disconnected (or open circuited) during the process of forming the conductive layer to form the contact electrodes CNE. Accordingly, it is possible to effectively prevent short circuit defects from occurring between a first end EP1 and a second end EP2 of the light-emitting elements LD.

The light-emitting elements LD may be supplied and aligned in each emission area EA (or each light-emitting element array region AR) in which the first insulating layer INS1 and the like are formed. In an embodiment, before the light-emitting elements LD are supplied, a dam structure such as a bank may be formed in the display area DA so as to surround each emission area EA (or each light-emitting element array region AR). Thereafter, the plurality of light-emitting elements LD may be supplied to the emission area EA of each pixel PXL through an inkjet method, a slit coating method, or other various methods, and an alignment signal (e.g., a set or predetermined alignment signal) (or alignment voltage) may be applied to each of the pixel electrodes ELT (e.g., alignment lines before being divided into the pixel electrodes ELT), thereby aligning the light-emitting elements LD between the pixel electrodes ELT.

In an embodiment, the light-emitting elements LD may be disposed on the first insulating layer INS1 so as to be arranged on an area between a pair of adjacent pixel electrodes ELT disposed in each emission area EA (or each light-emitting element arrangement region AR). In some embodiments, the light-emitting elements LD may be arranged so as to overlap or not overlap at least one of the pair of pixel electrodes ELT.

For example, at least one first light-emitting element LD1 may be disposed on the first insulating layer INS1 on an area between the first electrode ELT1 and the second electrode ELT2 such that the first end EP1 and the second end EP2 of the first light-emitting element LD1 face the first electrode ELT1 and the second electrode ELT2, respectively. The first end EP1 of the first light-emitting element LD1 may or may not overlap the first electrode ELT1, and the second end EP2 of the first light-emitting element LD1 may or may not overlap the second electrode ELT2.

Similarly, at least one second light-emitting element LD2 may be disposed on the first insulating layer INS1 on an area between the third electrode ELT2 and the fourth electrode ELT4 such that the first end EP1 and the second end EP2 of the second light-emitting element LD2 face the third electrode ELT3 and the fourth electrode ELT4, respectively. The first end EP1 of the second light-emitting element LD2 may or may not overlap the third electrode ELT3, and the second end EP2 of the second light-emitting element LD2 may or many not overlap the fourth electrode ELT4.

In an embodiment of the present disclosure, the light-emitting elements LD may be disposed on the first insulating layer INS1 so as to be positioned on the cavity CVT. For example, a central area of the first light-emitting elements LD1 may be positioned on the cavity CVT, and the first ends EP1 and the second ends EP2 of the first light-emitting elements LD1 may be disposed on the first insulating layer INS1 at both sides of the cavity CVT.

In FIGS. 9A-9C, a cross section of the pixel PXL is illustrated based on one first light-emitting element LD, but the cavity CVT may also be formed below the second light-emitting element LD2. The second light-emitting elements LD2 may be disposed on the cavity CVT in substantially the same structure and/or manner as in the first light-emitting elements LD1.

The contact electrodes CNE may be disposed, respectively, on the first ends EP1 and the second ends EP2 of the light-emitting elements LD. For example, a first contact electrode CNE1 and a second contact electrode CNE2 may be disposed on the first ends EP1 and the second ends EP2 of the first light-emitting elements LD1 and on the first and second electrodes ELT1 and ELT2. The first contact electrode CNE1 connects the first ends EP1 of the first light-emitting elements LD1 to the first electrode ELT1 through the first contact hole CH1. The second contact electrode CNE2 connects the second ends EP2 of the first light-emitting elements LD1 to the second electrode ELT2 through the second contact hole CH2.

Similarly, the second contact electrode CNE2 and a third contact electrode CNE3 may be disposed on the first ends EP1 and the second ends EP2 of the second light-emitting elements LD2 (e.g., and on the third and fourth electrodes ELT3 and ELT4), respectively. The second contact electrode CNE2 connects the first ends EP1 of the second light-emitting elements LD2 to the third electrode ELT3 through a third contact hole CH3. The third contact electrode CNE3 connects the second ends EP2 of the second light-emitting elements LD2 to the fourth electrode ELT4 through a fourth contact hole CH4.

The contact electrodes CNE may be made of various transparent conductive materials. As an example, the contact electrodes CNE may include at least one selected from various transparent conductive materials such as indium tin oxide (ITO), indium zinc oxide (IZO), indium tin zinc oxide (ITZO), zinc oxide (ZnO), indium oxide (In2O3), aluminum-doped zinc oxide (AZO), gallium-doped zinc oxide (GZO), zinc tin oxide (ZTO), gallium tin oxide (GTO), and fluorine-doped tin oxide (FTO). Accordingly, light emitted from the light-emitting elements LD through the respective first and second ends EP1 and EP2 of the light emitting elements LD may pass through the contact electrodes CNE to be emitted to the outside of the pixel PXL.

In an embodiment of the present disclosure, the contact electrodes CNE may be disposed at the same layer and may be formed at the same time (e.g., concurrently or simultaneously). For example, the contact electrodes CNE may be formed from one conductive film and may be patterned at the same time (e.g., concurrently or simultaneously). As an example, a pair of contact electrodes CNE (for example, the first and second contact electrodes CNE1 and CNE2 or the second and third contact electrodes CNE2 and CNE3) disposed in each light-emitting element array region AR may be separated through a single mask process so as to be spaced from each other on the cavity CVT formed in the light-emitting element array region AR. The pair of contact electrodes CNE may be stably disconnected (or opened) by the cavity CVT and may be spaced from each other by (i.e., by a distance corresponding to) the second width W2 in an upper area of the cavity CVT.

When the contact electrodes CNE are patterned at the same time (e.g., concurrently or simultaneously) as described above, it is possible to simplify a manufacturing process of the pixel PXL and the display panel DP including the same. In some embodiments, when the cavity CVT is formed below the light-emitting elements LD, a conductive film may be stably disconnected below the light-emitting elements LD in a process of patterning and or forming the conductive film for forming the contact electrodes CNE. Accordingly, it is possible to secure electrical stability and prevent short circuit defects between the first ends EP1 and the second ends EP2 of the light-emitting elements LD.

The overcoat layer OC may be disposed on the contact electrodes CNE. For example, the overcoat layer OC may be entirely formed on the display area DA so as to cover the pixel electrodes ELT, the first insulating layer INS1, the light-emitting elements LD, and the contact electrodes CNE. The overcoat layer OC may include at least one layer of an inorganic film and/or an organic film. In some embodiments, the overcoat layer OC may be made of a low refractive material in order to increase light efficiency of the pixels PXL.

In an embodiment, the overcoat layer OC may include a thin film encapsulation layer having a multi-layered structure. For example, the overcoat layer OC may be formed as a thin film encapsulation layer having a multi-layered structure, which includes at least two inorganic insulating layers and at least one organic insulating layer interposed between the at least two inorganic insulating layers. However, the structural material and/or structure of the overcoat layer OC may be variously changed.

Referring to FIG. 9B, when a conductive material introduced into the cavity CVT is not completely removed in a process of forming the conductive film for forming the contact electrodes CNE, the pixel PXL may include the residue RSD of the conductive film remaining on sidewalls or inside the cavity CVT. The residue RSD of the conductive film may include the same material as the contact electrodes CNE.

However, when the residues RSD of the conductive film remains below one of a pair of pixel electrodes ELT (e.g., only below one of a pair of pixel electrodes ELT) or even when the residues RSD remains below the pair of pixel electrodes ELT, the residues RSD of the conductive film positioned below the pair of pixel electrodes ELT may be separated from each other. For example, the conductive film for forming the contact electrodes CNE may be completely removed from a bottom surface (e.g., a central area) of the cavity CVT, and thus, the residues RSD of the conductive film positioned below the pair of pixel electrodes ELT may be separated from each other. Therefore, the residue RSD of the conductive film may not cause short circuit defects.

Referring to FIG. 9C, the pixel PXL may further include the insulating patterns INP separately disposed on the contact electrodes CNE. For example, the pixel PXL may further include a first insulating pattern INP1 disposed on the first contact electrode CNE1 and a second insulating pattern INP2 disposed on the second contact electrode CNE2 and separated from the first insulating pattern INP1. In some embodiments, when the pixel PXL includes the third contact electrode CNE3, the pixel PXL may further include an insulating pattern disposed on the third contact electrode CNE3.

In an embodiment, the insulating patterns INP may be formed using a photo mask used in a process of patterning the conductive film for forming the contact electrodes CNE. For example, after the contact electrodes CNE are formed, the photomask may not be removed and may be cured to form the insulating patterns INP stably fixing the light-emitting elements LD and the contact electrodes CNE. In this case, the insulating patterns INP may include the same photoresist material. In some embodiments, an area in which each insulating pattern INP is formed may match an area in which each contact electrode CNE is formed. For example, the first contact electrode CNE1 may be positioned below the first insulating pattern INP1 (e.g., only below the first insulating pattern INP1), and the second contact electrode CNE2 may be positioned below the second insulating pattern INP2 (e.g., only below the second insulating pattern INP2).

In the embodiments of FIGS. 9A-9C, the pixel PXL includes at least one cavity CVT positioned below the light-emitting elements LD. As an example, the pixel PXL may include at least one cavity CVT disposed in each light-emitting element array region AR.

Each cavity CVT may be formed in the protective layer PSV and the first insulating layer INS1 so as to correspond to an area between the pair of pixel electrodes ELT opposite to each other in the light-emitting element array region AR below one or more light-emitting elements LD arranged in each light-emitting element array region AR (for example, the plurality of first light-emitting elements LD1 or the plurality of second light-emitting elements LD2). The cavity CVT may have the first width W1 corresponding to an etch width of the protective layer PSV in the lower area thereof corresponding to the protective layer PSV and a second width W2 corresponding to an etch width of the first insulating layer INS1 in the upper area thereof corresponding to the first insulating layer INS1. In this case, the second width W2 may be less than the length L of each light-emitting element LD. Accordingly, the light-emitting elements LD may be arranged between the pair of pixel electrodes ELT on the cavity CVT.

According to the described embodiments of the present disclosure, in processes of forming and etching the conductive film for forming the contact electrodes CNE, the contact electrodes CNE may be automatically and/or effectively disconnected by the cavity CVT. Accordingly, the contact electrodes CNE may be formed at the same time using one photo mask, and also, it is possible to prevent short circuit defects from occurring between the first ends EP1 and the second ends EP2 of the light-emitting elements LD.

In an embodiment, the second width W2 may be less than the first width W1, and thus the cavity CVT may have a reversed tapered shape. In this case, the conductive film may be automatically disconnected by the cavity CVT during the process of forming the conductive film to form the contact electrodes CNE (for example, deposition). Accordingly, it is possible to more effectively prevent short circuit defects from occurring between the first ends EP1 and the second ends EP2 of the light-emitting elements LD.

Figure 10:
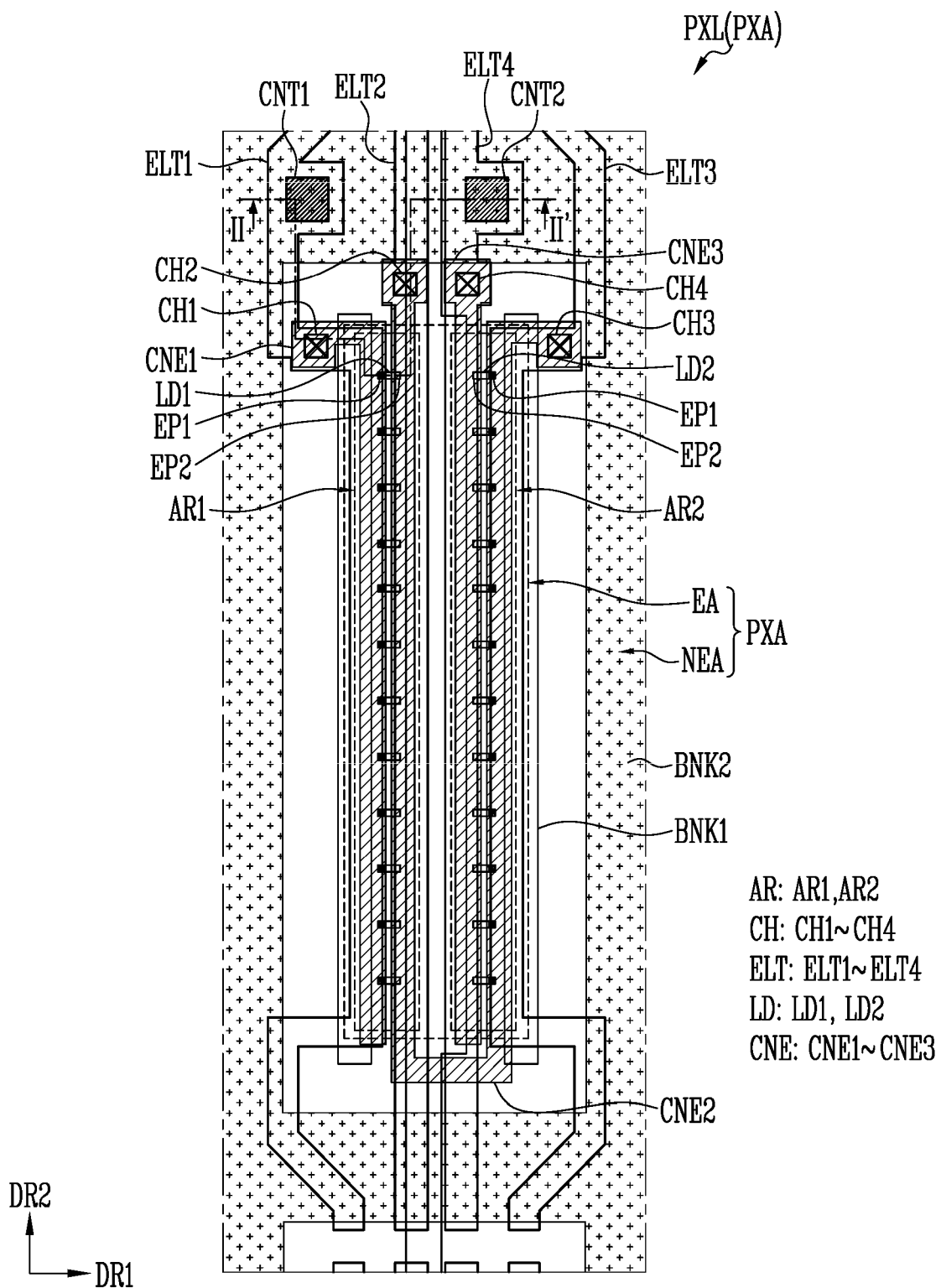
FIG. 10 is a plan view illustrating a pixel according to an embodiment of the present disclosure.

FIG. 10 is a plan view illustrating a pixel PXL according to an embodiment of the present disclosure. For example, FIG. 10 illustrates a modified embodiment of the embodiment of FIG. 7.

Figure 11A:
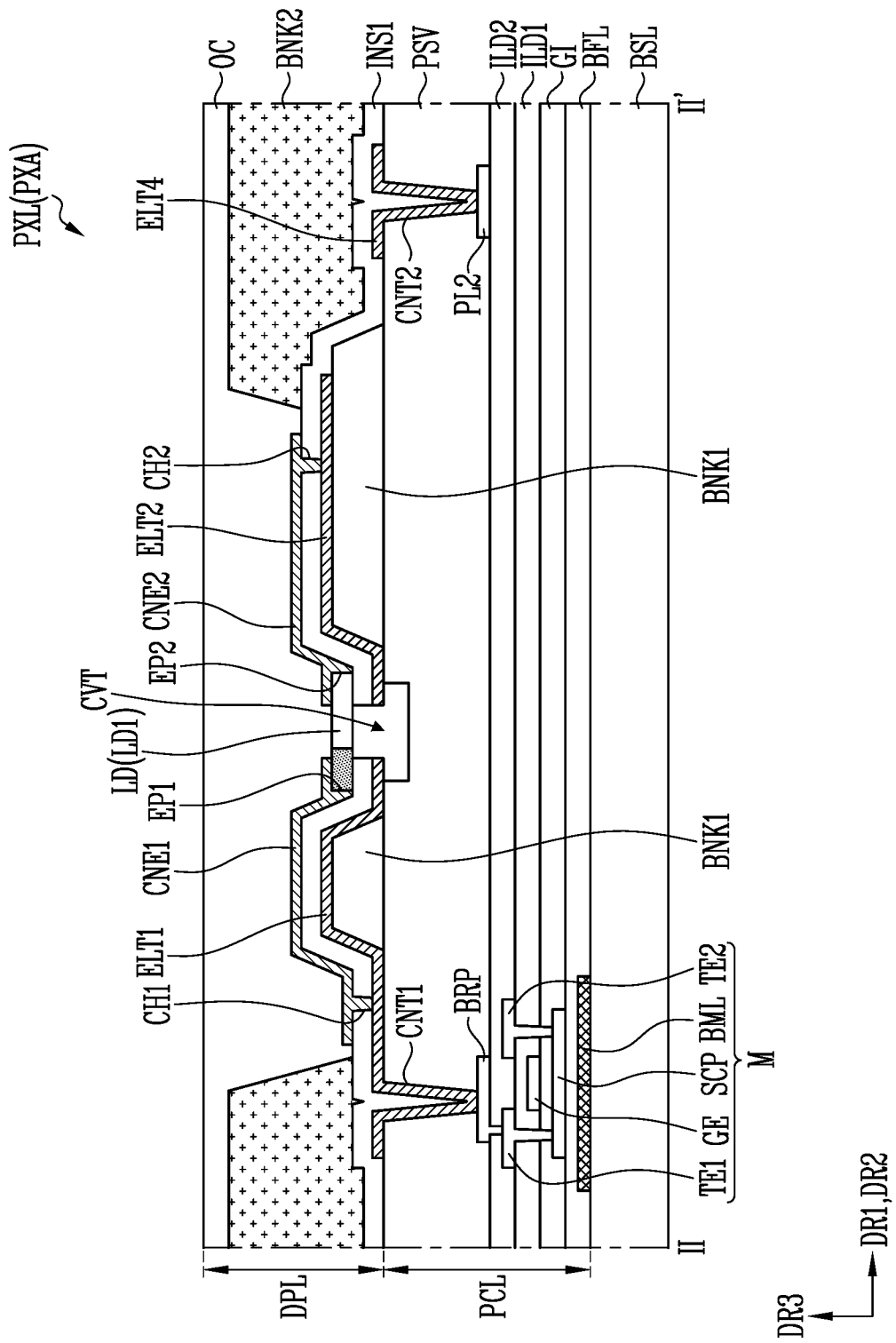
FIGS. 11A-11C are cross-sectional views illustrating pixels according to an embodiment of the present disclosure.
Figure 11B:
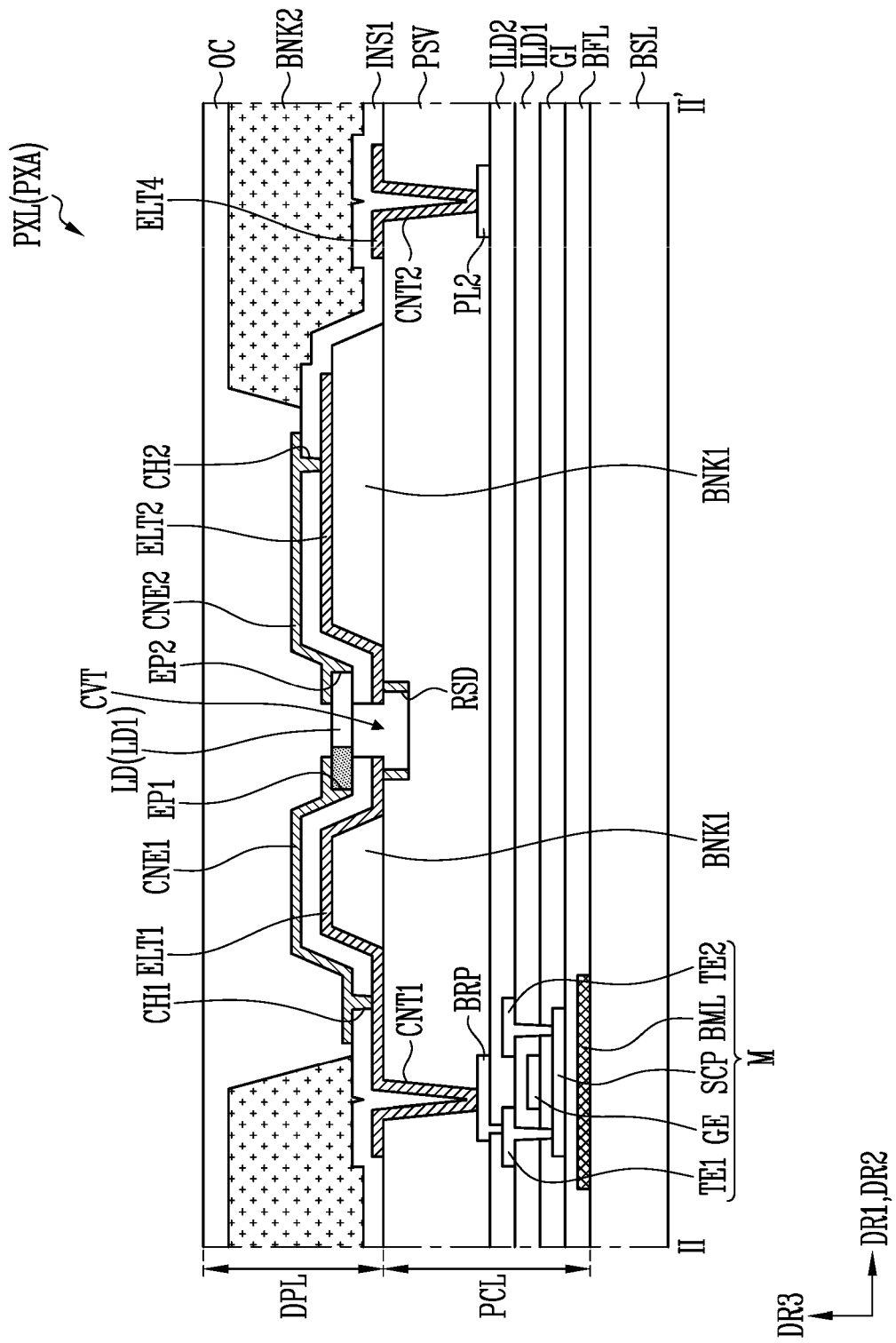
Figure 11C:
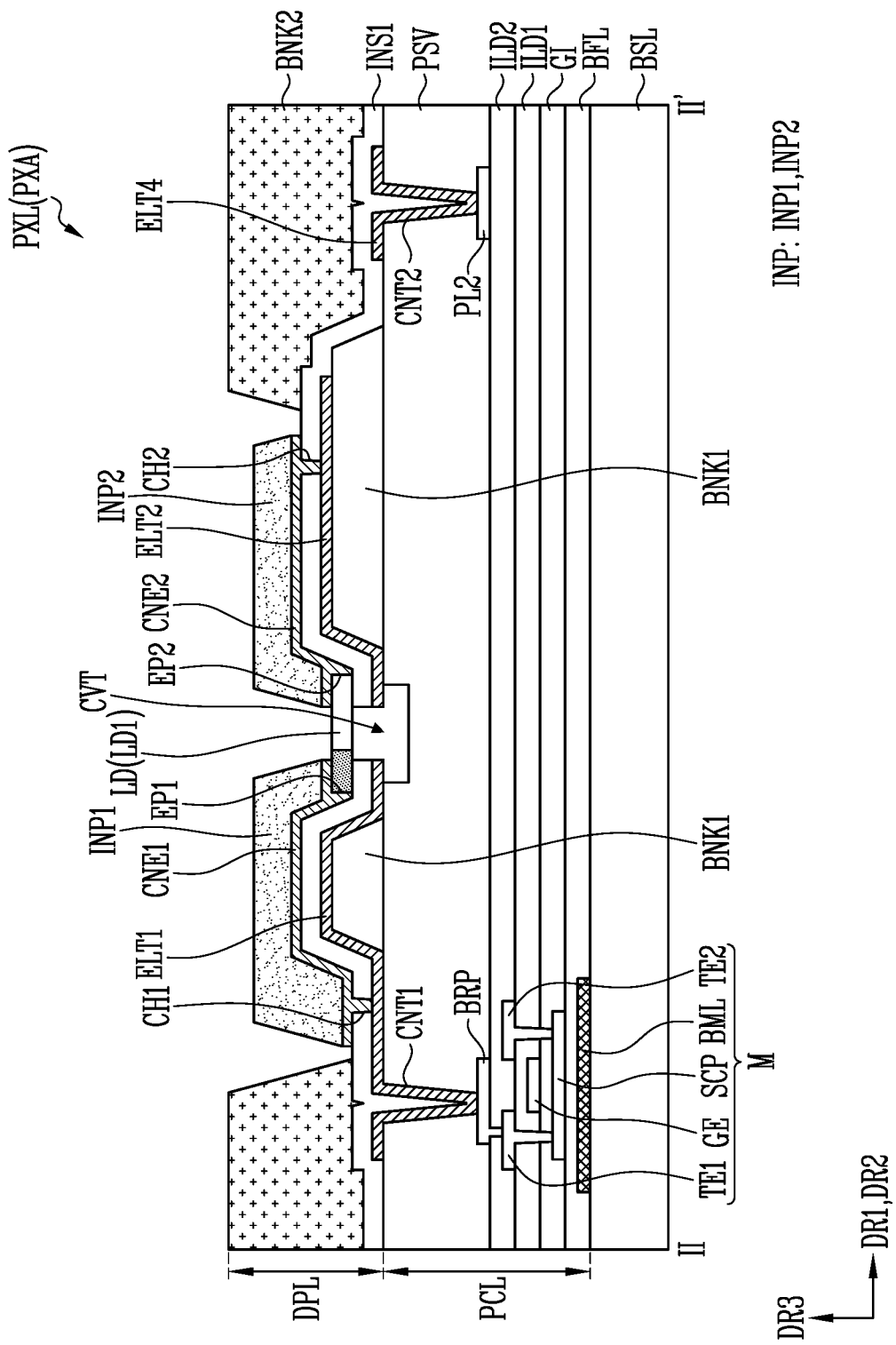
Figure 12A:
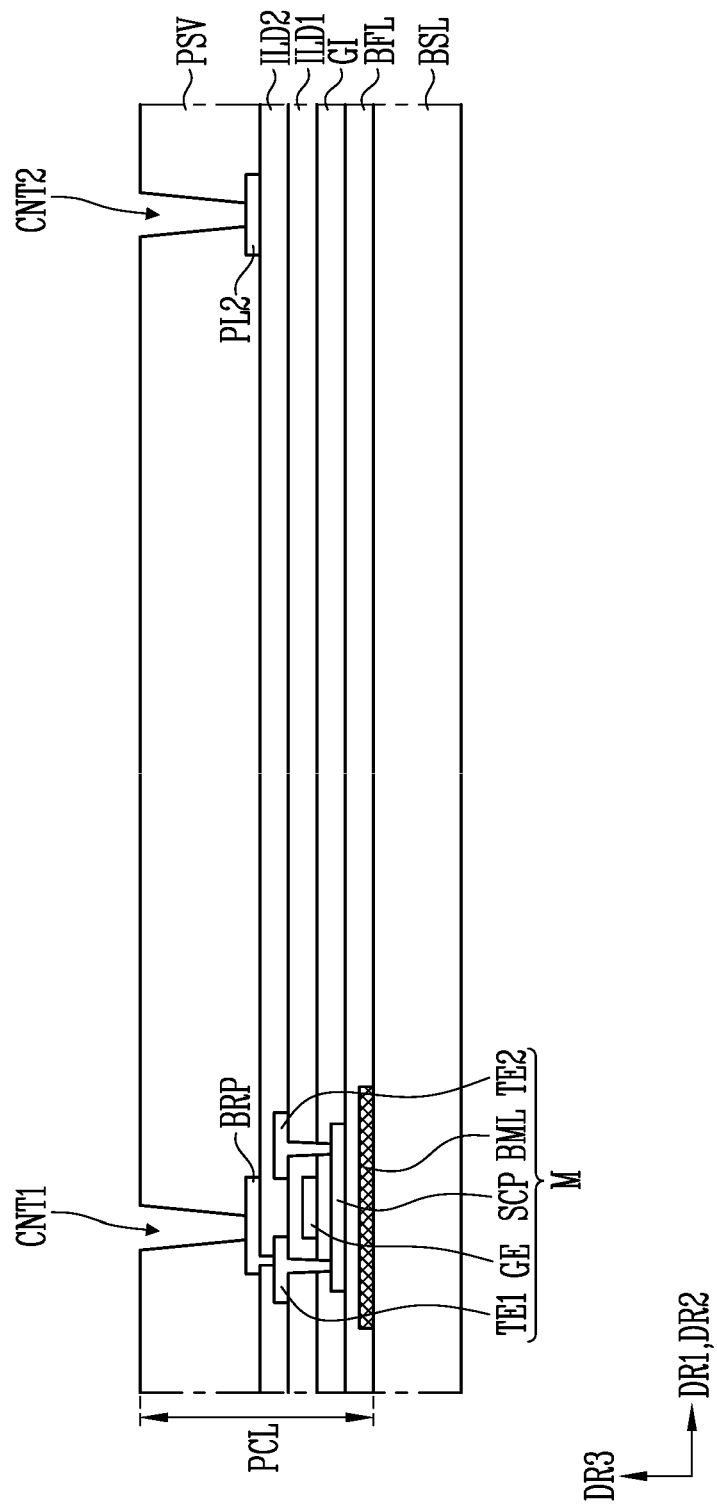
FIGS. 12A-12L are cross-sectional views sequentially illustrating a method of manufacturing a display device according to an embodiment of the present disclosure.
Figure 12B:
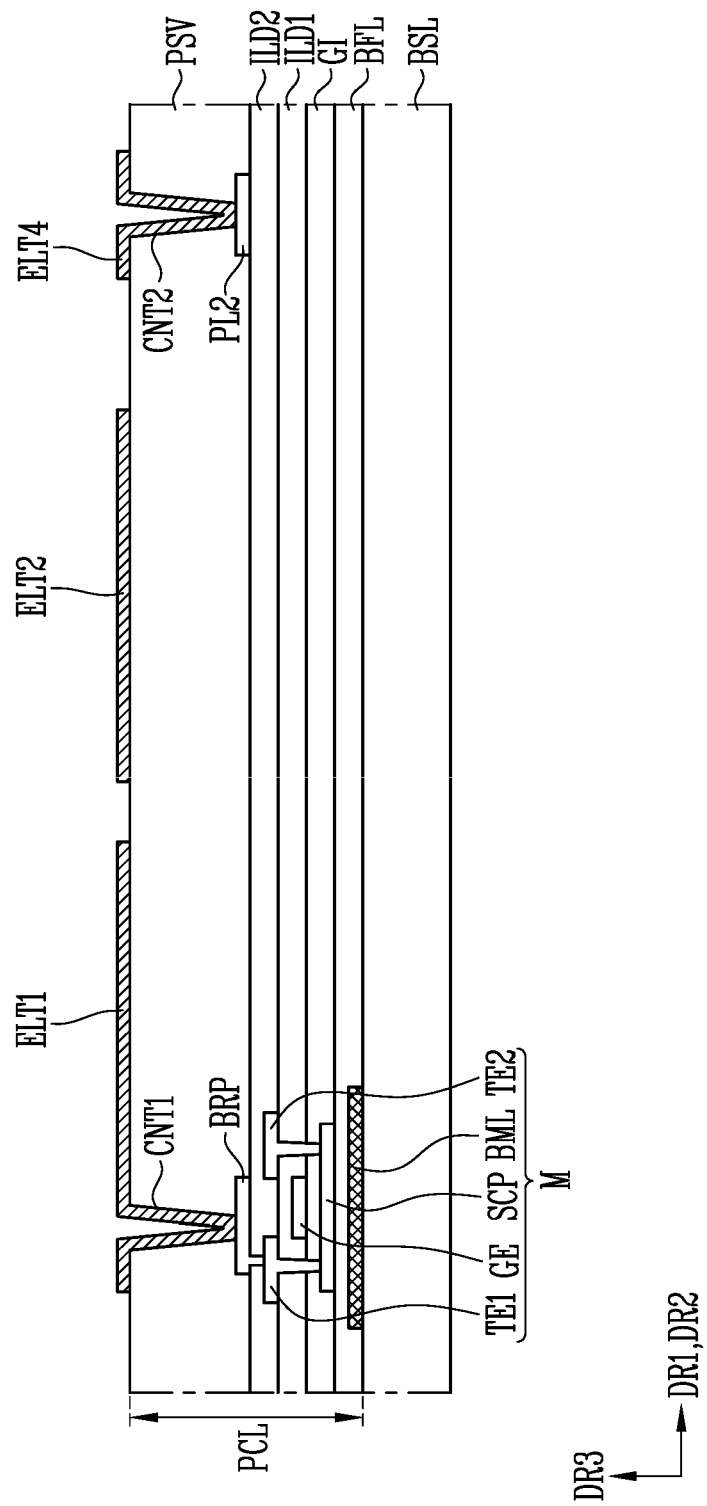
Figure 12C:
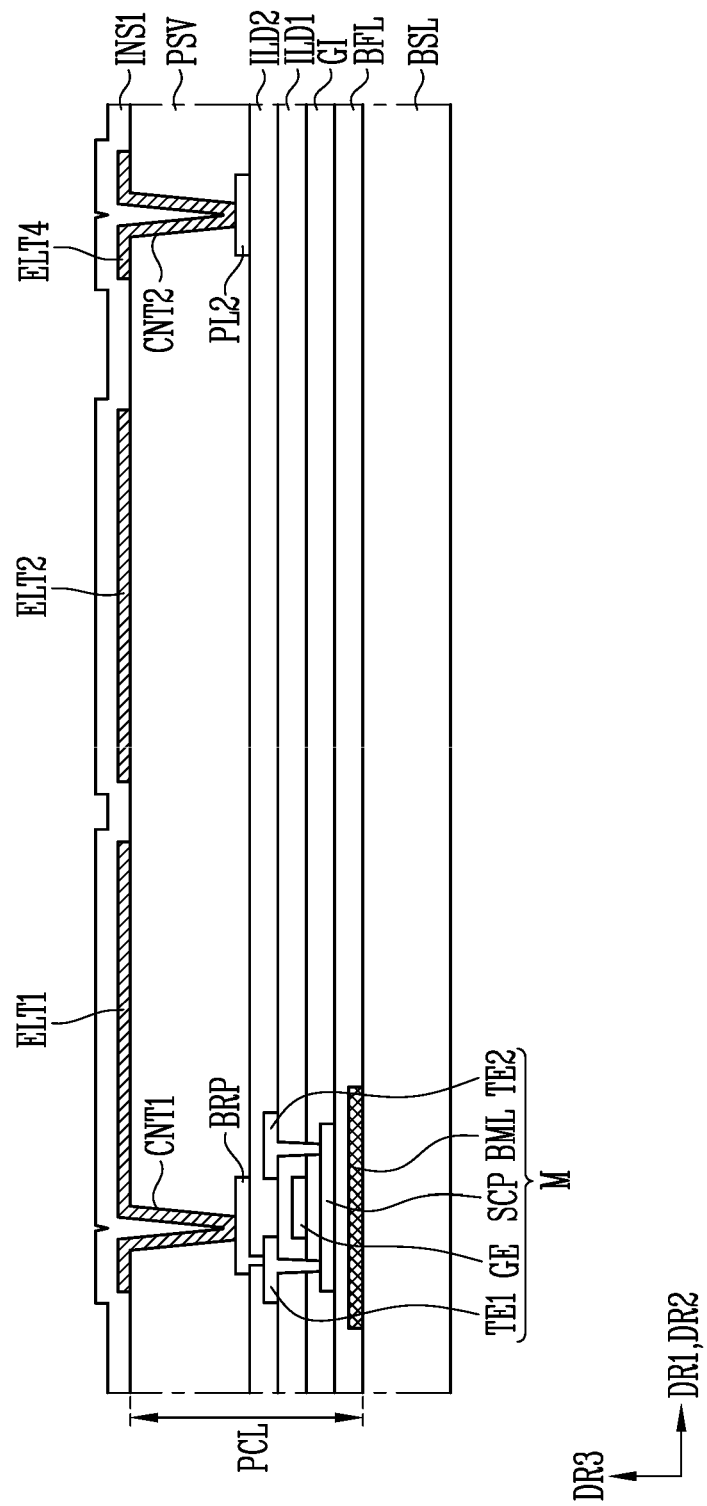
Figure 12D:
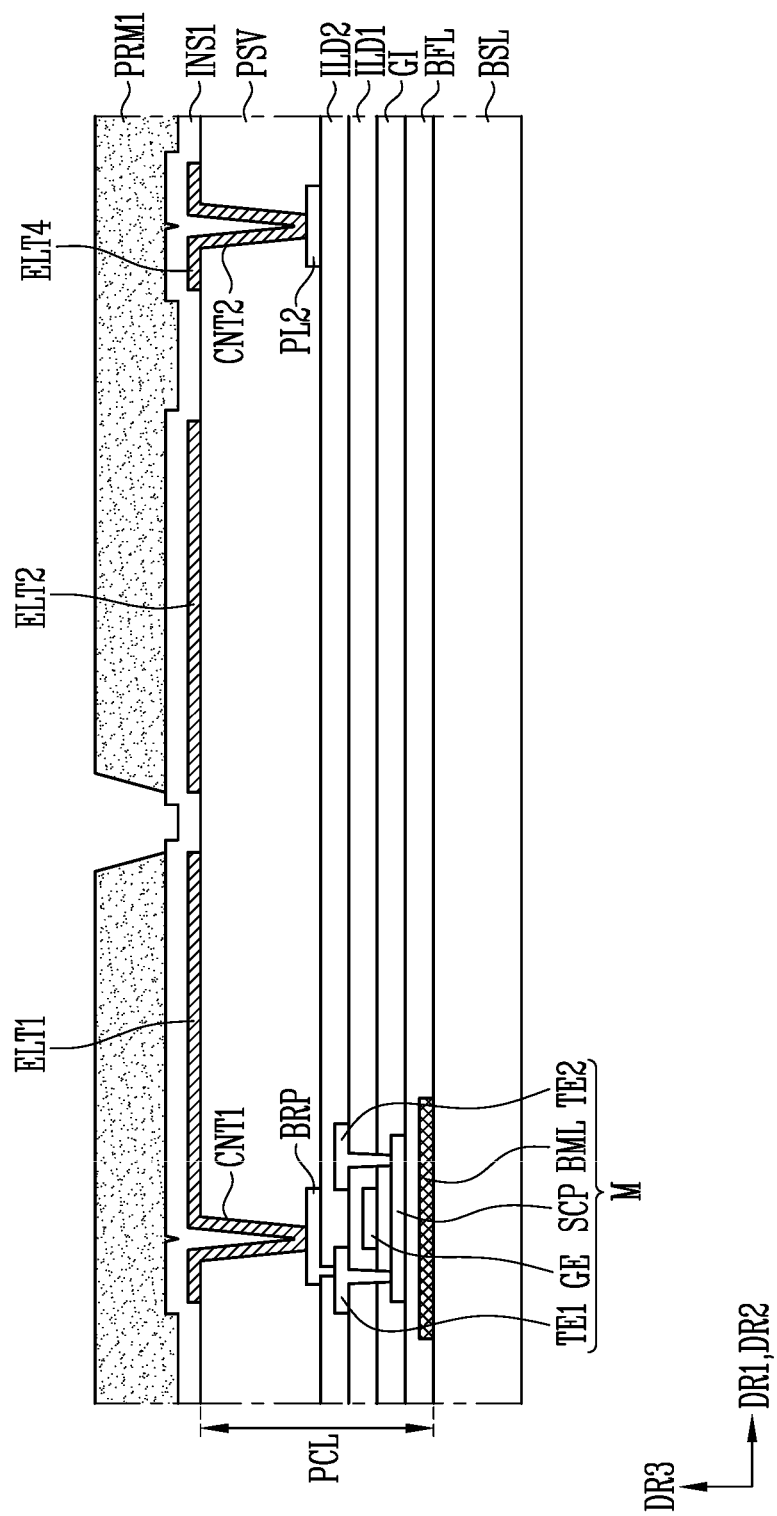
Figure 12E:
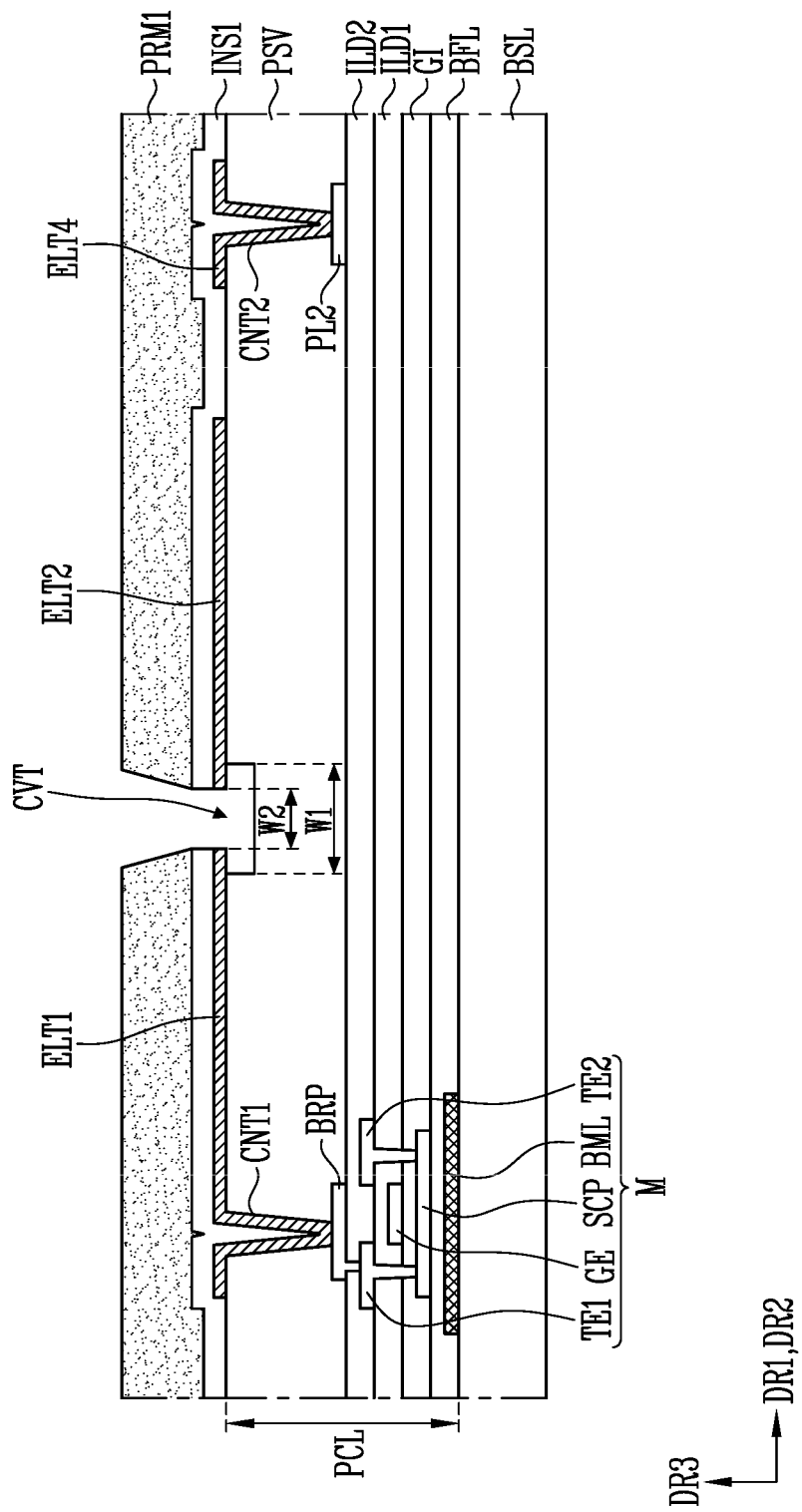
Figure 12F:
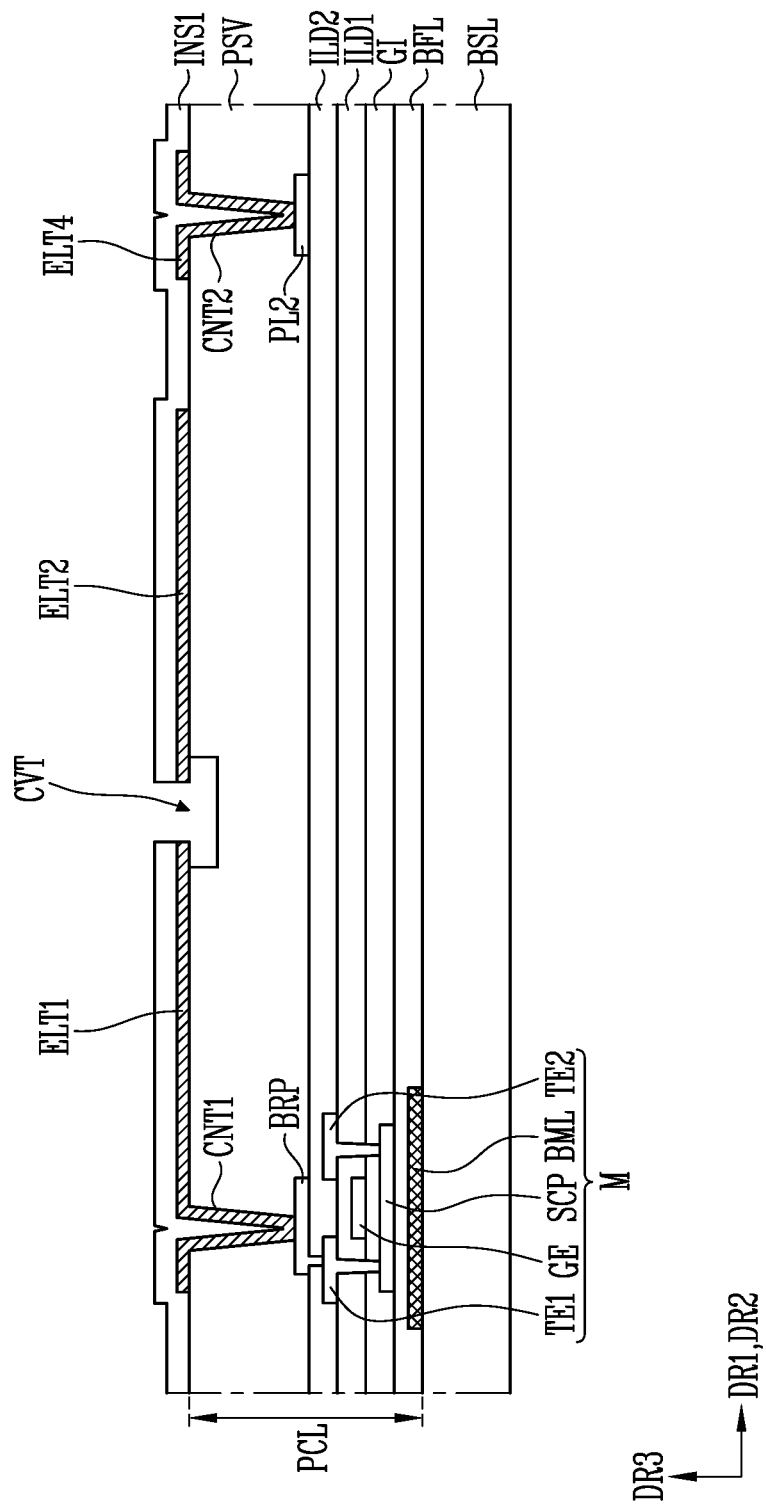
Figure 12G:
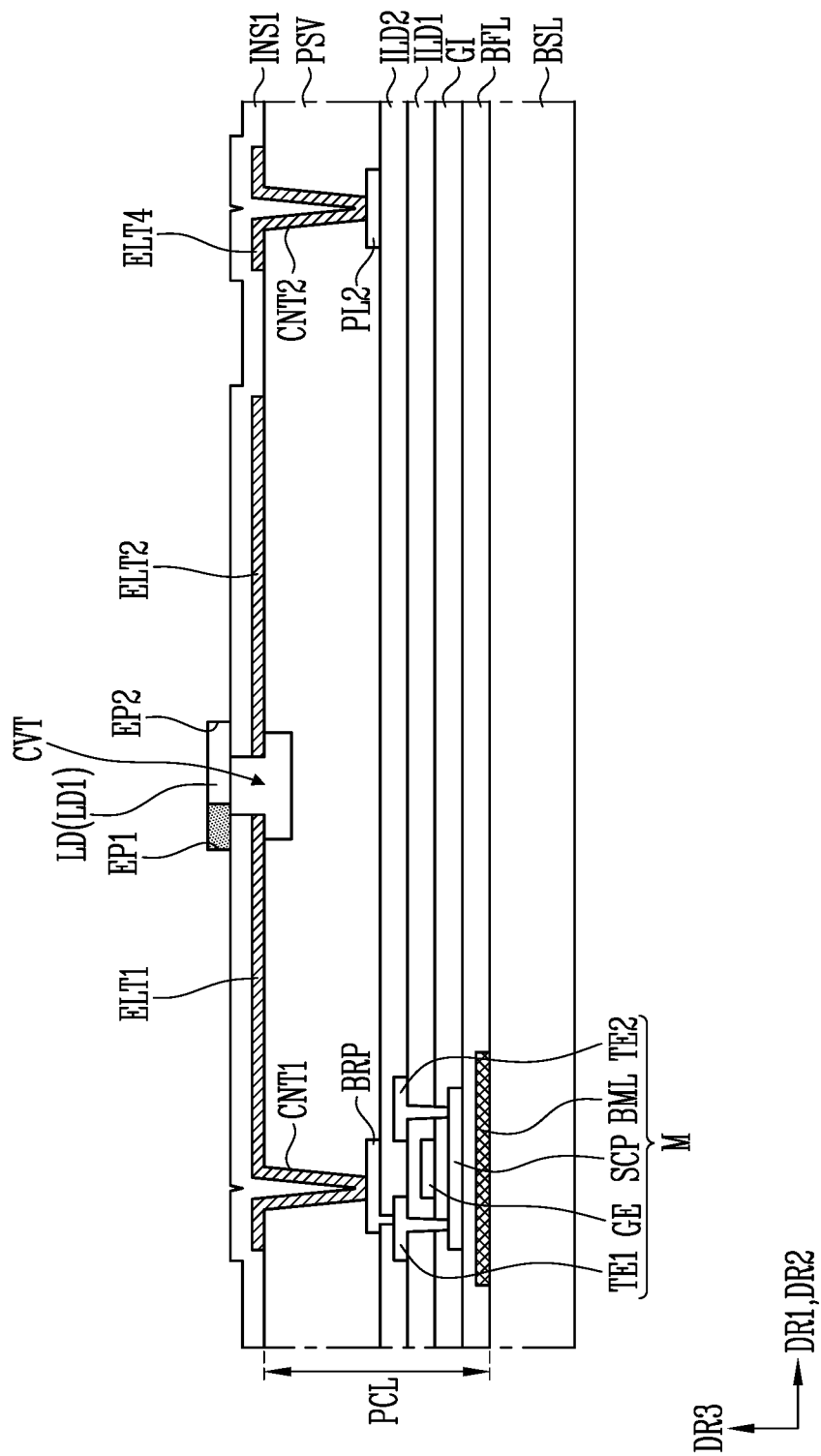
Figure 12H:
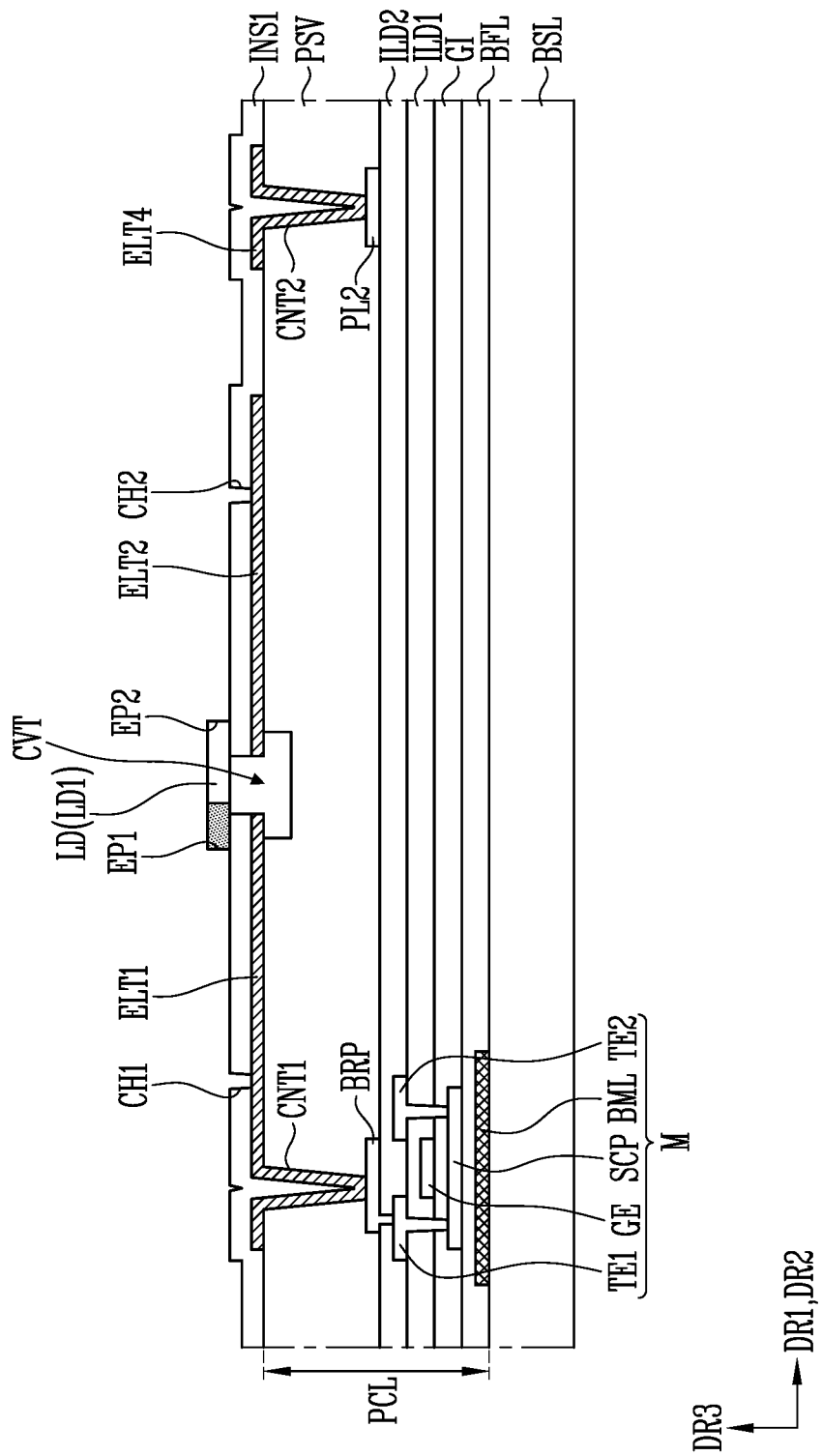
Figure 12I:
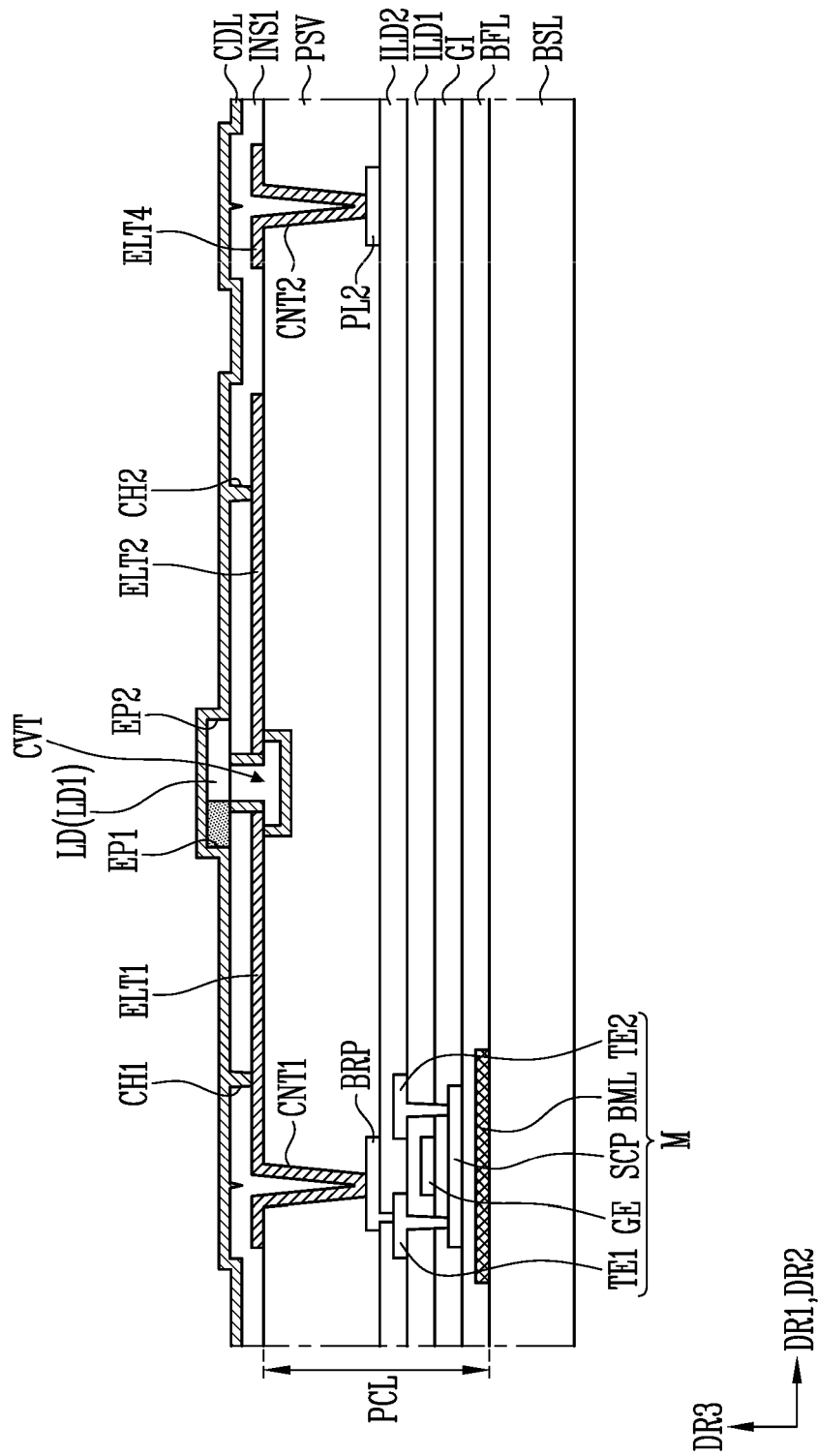
Figure 12J:
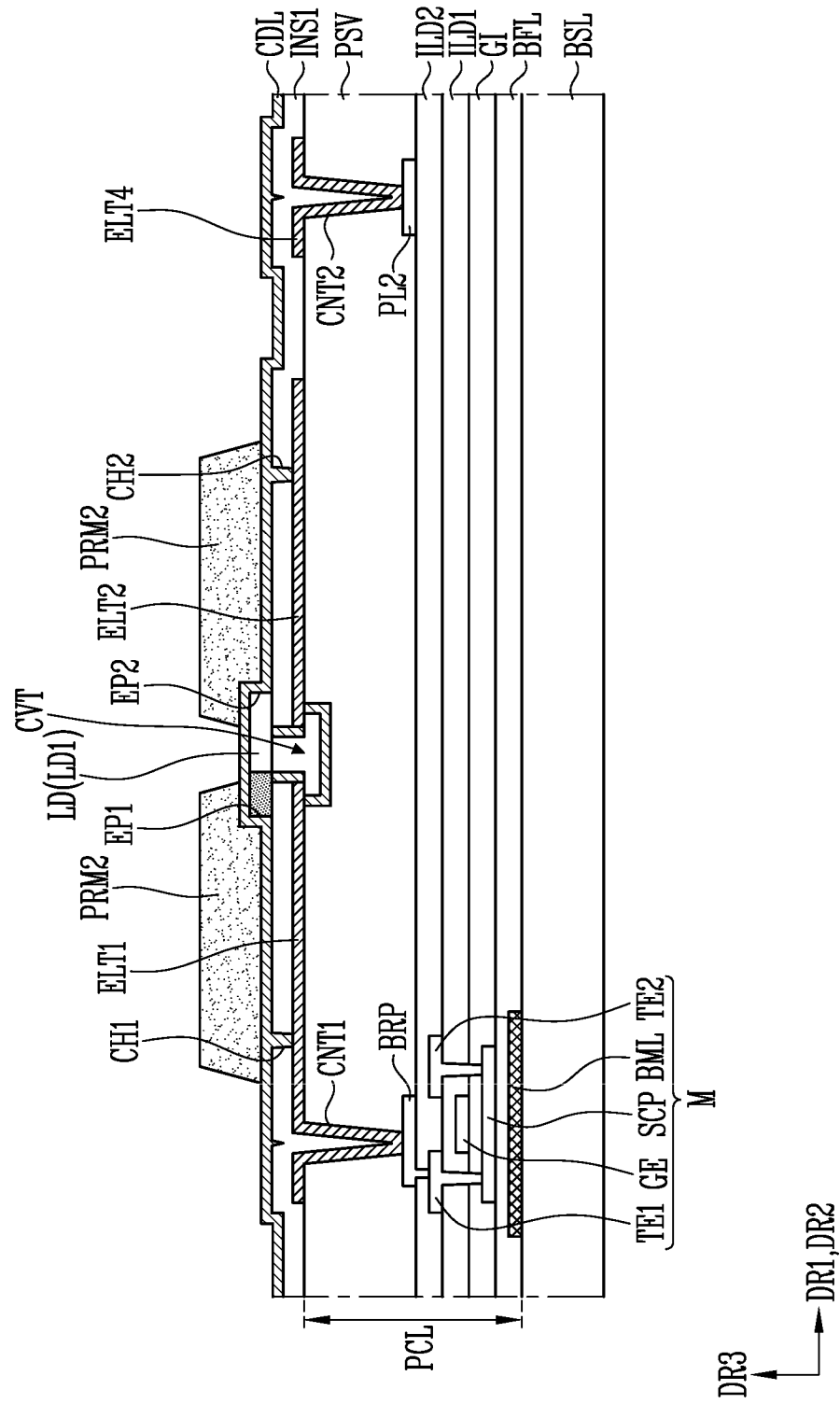
Figure 12K:
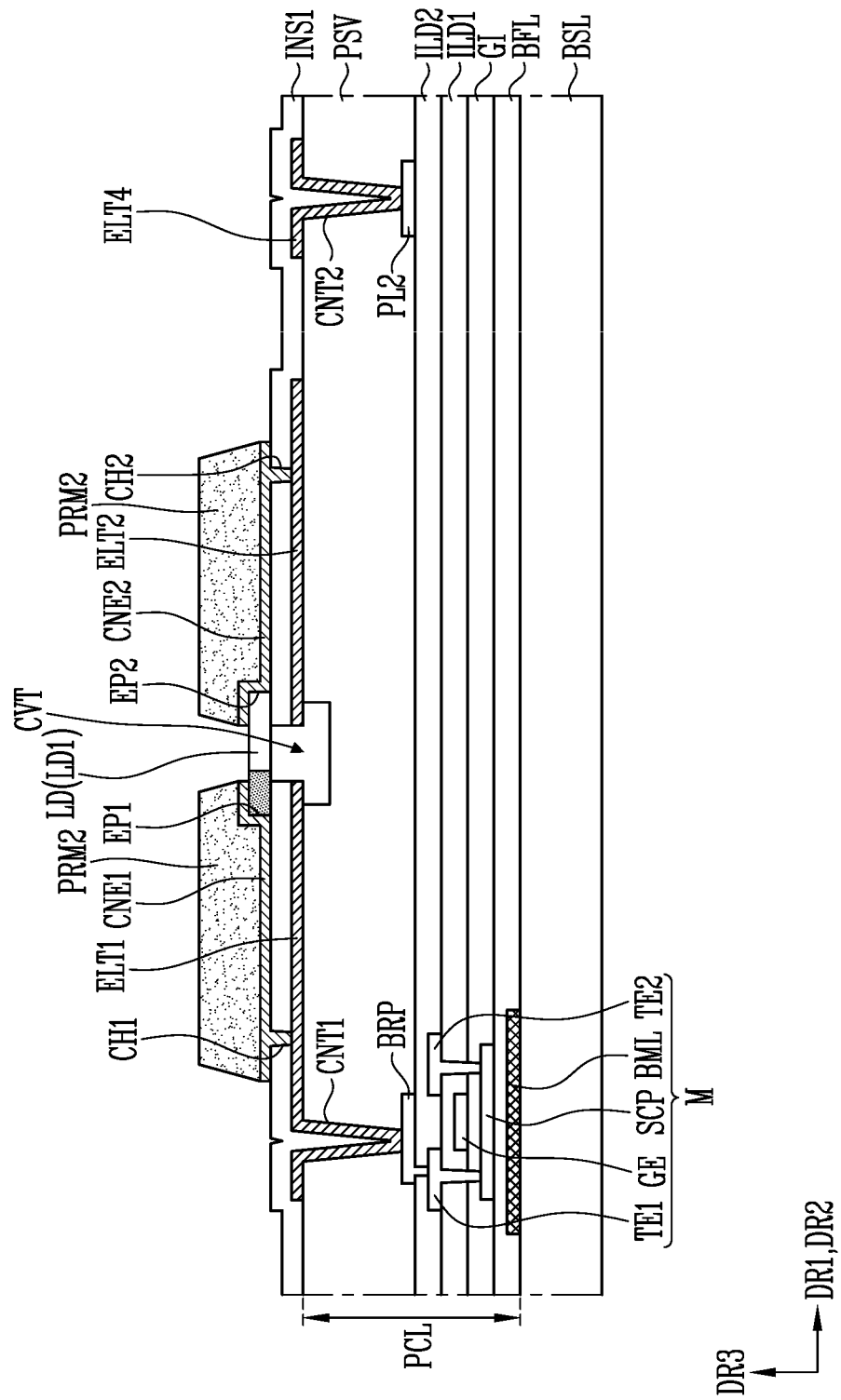
Figure 12L:
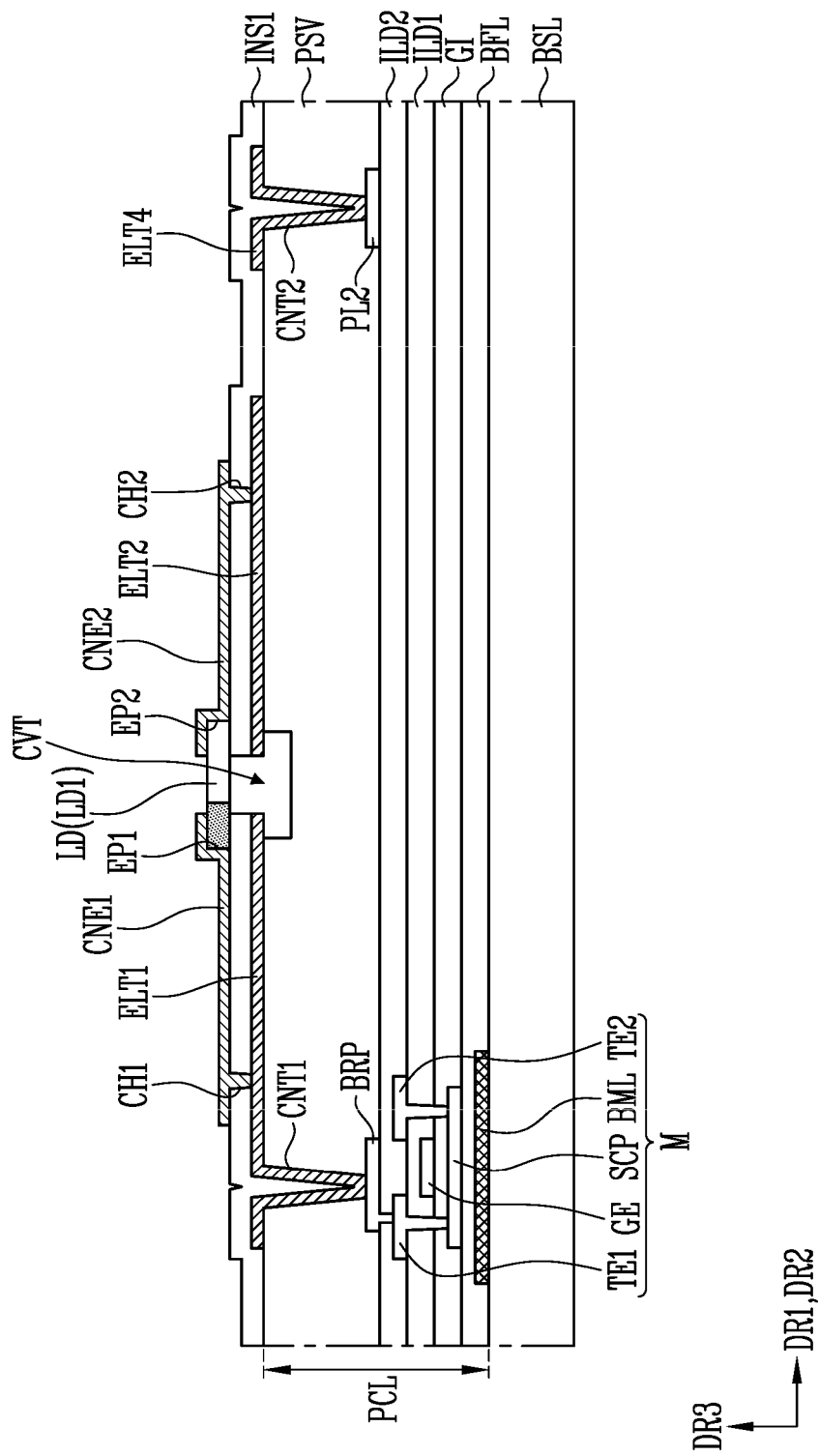

FIGS. 11A-11C are cross-sectional views illustrating pixels PXL according to an embodiment of the present disclosure. For example, FIGS. 11A-11C illustrate different embodiments of a cross section of the pixel PXL taken along the line II-II' of FIG. 10 and illustrate modified embodiments of the embodiments of FIGS. 9A-9C.

In describing the embodiments of FIGS. 10-11C, components similar or similar to those of the embodiments of FIGS. 7-9C are denoted by the same reference numerals, and detailed descriptions thereof will be omitted.

Referring to FIGS. 10-11C, the pixel PXL may further include a first bank BNK1 and a second bank BNK2. The first bank BNK1 is disposed in an emission area EA at least so as to overlap pixel electrodes ELT, and the second bank BNK2 may be a non-emission area NEA so as to surround each emission area EA. In the embodiments of FIGS. 10-11C, the pixel PXL is illustrated as including both the first bank BNK1 and the second bank BNK2, but the present disclosure is not limited thereto. For example, in an embodiment, the pixel PXL may include only one of the first bank BNK1 and the second bank BNK2.

The first bank BNK1 may be disposed below the pixel electrodes ELT. For example, the first bank BNK1 may be disposed below the pixel electrodes ELT to overlap an area of each of the pixel electrodes ELT in the thickness direction of the substrate.

The first bank BNK1 may be for forming a wall structure around light-emitting elements LD and may be formed in separate patterns or an integral pattern. For example, as shown in FIGS. 10-11C, the first bank BNK1 may include a plurality of separate bank patterns which each overlap one area of at least one pixel electrode ELT and are separated between a pair of adjacent pixel electrodes ELT. However, the present disclosure is not limited thereto. For example, in an embodiment, the first bank BNK1 may be formed as an integral bank pattern including an opening or groove corresponding to each light-emitting element array region AR.

The first bank BNK1 may include an insulating material including at least one inorganic material and/or at least one organic material. As an example, the first bank BNK1 may include at least one layer of an inorganic film including various inorganic insulating materials such as silicon nitride ($SiN_x$), silicon oxide (SiOx), and silicon oxynitride ($SiO_xN_y$). Alternatively, the first bank BNK1 may include at least one layer of an organic film including various organic insulating materials or may be formed as a single-layered or multi-layered insulator including a combination of organic and inorganic materials. That is, the structural material and/or pattern shape of the first bank BNK1 may be variously changed.

Because the first bank BNK1 is disposed below one area of each of the pixel electrodes ELT, the pixel electrodes ELT may protrude upward in an area in which the first bank BNK1 is formed. Accordingly, the first bank BNK1 may form a reflexible bank (also referred to as a "reflective barrier") together with the pixel electrodes ELT. For example, the pixel electrodes ELT and/or the first bank BNK1 may be made of a reflective material, or at least one reflective film having reflectivity may be formed on protruding sidewalls of the pixel electrodes ELT and/or the first bank BNK1. Accordingly, light emitted from first and second ends EP1 and EP2 of light-emitting elements LD facing the pixel electrodes ELT may be guided more toward a front of a display panel DP. As described above, when one area of the pixel electrodes ELT is protruded upward using the first bank BNK1, among light generated from the pixel PXL, a ratio of light directed toward a front of the display panel DP may be increased, thereby improving light efficiency of the pixel PXL.

The second bank BNK2 may be a structure defining the emission area EA of each pixel PXL and may be, for example, a pixel definition film. For example, the second bank BNK2 may be disposed around the emission area EA to surround the emission area EA of each pixel PXL. As an example, the second bank BNK2 may be disposed in a boundary area of each pixel area PXA and/or in an area between adjacent pixel areas PXA.

The second bank BNK2 may or may not partially overlap the pixel electrodes ELT. For example, each pixel electrode ELT may extend to the non-emission area NEA so as to overlap the second bank BNK2 or may be disconnected in the emission area EA so as to not overlap the second bank BNK2.

In some embodiments, the second bank BNK2 may or may not overlap first and/or second contact portions CNT1 and CNT2. For example, the first and/or second contact portions CNT1 and CNT2 may be formed in the non-emission area NEA to overlap the second bank BNK2 or may be formed in the emission area EA to not overlap the second bank BNK2.

The second bank BNK2 may include at least one light blocking and/or at least one reflective material to prevent light leakage between adjacent pixels PXL. For example, the second bank BNK2 may include at least one black matrix material (for example, at least one light-blocking material currently known) selected from various types of black matrix materials, and/or a color filter material having a specific color. As an example, the second bank BNK2 may be formed as a black opaque pattern to block light transmission. In an embodiment, a reflective film (not shown) may be formed on a surface (for example, a sidewall) of the second bank BNK2 so as to further increase light efficiency of the pixel PXL.

In some embodiments, in an operation of supplying the light-emitting elements LD to each pixel PXL, the second bank BNK2 may serve as a dam structure defining each emission area EA to which the light-emitting elements LD should be supplied. For example, each emission area EA may be partitioned by the second bank BNK2, and thus, a desired type and/or amount of light-emitting element ink may be supplied to the emission area EA.

In an embodiment, the second bank BNK2 may be concurrently (e.g., simultaneously or substantially simultaneously) formed at the same layer as the first bank BNK1 in a process of forming the first bank BNK1. In an embodiment, the second bank BNK2 may be formed at the same layer as or a different layer from the first bank BNK1 through a process separate from the process of forming the first bank BNK1. As an example, the second bank BNK2 may be formed on the first bank BNK1 (for example, on a first insulating layer INS1). In some embodiments, the position of the second bank BNK2 may vary according to embodiments. Furthermore, the second bank BNK2 may or may not partially overlap the first bank BNK1.

FIGS. 12A-12L are cross-sectional views sequentially illustrating a method of manufacturing a display device DD according to an embodiment of the present disclosure. For example, FIGS. 12A-12L sequentially illustrate operations of manufacturing the pixel PXL in operations of manufacturing the display device DD including the pixel PXL according to the embodiment of FIGS. 7-9C. For convenience, FIGS. 12A-12L illustrate cross sections of the pixel PXL corresponding to the embodiment of FIG. 9A. In some embodiments, a method of manufacturing the pixel PXL and the display device DD including the same according to an embodiment will be described based on a method of forming a cavity CVT and a display element layer DPL.

Referring to FIGS. 7-12A, first, a pixel circuit layer PCL is formed on a base layer BSL. For example, after circuit elements and lines of a corresponding pixel PXL are formed in each pixel area PXA on the base layer BSL, a protective layer PSV covering the circuit elements and the lines may be formed. The pixel circuit layer PCL may be formed through a typical backplane process, and accordingly, detailed descriptions of a method of forming the circuit layer PCL will be omitted.

In some embodiments, the protective layer PSV may include at least one organic insulating layer, and thus a surface of the pixel circuit layer PCL may be planarized. One or more contact portions for connection to the display element layer DPL, for example, first and second contact portions CNT1 and CNT2 of each pixel PXL may be formed on the protective layer PSV.

Referring to FIGS. 7-12B, at least one pair of pixel electrodes ELT1 and ELT2 are formed opposite to each other in each pixel area PXA on the circuit layer PCL. For example, the first and second electrodes ELT1 and ELT2 may be formed to be opposite to each other in a first light-emitting element array region AR1, and third and fourth electrodes ELT3 and ELT4 may be formed opposite to each other in a second light-emitting element array region AR2.

According to some embodiments, one of pixel electrodes ELT, for example, the first electrode ELT1, may be formed to be connected to at least one circuit element (for example, at least one transistor M) through the first contact portion CNT1, and the other one of the pixel electrodes ELT, for example, the fourth electrode ELT4, may be formed to be connected to a second power line PL2 through the second contact portion CNT2.

The pixel electrodes ELT may be formed through various processes of forming a conductive film, such as a deposition process, and various processes of patterning the conductive film, such as a wet etching process. That is, a method of forming the pixel electrodes ELT is not particularly limited.

Referring to FIGS. 7-12C, a first insulating layer INS1 is formed on one surface of the base layer BSL including the pixel electrodes ELT to cover the pixel electrodes ELT. As an example, the first insulating layer INS1 may be formed on a display area DA of the base layer BSL to entirely cover the display area DA in which the pixel electrodes ELT of each pixel PXL are formed.

According to some embodiments, the first insulating layer INS1 may be formed by forming at least one layer of ban inorganic insulating film on one surface of the base layer BSL including the pixel electrodes ELT. In an embodiment, the first insulating layer INS1 may be formed through various processes of forming an insulating film, such as a deposition process, and a method of forming the first insulating layer INS1 is not particularly limited.

Referring to FIGS. 7-12D, a first photo mask PRM1 (also referred to as "first photoresist pattern") may be formed on the first insulating layer INS1 to cover the remaining areas excluding an area in which each cavity CVT is to be formed. For example, one area on the first insulating layer INS1 corresponding to an area between a pair of pixel electrodes ELT in each light-emitting element array region AR (for example, an area between the first pixel electrode ELT1 and the second pixel electrode ELT2, or an area between the third pixel electrode ELT3 and the fourth pixel electrode ELT4), the first photo mask PRM1 may be formed and/or disposed on the remaining areas. The first photo mask PRM1 may be formed using various photoresist materials.

Referring to FIGS. 7-12E, the cavity CVT may be formed in the first insulating layer INS1 and the protective layer PSV below an area between the pair of pixel electrodes ELT by using the first photo mask PRM1. For example, the first insulating layer INS1 may be etched by a full thickness thereof in an area exposed by the first photo mask PRM through dry etching using the first photo mask PRM1, thereby etching the first insulating layer INS1 so as to be opened by a second width W2 corresponding to the exposed area. In some embodiments, accordingly, the protective layer PSV may be etched and/or ashed by at least a thickness thereof in the exposed area.

According to some embodiments, the first insulating layer INS1 and the protective layer PSV may be made of materials having different etch rates. For example, the first insulating layer INS1 may be formed to include at least one layer of an inorganic insulating film, and the protective layer PSV may be formed to include at least one layer of an organic insulating film. In this case, due to a difference in etch rate between the first insulating layer INS1 and the protective layer PSV, a trench having a first width W1 greater than an etched width (that is, the second width W2) of the first insulating layer INS1 may be formed in the protective layer PSV. Accordingly, the cavity CVT having a reversed tapered shape may be formed.

Referring to FIGS. 7-12F, after the cavity CVT is formed, the first photo mask PRM1 is removed.

Referring to FIGS. 7-12G, light-emitting elements LD are supplied on the first insulating layer INS1, and the light-emitting elements LD are aligned between the pair of pixel electrodes ELT on the first insulating layer INS1 on an area including the cavity CVT. For example, through an inkjet method, a slit coating method, or various other methods, the plurality of light-emitting elements LD may be supplied in each pixel area PXA (for example, the emission area EA) on the first insulating layer INS1, and an alignment signal (e.g., a set or predetermined alignment signal) (or alignment voltage) may be applied to each of the pixel electrodes ELT (or alignment lines before being separated into the pixel electrodes ELT), thereby aligning the light-emitting elements LD between the pixel electrodes ELT.

As an example, in the first light-emitting element array region AR1, first light-emitting element(s) LD1 may be aligned on an area of the first light-emitting element array region AR1, in which the cavity CVT is formed, such that first ends EP1 and second ends EP2 of the first light-emitting element(s) LD1 are respectively on the first electrode ELT1 and the second electrode ELT2. Similarly, in the second light-emitting element array region AR2, second light-emitting element(s) LD2 may be aligned on an area of the second light-emitting element array region AR2, in which the cavity CVT is formed, such that first ends EP1 and second ends EP2 of the second light-emitting element(s) LD2 are respectively on the third electrode ELT3 and the fourth electrode ELT4.

Referring to FIGS. 7-12H, contact holes CH for connection between each contact electrode CNE to be formed in a subsequent process and the pixel electrode ELT corresponding thereto are formed. As an example, a first contact hole CH1 and a second contact hole CH2 passing through the first insulating layer INS1 may be formed to expose one area of the first electrode ELT1 and one area of the second electrode ELT2, respectively. Similarly, a third contact hole CH3 and a fourth contact hole CH4 passing through the first insulating layer INS1 may be formed to expose one area of the third electrode ELT3 and one area of the fourth electrode ELT4, respectively.

Referring to FIGS. 7-12I, a conductive film CDL is formed on the pixel area PXA including the emission area EA in which the cavity CVT and the light-emitting element LD are disposed. For example, on the display area DA including the pixel areas PXA which each include the plurality of light-emitting elements LD, the conductive film CDL may be formed through various processes of forming the conductive film CDL, such as a deposition process.

Because the cavity CVT is formed below the light-emitting element LD, a lower surface of the light-emitting element LD, for example, a central area of the light-emitting element LD floats on the cavity CVT. Accordingly, even when seam defects or the like occur at a lower portion of the light-emitting element LD, the conductive film CDL is not connected along a lower surface of the light-emitting element LD. In some embodiments, in a photolithography process to be followed for patterning of the conductive film CDL, light may be incident on a lower area of the light-emitting element LD by the cavity CVT. Accordingly, a residue of the conductive film CDL may be prevented from remaining below the light-emitting element LD, thereby preventing short circuit defects due to the residue of the conductive film CDL.

In some embodiments, in a process of forming the conductive film CDL, a conductive material may be introduced into the cavity CVT so that the conductive film CDL may be formed inside the cavity CVT. For example, a conductive film CDL may be formed even on sidewalls and a bottom surface of the cavity CVT.

However, when the cavity CVT has a reversed tapered shape, the conductive film CDL may be disconnected inside the cavity CVT. For example, due to the reversed tapered shape, the conductive material may not be deposited on rear surfaces of the pixel electrodes ELT (for example, a start point of a reverse taper and an area on a periphery thereof) positioned inside the cavity CVT. Accordingly, from an operation of forming the conductive film CDL, the conductive film CDL may be automatically disconnected below the light-emitting elements LD.

On the other hand, due to the reversed tapered shape, even when the conductive film CDL is deposited on the rear surfaces of the pixel electrodes ELT positioned inside the cavity CVT according to process conditions, or the like, the conductive film CDL may be disconnected in a subsequent process of etching the conductive film CDL.

In an embodiment of the present disclosure, the reversed tapered cavity CVT is formed after the pixel electrodes ELT are formed, but the present disclosure is not limited thereto. For example, in another embodiment, before the pixel electrodes ELT are formed, a cavity having a reversed tapered shape may be formed inside the protective layer PSV. In this case, in an operation of forming a conductive film (for example, a metal film) for forming the pixel electrodes ELT, the conductive film may be automatically disconnected.

Referring to FIGS. 7-12J, a second photo mask PRM2 (also referred to as "second photoresist pattern") is formed on the conductive film CDL according to an area in which each contact electrode CNE is to be formed. For example, the second photo mask PRM2 may be formed on one areas of the conductive film CDL overlapping the first end EP1 of the light-emitting element(s) LD and one area of the pixel electrode ELT adjacent thereto (for example, the first and/or third pixel electrodes ELT1 and ELT3), and the second end EP2 of the light-emitting element(s) LD and one area of the pixel electrode ELT adjacent thereto (for example, the second and/or fourth pixel electrodes ELT2 and ELT4).

Referring to FIGS. 7-12K, the contact electrodes CNE are formed on the first ends EP1 and the second ends EP2 of the light-emitting element(s) LD through a process of etching the conductive film CDL using the second photo mask PRM2. For example, the conductive film CDL may be etched through wet etching using the second photo mask PRM2, thereby forming a first contact electrode CNE1 on the first end EP1 of the first light-emitting element LD1 and the first electrode ELT1, forming a second contact electrode CNE2 on the second end EP2 of the first light-emitting element LD1, the second electrode ELT2, the first end EP1 of the second light-emitting element LD2, and the third electrode ELT3, and forming a third contact electrode CNE3 on the second end EP2 of the second light-emitting element LD2 and the fourth electrode ELT4.

For example, the conductive film may be etched so as to be disconnected at an upper portion and a lower portion of a region in which the cavity CVT is formed, thereby forming the contact electrodes CNE at the same time and thereby also stably separating the contact electrodes CNE. For example, because the cavity CVT is formed in advance, the contact electrodes CNE may be stably separated positioned on the first ends EP1 and the second ends EP2 of the light-emitting elements LD connected between the pair of pixel electrodes ELT.

Referring to FIGS. 7-12L, after the contact electrodes CNE are patterned, the second photo mask PRM2 may be removed. Thereafter, an overcoat layer OC may be optionally formed to form the pixel PXL.

In another embodiment, instead of removing the second photo mask PRM2, the insulating patterns INP according to the embodiments of FIGS. 9C and 11C may be formed using the second photo mask PRM2. As an example, the second photo mask PRM2 may be cured to form each insulating pattern INP on each contact electrode CNE.

According to the above-described embodiment, even when an alignment error of the second photo mask PRM2 occurs around the light-emitting element LD, the conductive film CDP may be stably disconnected on an area between the first end EP1 and the second end EP2 of the light-emitting element LD. In some embodiments, the conductive film CDP may be automatically disconnected even below the light-emitting element LD. Accordingly, it is possible to effectively prevent a short circuit defects due to a residue of the conductive film CDP and/or the contact electrodes CNE.

As described above, the pixel PXL according to various embodiments of the present disclosure includes the light-emitting element LD and the cavity CVT formed in the first insulating layer INS1 and the protective layer PSV below each light-emitting element LD. According to the pixel PXL, the pixel PXL, the display device DD including the same, and a method of manufacturing the display device DD, in a process of forming the contact electrodes CNE for connecting the light-emitting elements LD between pair of pixel electrodes ELT (for example, the first and second electrodes ELT1 and ELT2, or the third and fourth electrodes ELT3 and ELT4), it is possible to prevent short circuit defects that may occur below the light-emitting elements LD.

According to the pixel PXL, the display device DD including the same, and the method of manufacturing the display device DD, the first insulating layer INS1 and the protective layer PSV may be simultaneously etched through a single mask process using the first photo mask PRM1 to form the cavity CVT below the light-emitting element array region AR. In this case, due to a difference in etch rate between the first insulating layer INS1 and the protective layer PSV, the protective layer PSV may be etched by a wider width than the first insulating layer INS1, and thus, the cavity CVT having a reversed tapered shape may be formed below the light-emitting element array region AR.

Accordingly, from an operation of forming the conductive film CDL for forming the contact electrodes CNE, the conductive film CDL may be automatically disconnected (or opened) by the cavity CVT, thereby more effectively preventing short circuit defects from occurring between the first end EP1 and the second end EP2 of the light-emitting element LD.

According to the pixel PXL, the display device DD including the same, and the method of manufacturing the display device DD, the contact electrodes CNE may be formed at the same time through a single mask process using the second photo mask PRM2. Accordingly, a mask used for manufacturing the pixel PXL may be reduced, and manufacturing efficiency of the display device DD may be increased.

According to embodiments of the present disclosure, it is possible to reduce the number of masks used for manufacturing a pixel including a light-emitting element and also effectively prevent short circuit defects between a first end and a second end of the light-emitting element.

Effects of the present disclosure are not restricted to the embodiments set forth herein and more diverse effects are included in this specification.

The technical spirit of the preset disclosure has been specifically described according to the aforementioned embodiments, but it is to be noted that the embodiments are provided for the description thereof and are not for the limitation thereof. Further, those skilled in the art will appreciate that various modifications may be made without departing from the scope and spirit of the present disclosure.

The scope of the present disclosure is not limited to the details described in the detailed description of the present disclosure but should be defined by the claims. Further, it shall be understood that all modifications and embodiments conceived from the meaning and scope of the claims and their equivalents are included in the scope of the present disclosure.

What is claimed is:

1. A pixel comprising:
 a circuit element on a base layer;
 a protective layer on the circuit element;
 a first electrode and a second electrode opposite each other on the protective layer;
 a first insulating layer on the first electrode and the second electrode;
 a light-emitting element on the first insulating layer at an area between the first electrode and the second electrode;
 a first contact electrode on a first end of the light-emitting element to connect the first end of the light-emitting element to the first electrode;
 a second contact electrode on a second end of the light-emitting element to connect the second end of the light-emitting element to the second electrode; and
 a cavity in the protective layer and the first insulating layer below the light-emitting element corresponding to the area between the first electrode and the second electrode.

2. The pixel of claim 1, wherein the cavity has a first width in a lower area thereof corresponding to the protective layer and a second width less than the first width in an upper area thereof corresponding to the first insulating layer.

3. The pixel of claim 2, wherein the second width is less than a length of the light-emitting element.

4. The pixel of claim 2, wherein the first contact electrode and the second contact electrode are spaced from each other by the second width.

5. The pixel of claim 1, wherein the first contact electrode and the second contact electrode are at a same layer and are separated from each other by the cavity.

6. The pixel of claim 1, wherein the first contact electrode is electrically connected to the first electrode through a first contact hole passing through the first insulating layer, and
 the second contact electrode is electrically connected to the second electrode through a second contact hole passing through the first insulating layer.

7. The pixel of claim 1, further comprising conductive films remaining on sidewalls of the cavity below the first electrode and the second electrode,
 wherein the conductive film comprises a same material as the first contact electrode and the second contact electrode.

8. The pixel of claim 7, wherein the conductive films located below the first electrode and the second electrode are spaced from each other.

9. The pixel of claim 1, further comprising:
 a first insulating pattern on the first contact electrode; and
 a second insulating pattern located on the second contact electrode and spaced from the first insulating pattern.

10. The pixel of claim 9, wherein the first insulating pattern and the second insulating pattern comprise a same photoresist material.

11. The pixel of claim 9, wherein the first contact electrode is located below the first insulating pattern, and
 the second contact electrode is located below the second insulating pattern.

12. The pixel of claim 1, wherein the protective layer comprises at least one layer of an organic insulating film, and
 the first insulating layer comprises at least one layer of an inorganic insulating film.

13. The pixel of claim 1, further comprising at least one of a first bank located below the first electrode and the second electrode and overlapping one area of the first electrode and one area of the second electrode, and a second bank located in a non-emission area surrounding an emission area comprising the first electrode, the second electrode, and the light-emitting element.

14. A display device comprising:
 a base layer; and
 a pixel on the base layer,
 wherein the pixel comprises:
 a circuit element on the base layer;
 a protective layer on the circuit element;
 a first electrode and a second electrode opposite each other on the protective layer;
 a first insulating layer on the first electrode and the second electrode;
 a light-emitting element on the first insulating layer at an area between the first electrode and the second electrode;
 a first contact electrode on a first end of the light-emitting element to connect the first end of the light-emitting element to the first electrode;
 a second contact electrode on a second end of the light-emitting element to connect the second end of the light-emitting element to the second electrode; and
 a cavity in the protective layer and the first insulating layer below the light-emitting element corresponding to the area between the first electrode and the second electrode.

15. The display device of claim 14, wherein the cavity has a first width in a lower area thereof corresponding to the protective layer and a second width less than the first width in an upper area thereof corresponding to the first insulating layer.

16. The display device of claim 15, wherein the second width is less than a length of the light-emitting element.

17. The display device of claim 14, wherein the first contact electrode and the second contact electrode are at a same layer and are spaced from each other by the cavity.

18. A method of manufacturing a display device, the method comprising:
 sequentially forming a circuit element and a protective layer on a base layer;
 forming a first electrode and a second electrode opposite each other on the protective layer;
 forming a first insulating layer to cover the first electrode and the second electrode;
 forming a cavity in the first insulating layer and the protective layer below an area between the first electrode and the second electrode;
 supplying a light-emitting element on the first insulating layer and aligning the light-emitting element between the first electrode and the second electrode such that the light-emitting element is on the first insulating layer and overlaps the cavity;
 forming a conductive film on a pixel area comprising the light-emitting element; and
 etching the conductive film so as to be disconnected at an upper portion and a lower portion of an area of the cavity and forming a first contact electrode and a second contact electrode on a first end of the light-emitting element and a second end of the light-emitting element, respectively.

19. The method of claim 18, wherein the forming of the cavity comprises:
 forming a first photo mask on remaining areas excluding an upper portion of one area of the first insulating layer corresponding to an area between the first electrode and the second electrode; and etching the first insulating layer by a full thickness thereof in an area exposed by the first photo mask and forming a trench, which has a width greater than an etched width of the first insulating layer, in the protective layer.

20. The method of claim 18, wherein the forming of the first contact electrode and the second contact electrode comprises:

forming a second photo mask on one area of the conductive film overlapping the first end of the light-emitting element and one area of the first electrode, and the second end of the light-emitting element and one area of the second electrode; and etching the conductive film using the second photo mask to concurrently form the first contact electrode and the second contact electrode.

* * * * *